(12) United States Patent
Kanno

(10) Patent No.: US 8,569,136 B2
(45) Date of Patent: Oct. 29, 2013

(54) MANUFACTURING METHOD OF SEMICONDUCTOR DEVICE

(75) Inventor: Itaru Kanno, Kanagawa (JP)

(73) Assignee: Renesas Electronic Corporation, Kawasaki-shi (JP)

( * ) Notice: Subject to any disclaimer, the term of this patent is extended or adjusted under 35 U.S.C. 154(b) by 21 days.

(21) Appl. No.: 13/438,972

(22) Filed: Apr. 4, 2012

(65) Prior Publication Data

US 2012/0258576 A1  Oct. 11, 2012

(30) Foreign Application Priority Data

Apr. 5, 2011  (JP) ................................ 2011-083470

(51) Int. Cl.
*H01L 21/8234*  (2006.01)
(52) U.S. Cl.
USPC ................ 438/275; 438/305; 257/E21.435
(58) Field of Classification Search
USPC .................. 438/231, 275, 305, FOR. 188; 257/E21.435
See application file for complete search history.

(56) References Cited

U.S. PATENT DOCUMENTS

| | | | | |
|---|---|---|---|---|
| 5,585,299 A * | 12/1996 | Hsu | ............................... | 438/275 |
| 6,008,077 A * | 12/1999 | Maeda | ........................... | 438/151 |
| 6,207,520 B1 * | 3/2001 | Gardner et al. | ............... | 438/308 |
| 6,586,332 B1 * | 7/2003 | Lee | ............................... | 438/656 |
| 6,800,512 B1 | 10/2004 | Itonaga et al. | | |
| 7,220,637 B2 | 5/2007 | Ota et al. | | |
| 7,439,124 B2 * | 10/2008 | Fukai et al. | ..................... | 438/231 |
| 7,935,592 B2 | 5/2011 | Watanabe | | |
| 2012/0196417 A1 * | 8/2012 | Kronholz et al. | ............. | 438/275 |
| 2012/0258576 A1 * | 10/2012 | Kanno | ........................... | 438/231 |

FOREIGN PATENT DOCUMENTS

| | | |
|---|---|---|
| JP | 2001-156059 A | 6/2001 |
| JP | 2003-100902 A | 4/2003 |
| JP | 2008-117848 A | 5/2008 |
| JP | 2008-171910 A | 7/2008 |

* cited by examiner

*Primary Examiner* — George Fourson, III
(74) *Attorney, Agent, or Firm* — Miles & Stockbridge P.C.

(57) ABSTRACT

A manufacturing method of a semiconductor device is provided which can improve the performance of the semiconductor device. Ion implantation is applied to nMIS regions 1A and 1B and pMIS regions 1C and 1D of a semiconductor substrate 1 with offset spacers formed over sidewalls of gate electrodes GE1, GE2, GE3, and GE4 to thereby form extension regions for source and drain. In this case, a different photoresist pattern is used for each of the nMIS regions 1A and 1B and the pMIS regions 1C and 1D to individually perform the corresponding ion implantation. Every time the photoresist pattern is re-created, the offset spacer is also re-created.

19 Claims, 69 Drawing Sheets

MANUFACTURING METHOD OF SEMICONDUCTOR DEVICE

CROSS-REFERENCE TO RELATED APPLICATIONS

The disclosure of Japanese Patent Application No. 2011-083470 filed on Apr. 5, 2011 including the specification, drawings and abstract is incorporated herein by reference in its entirety.

BACKGROUND

The present invention relates to manufacturing methods of semiconductor devices, and more particularly, to a technique effectively applied to a manufacturing method of a semiconductor device with a metal insulator semiconductor field effect transistor (MISFET).

The MISFET(MIS field effect transistor, MIS transistor) can be formed by forming a gate insulating film over a semiconductor substrate, forming a gate electrode over the gate insulating film, and then forming source and drain regions by ion implantation or the like.

Japanese Unexamined Patent Publication No. 2001-156059 (Patent Document 1) discloses a technique which involves forming low-concentration source and drain regions by ion implantation after formation of an insulating coating, removing the insulating coating, forming sidewalls of oxide films, and then forming high-concentration source and drain regions 21 by ion implantation.

Japanese Unexamined Patent Publication No. 2003-100902 (Patent Document 2) discloses a technique which involves performing extension ion implantation using offset sidewalls.

Japanese Unexamined Patent Publication No. 2008-117848 (Patent Document 3) discloses a technique which involves forming an extension region using an offset spacer.

Japanese Unexamined Patent Publication No. 2008-171910 (Patent Document 4) discloses a technique which involves forming a source and drain extension region using an offset spacer.

RELATED ART DOCUMENTS

Patent Documents

[Patent Document 1]
Japanese Unexamined Patent Publication No. 2001-156059
[Patent Document 2]
Japanese Unexamined Patent Publication No. 2003-100902
[Patent Document 3]
Japanese Unexamined Patent Publication No. 2008-117848
[Patent Document 4]
Japanese Unexamined Patent Publication No. 2008-171910

SUMMARY

The inventors have found out the following facts through their studies.

A low-concentration extension region is formed in the source and drain by performing ion implantation after forming an offset spacer film made of an insulating film over each sidewall of a gate electrode. The use of the offset spacer film isolates a starting point for diffusing impurities from the sidewall of the gate electrode by a thickness of the offset spacer film, which can reduce the leak between the source and drain to improve short-channel characteristics. Then, a sidewall spacer is formed over each sidewall of the gate electrode, and the ion implantation is performed to implant impurities into the semiconductor substrate with the position as the starting point located away from the sidewall of the gate electrode by the thickness of the sidewall spacer, whereby the high-concentration source and drain regions are formed.

The repetition of a photoresist pattern formation step, an ion implantation step using the offset spacer film, and a photoresist pattern removal step after forming the offset spacer film would etch the offset spacer film to decrease the thickness of the spacer film upon removing the photoresist pattern. For example, when the photoresist pattern is removed by ashing (plasma process using oxygen gas or the like), it is necessary to perform a cleaning process for removing residues of the photoresist pattern after the ashing. In the cleaning process, the offset spacer film would be etched to have its thickness decreased. Thus, after the photoresist pattern formation step, every time a series of processes including the photoresist pattern formation step, the ion implantation step using the offset spacer film, and the photoresist pattern removal step is repeated, the offset spacer film becomes thinner. Thus, the distance by which the starting point for diffusion of the impurities is offset (isolated) from the sidewall of the gate electrode would be shifted from an original designed value (designed value of the offset spacer film) in the ion implantation using the offset spacer film, which differs the distribution of impurities ion-implanted from the designed one. In order to stabilize the characteristics of the transistor and to improve the performance of the semiconductor device, the prevention of such phenomena is desired.

Accordingly, it is an object of the present invention to provide a technique that can improve the performance of the semiconductor device.

The above and other objects and the novel features of the invention will become apparent from the description of the present specification and the accompanying drawings.

The outline of representative aspects of the invention disclosed in the present application will be briefly described below.

In a manufacturing method of a semiconductor device according to a representative embodiment of the invention, every time a resist pattern is re-created upon ion implantation using offset spacers at the sidewalls of the gate structure, the material film used as the offset spacer is also re-created.

In the manufacturing method of a semiconductor device according to another representative embodiment, ion implantation for formation of extension regions for source and drain regions is applied to each of the regions at the main surface of the semiconductor substrate by changing ion implantation conditions. In this case, every time the resist pattern is re-created, the film for an offset spacer formed at the sidewall of the gate structure in each ion implantation is re-created.

In the manufacturing method of a semiconductor device according to a further representative embodiment, the offset spacer is comprised of a laminated film of a protective film and a material film upon ion implantation using the offset spacers at the sidewalls of the gate structure. And, every time the resist pattern is re-created, the material film is also re-created.

The effects made by the representative aspects of the invention disclosed in the present application will be briefly described below.

The typical embodiment of the invention can improve the performance of the semiconductor device.

DETAILED DESCRIPTION

Figure 1:
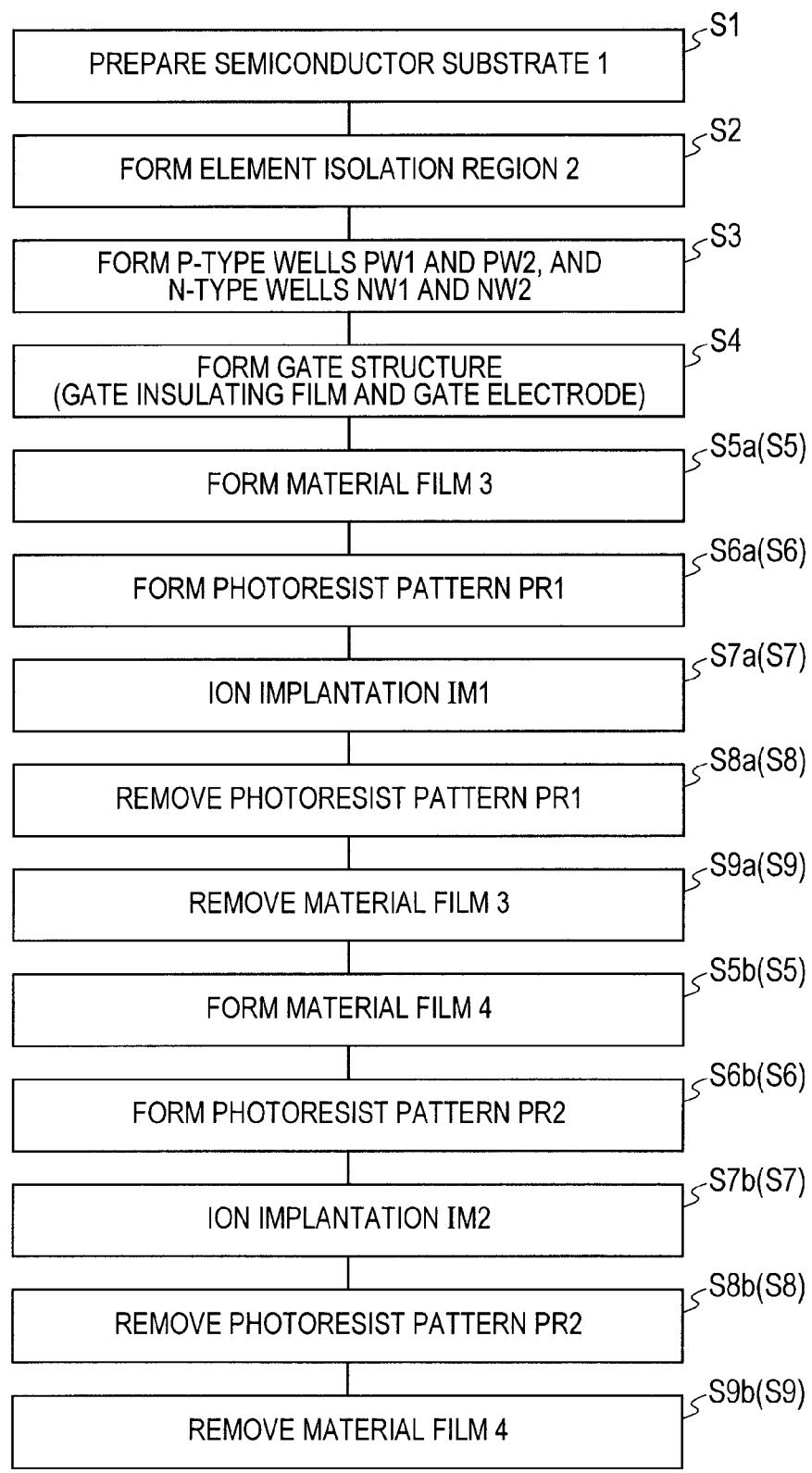
FIG. 1 is a manufacturing process flowchart showing a part of a manufacturing process of a semiconductor device according to one embodiment of the invention.

The following preferred embodiments may be described below by being divided into a plurality of sections or embodiments for convenience, if necessary, which are not independent from each other except when specified otherwise. One of the sections or embodiments is a modified example, the details thereof, a supplemental explanation, or the like of a part or all of the other. When reference is made to the number of elements or the like (including the number of pieces, numerical values, quantity, range, etc.) in the following description of the embodiments, the number thereof is not limited to a specific number, and may be greater than, or less than, or equal to the specific number, unless otherwise specified and definitely limited to the specific number in principle. It is also needless to say that components (including elements or steps, etc.) employed in the following description of the embodiments are not always essential, unless otherwise specified and considered to be definitely essential in principle. Similarly, in the description of the shapes, positional relations, and the like of the components or the like in the following embodiments, they will include those substantially analogous or similar to their shapes or the like, unless otherwise specified and considered not to be definitely so in principle, etc. The same goes for the above-mentioned numerical value and range.

Preferred embodiments of the invention will be described below in detail based on the accompanying drawings. In all drawings for explaining the embodiments, the member having the same function will be represented by the same reference character and a repeated description thereof will be omitted below. In the following embodiments, the same or similar parts will not be repeatedly explained in principle except when needed.

For easy understanding, even a cross-sectional view often has a hatched part in the drawing used in this embodiment. Further, for easy understanding, even a plan view also often has a hatched part.

First Embodiment

Figure 2:
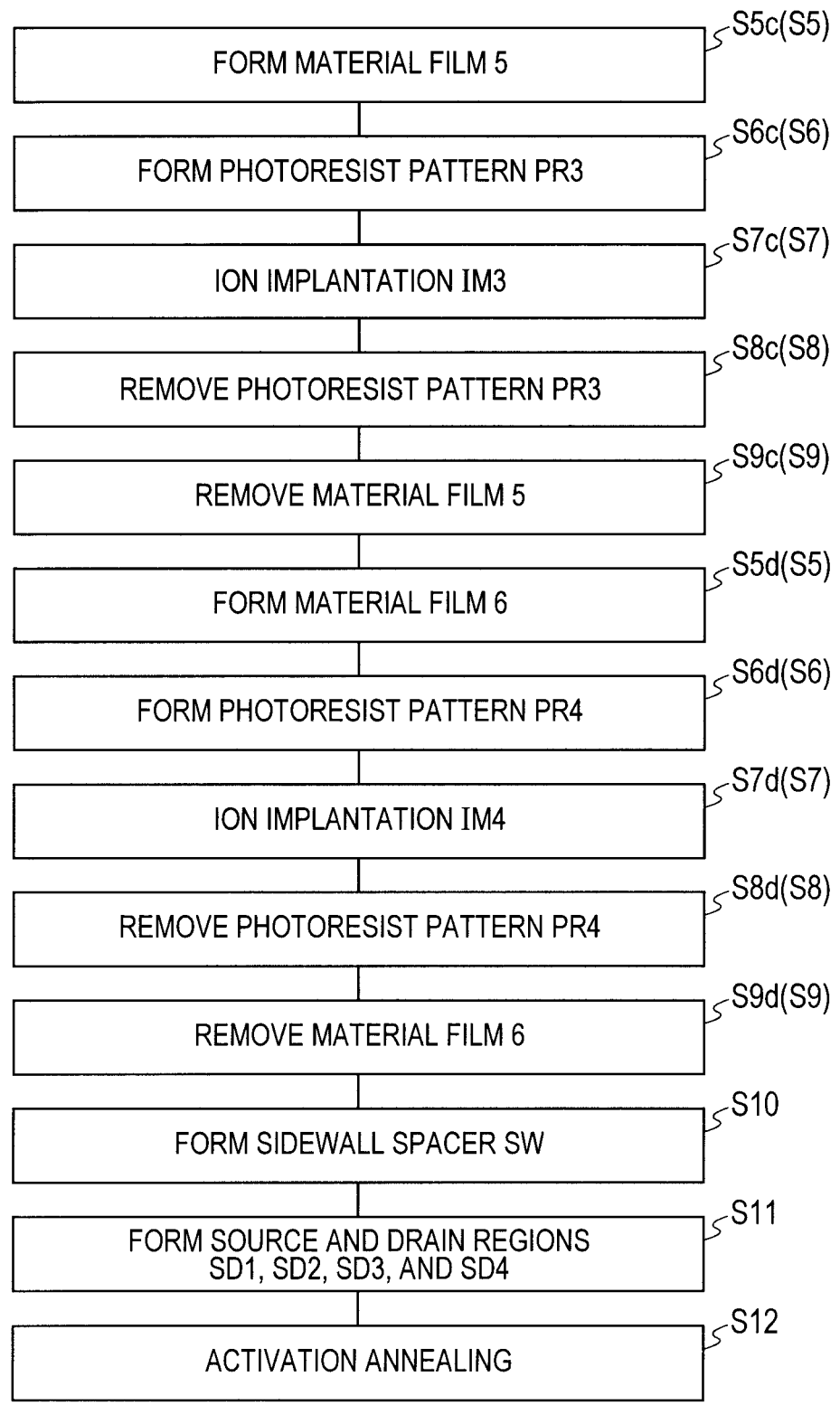
FIG. 2 is another manufacturing process flowchart showing another part of the manufacturing process of the semiconductor device in the one embodiment of the invention.
Figure 3:
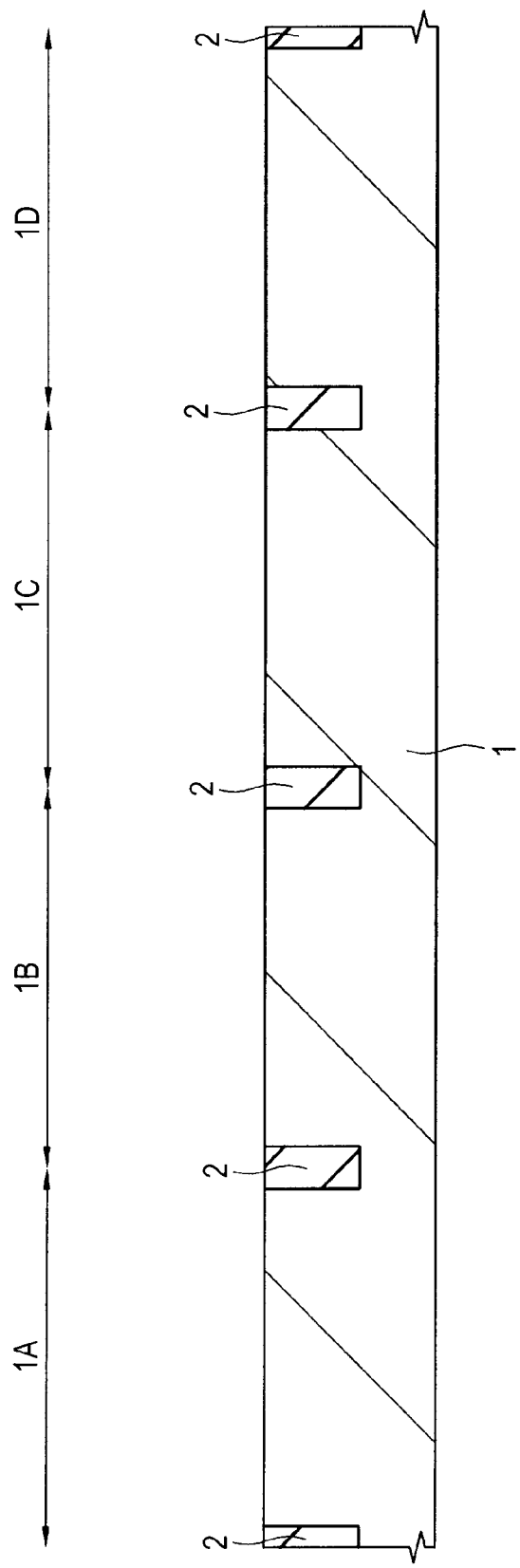
FIG. 3 is a cross-sectional view of a main part of a manufacturing step of the semiconductor device in the one embodiment of the invention.

A manufacturing process of a semiconductor device according to a first embodiment will be described below with reference to the accompanying drawings. FIGS. 1 and 2 are manufacturing process flowcharts showing parts of manufacturing steps of the semiconductor device in this embodiment of the invention, that is, the semiconductor device with a complementary Metal Insulator Semiconductor Field Effect Transistor (CMISFET). FIGS. 3 to 29 are cross-sectional views showing main parts of the manufacturing steps of the semiconductor device in this embodiment, that is, the semiconductor device with the CMISFET. First, as shown in FIG. 3, a semiconductor substrate (semiconductor wafer) 1 made of p-type single crystal silicon with a specific resistance of, for example, about 1 to 10Ω·cm is prepared (in step S1 shown in FIG. 1).

The semiconductor substrate 1 with the semiconductor device of this embodiment formed therein includes nMIS regions 1A and 1B in which n-channel type MISFETs (metal insulator Semiconductor Field Effect Transistors) are formed, and pMIS regions 1C and 1D in which p-channel type MISFETs are formed.

Then, electron isolation regions 2 are formed over a main surface of the semiconductor substrate 1 (in step S2 shown in FIG. 1). The electron isolation region 2 is made of an insulator, such as a silicon oxide, for example, a shallow trench isolation (STI) method, a local oxidization of silicon (LOCOS) method, or the like. For example, trenches (electron isolation trenches) are formed in the semiconductor substrate 1. An insulating film (for example, a silicon oxide film) can be embedded in the trenches to thereby form the element isolation regions 2. Active regions are defined in the semiconductor substrate 1 by the element isolation regions 2. A MISFET is formed in each active region as will be described later.

Figure 4:
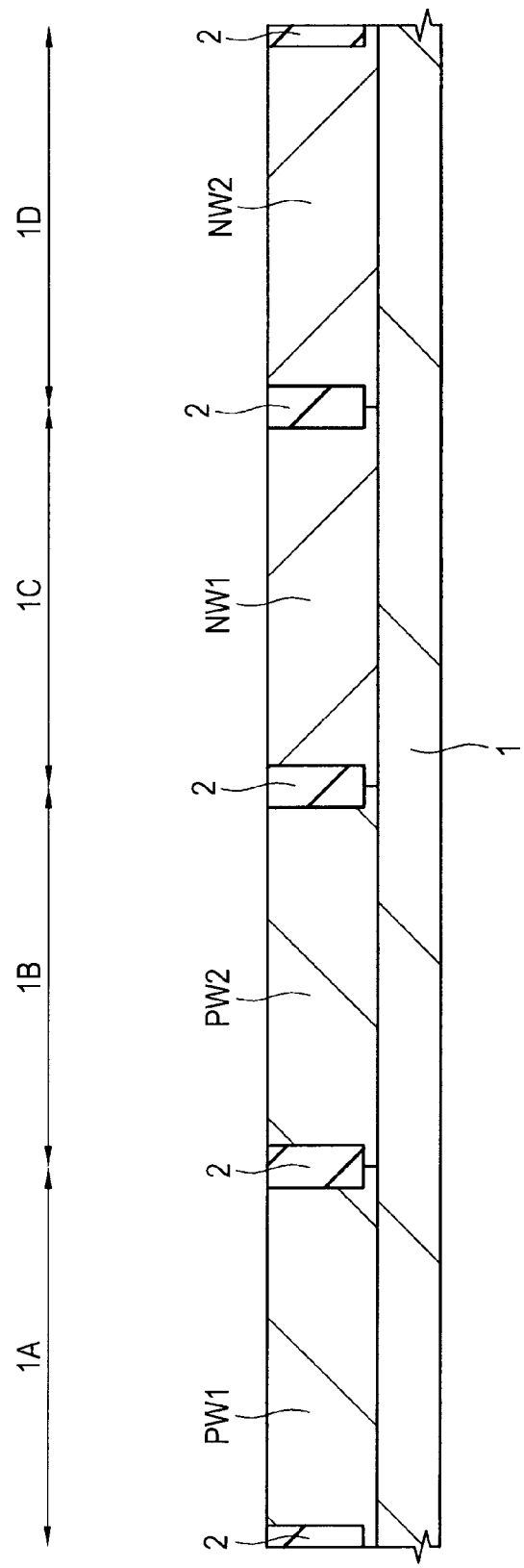
FIG. 4 is a cross-sectional view of a main part of another manufacturing step of the semiconductor device, following the step shown in FIG. 3.

Then, as shown in FIG. 4, a p-type well PW1 is formed in an nMIS region 1A of the semiconductor substrate 1, a p-type well PW2 is formed in an nMIS region 1B of the semiconductor substrate 1, an n-type well NW1 is formed in a pMIS region 1C of the semiconductor substrate 1, and an n-type well NW2 is formed in a pMIS region 1D of the semiconductor substrate 1 (in step S3 shown in FIG. 1). The p-type wells PW1 and PW2, and the n-type wells NW1 and NW2 can be respectively formed by ion implantation using respective photoresist films (not shown) as an ion implantation blocking mask.

Figure 5:
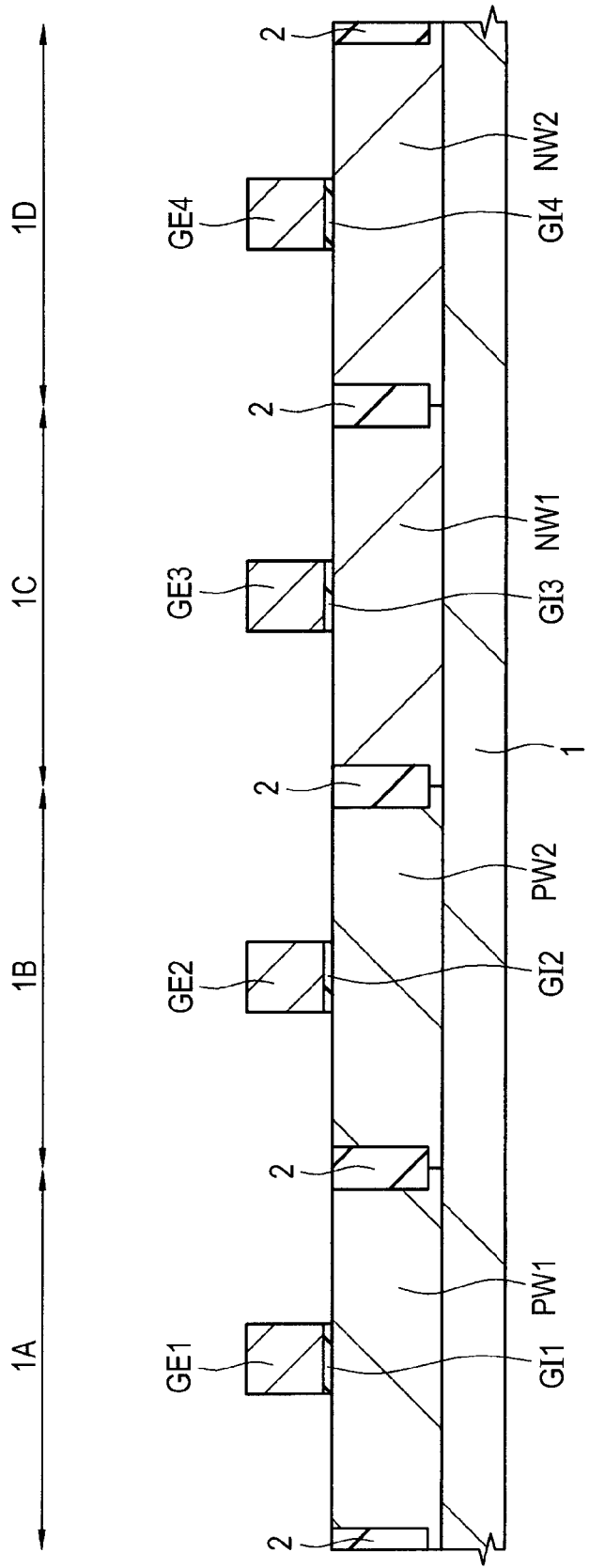
FIG. 5 is a cross-sectional view of a main part of another manufacturing step of the semiconductor device, following the step shown in FIG. 4.

Then, as shown in FIG. 5, gate structural members (gate structures) are respectively formed over the semiconductor substrate 1 in the nMIS region 1A (p-type well PW1), over the semiconductor substrate 1 in the nMIS region 1B (p-type well PW2), over the semiconductor substrate 1 in the pMIS region 1C (n-type well NW1), and over the semiconductor substrate 1 in the pMIS region 1D (n-type well NW2) (in step S4 shown in FIG. 1). That is, the gate structure including a gate insulating film GI1 and a gate electrode GE1 thereover is formed over the semiconductor substrate 1 in the nMIS region 1A (p-type well PW1) (in step S4). The gate structure including a gate insulating film GI2 and a gate electrode GE2 thereover is formed over the semiconductor substrate 1 in the nMIS region 1B (p-type well PW2). In step S4, the gate structure including a gate insulating film GI3 and a gate electrode GE3 thereover is formed over the semiconductor substrate 1 in the pMIS region 1C (n-type well NW1). The gate structure including a gate insulating film GI4 and a gate electrode GE4 thereover is formed over the semiconductor substrate 1 in the pMIS region 1D (n-type well NW2).

The term "gate structure" as used herein means a structure including an insulating film serving as a gate insulating film, and a conductive film serving as a gate electrode thereover. The gate structure basically means a laminated structure including a gate insulating film and a gate electrode thereover, but is not limited thereto and may be a laminated structure including the gate electrode formed over the gate insulating film, and a further insulating film thereover.

The gate insulating films GI1, GI2, GI3, and GI4 can be formed of, for example, a thin silicon oxide film or silicon oxynitride film, or the like. The gate insulating film can be formed, for example, by thermal oxidation (including a nitriding process by use of plasma after the thermal oxidation process in the case of a silicon oxynitride film). The so-called high-k film (high-dielectric constant film) can be used as the gate insulating films GI1, GI2, GI3, and GI4. The term "high-k film" as used herein means a film having a higher dielectric constant (dielectric constant relative) than that of a silicon oxide film ($SiO_x$, typified by $SiO_2$).

In use of the high-k film for the gate insulating films GI1, GI2, GI3, and GI4, for example, a hafnium (Hf) oxide film, a zirconium (Zr) oxide film, or the like can be suitably used as the high-k film.

The gate electrodes GE1, GE2, GE3, and GE4 are comprised of a conductive film, for example, can be formed using a polycrystalline silicon film (doped polysilicon film). Further, the conductive film for the gate electrodes GE1, GE2, GE3, and GE4 can be formed of an amorphous silicon film. In this case, an amorphous silicon film is converted into a polycrystalline silicon film by the thermal process after deposition (for example, activation annealing of impurities introduced for the source and drain).

The gate electrodes GE1, GE2, GE3, and GE4 can be the so-called metal gate electrode (metallic gate electrode). Alternatively, the gate electrodes GE1, GE2, GE3, and GE4 can be the so-called metal gate electrode. When each of the gate electrodes GE1, GE2, GE3, and GE4 is comprised of the metal gate electrode, the gate electrodes GE1, GE2, GE3, and GE4 are comprised of a metal film, or a laminated film including a metal film and a polycrystalline silicon film (doped polysilicon film) thereover. Suitable metal films used for the metal gate electrode can include, for example, a titanium nitride (TiN) film, a tantalum nitride (TaN) film, or a tungsten nitride (WN) film. The term "metal film (metal layer)" as used in the present application means a conductive film (conductive layer) having metallic conduction, and includes not only a single metal film (pure metal film) and an alloy film, but also a metal compound film exhibiting metallic conduction (metal nitride film, metal carbide film, and the like).

The following will be one example of a formation step of the gate insulating films GI1, GI2, GI3, GI4, and the gate electrodes GE1, GE2, GE3, and GE4 (which corresponds to the above step S4). First, the surface of the semiconductor substrate 1 is cleansed (cleaned) by wet etching using a hydrofluoric acid (HF) aqueous solution. Then, an insulating film for the gate insulating films GI1, GI2, GI3, and GI4 (hereinafter referred to as an "insulating film for the gate insulating film") is formed over the surface of the semiconductor substrate 1 (that is, the p-type wells PW1 and PW2, and the n-type wells NW1 an NW2). A conductive film for the gate electrodes GE1, GE2, GE3, and GE4 (hereinafter referred to as a "conductive film for the gate electrode") is formed over the entire main surface of the semiconductor substrate 1, that is, the insulting film for the gate insulating film. Then, the conductive film for the gate electrode is patterned using lithography and dry etching. Thus, the gate electrodes GE1, GE2, GE3, and GE4 can be formed of the patterned conductive film for the gate electrode. The insulating film for the gate insulating film remaining under the gate electrode GE1 becomes the gate insulating film GI1. The insulating film for the gate insulating film remaining under the gate electrode GE2 becomes the gate insulating film GI2. The insulating film for the gate insulating film remaining under the gate electrode GE3 becomes the gate insulating film GI3. The insulating film for the gate insulating film remaining under the gate electrode GE4 becomes the gate insulating film GI4. Parts of the insulating film for the gate insulating film not serving as a gate insulating film (that is, parts not positioned under the gate electrodes) can be removed upon patterning the conductive film for the gate electrode. In this way, the gate electrode GE1 is formed over the p-type well PW1 in the nMIS region 1A via the gate insulating film GI1. The gate electrode GE2 is formed over the p-type well PW2 in the nMIS region 1B via the gate insulating film GI2. The gate electrode GE3 is formed over the n-type well NW1 in the pMIS region 1C via the gate insulating film GI3. The gate electrode GE4 is formed over the n-type well NW2 in the pMIS region 1D via the gate insulating film GI4.

Figure 6:
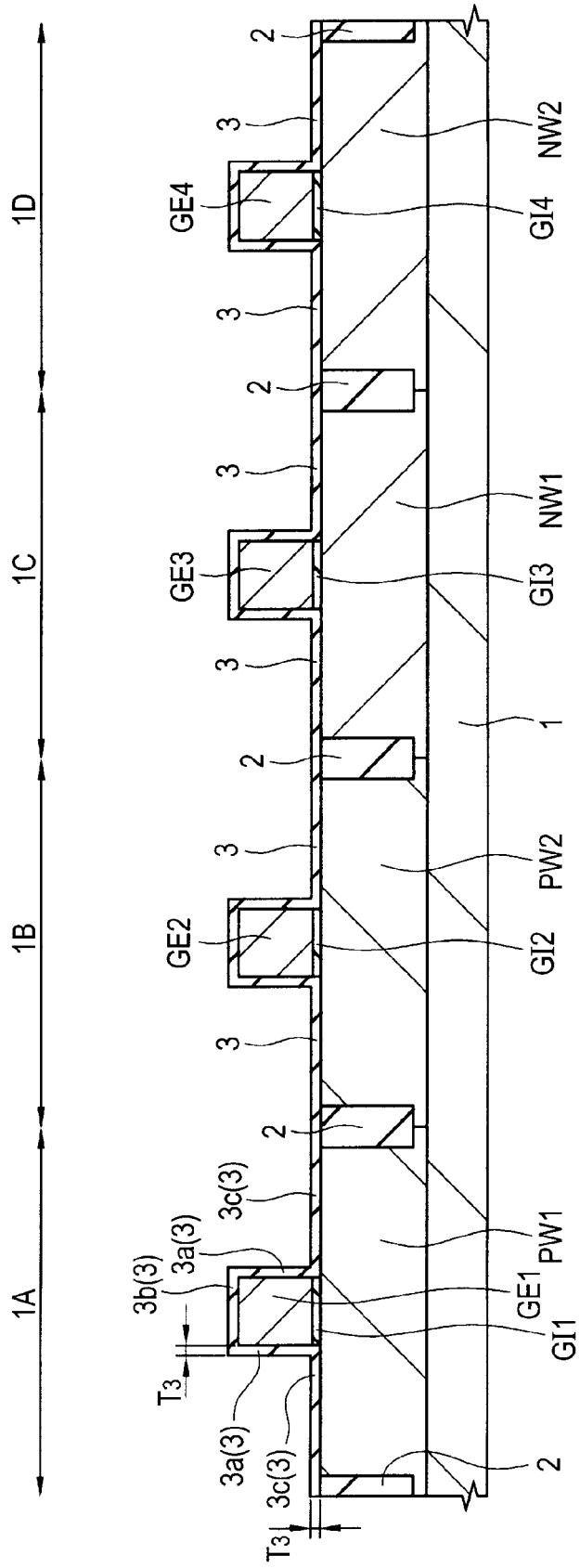
FIG. 6 is a cross-sectional view of a main part of another manufacturing step of the semiconductor device, following the step shown in FIG. 5.

Then, as shown in FIG. 6, a material film 3 for an offset spacer is formed (deposited) over the main surface (entire main surface) of the semiconductor substrate 1 so as to cover the gate structures (gate electrodes GE1, GE2, GE3, and GE4) in the nMIS regions 1A and 1B and pMIS regions 1C and 1D (in step S5a shown in FIG. 1). In the nMIS regions 1A and 1B, and the pMIS regions 1C and 1D, the material film 3 is formed over the upper surfaces and side walls of the gate structure (gate electrodes GE1, GE2, GE3, and GE4) and over the parts of the semiconductor substrate 1 (p-type wells PW1 and PW2, and n-type wells NW1 and NW2) not covered with the gate structures (gate electrodes GE1, GE2, GE3, and GE4).

A silicon nitride film, a silicon oxide film, or the like can be used as the material film 3. The material film 3 can be formed using a chemical vapor deposition (CVD) method or the like. The material film 3 in use can be a metal film (note that in this case, suitable kinds of metals will be described later). The thickness (depth) $T_3$ of the formed material film 3 can be set to, for example, about 2 to 5 nm so as to be appropriate as the offset spacer of the ion implantation IM1 to be performed later.

Parts of the material film 3 formed at both sidewalls of the gate structure (gate electrode GE1) in the nMIS region 1A each are referred to as a "material film 3a" indicated by reference numeral 3a. A part of the material film 3 formed over an upper surface of the gate structure (gate electrode GE1) is referred to as a "material film 3b" indicated by reference numeral 3b. Other parts of the material film 3 formed over the p-type well PW1 each are referred to as a "material film 3c" indicated by reference numeral 3c. The thickness of the material film 3c in the direction substantially perpendicular to the main surface of the semiconductor substrate 1 almost corresponds to the above thickness $T_3$. The thickness of the material film 3b in the direction substantially perpendicular to the main surface of the semiconductor substrate 1 almost corresponds to the above thickness $T_3$. The thickness of the material film 3a in the direction substantially parallel to the main surface of the semiconductor substrate 1 almost corresponds to the above thickness $T_3$.

The material film 3, and a material film 4, a material film 5, and a material film 6 which are to be described later can be formed of different materials, but may be preferably formed of the same material (the same kind of material). For example, when the material film 3 is formed of a silicon nitride film, the respective material films 4, 5, and 6 to be described later can be more preferably a silicon nitride film. In this way, the characteristics of the respective offset spacers in the respective ion implantations IM1, IM2, IM3, and IM4 to be described later can be made uniform, which can simplify the manufacturing process of the semiconductor device. For example, an etching solution can be shared among respective removal steps of the material films 3, 4, 5, and 6, or an etching device used in the respective removal steps of the material films 3, 4, 5 and 6 can be shared. Alternatively, a deposition device used in the respective deposition steps of the material films 3, 4, 5, and 6 can be shared. Taking into consideration the ease of removal of the material films 3, 4, 5, and 6, the material films 3, 4, 5, and 6 is most preferably made of the silicon nitride film.

Figure 7:
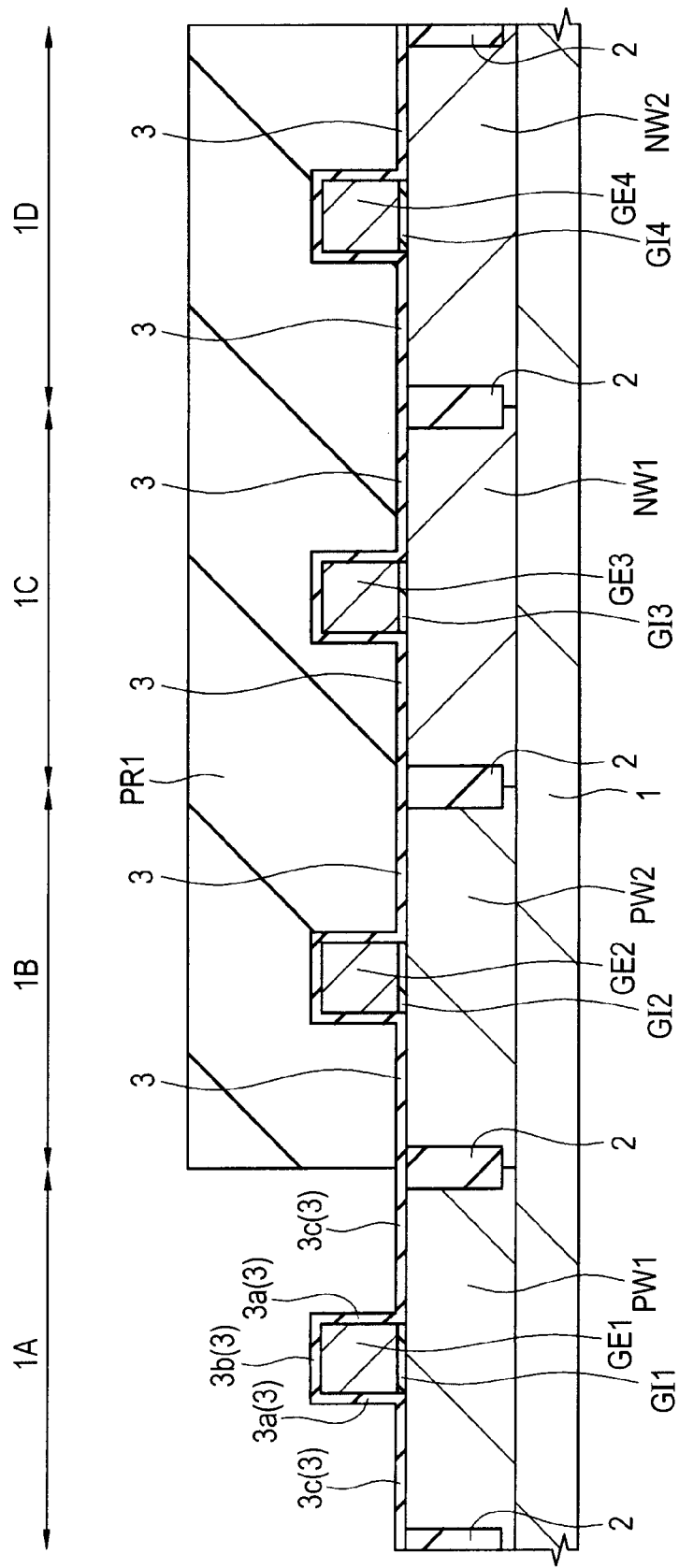
FIG. 7 is a cross-sectional view of a main part of another manufacturing step of the semiconductor device, following the step shown in FIG. 6.

Then, a photoresist film is applied to the main surface of the semiconductor substrate 1, that is, over the material film 3, and is then exposed and developed, so that a photoresist pattern (resist patter, or mask layer) PR1 is formed as a mask layer as shown in FIG. 7 (in step S6a shown in FIG. 1).

The photoresist pattern PR1 is formed in the nMIS region 1B, the pMIS region 1C, and the pMIS region 1D, but not formed in the nMIS region 1A. Thus, the material film 3 in the nMIS region 1B, the pMIS region 1C, and the pMIS region 1D is covered with the photoresist pattern PR1, but the material film 3 in the nMIS region 1A is not covered with the photoresist pattern PR1 and exposed to the outside.

Figure 8:
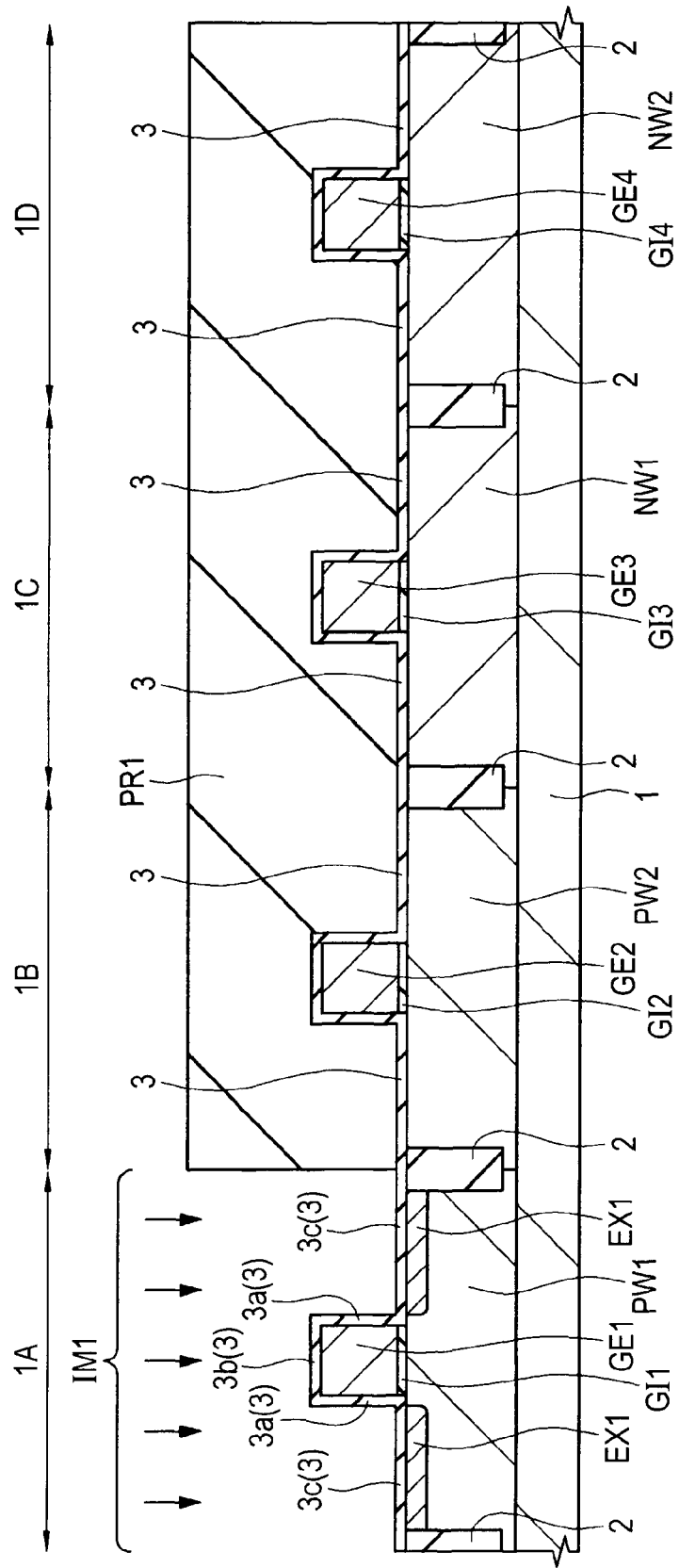
FIG. 8 is a cross-sectional view of a main part of another manufacturing step of the semiconductor device, following the step shown in FIG. 7.

Then, as shown in FIG. 8, ion implantation IM1 is performed into the semiconductor substrate 1 (in step S7a shown in FIG. 1). FIG. 8 exemplarily illustrates the ion implantation IM1 by the arrow. Other drawings (FIGS. 13, 18, 23, 31, 34, 36, 39, 41, 45, 47, 54, 58, 61, 64, 67, 71, 74, 77, and 80 which are to be described later) also exemplarily illustrate the ion implantation by the arrow. In the ion implantation IM1, n-type impurities, such as phosphorus (P) or arsenic (As), are introduced (ion-implanted) into the semiconductor substrate 1.

The photoresist pattern PR1 serves as an ion implantation blocking mask in the ion implantation IM1. No impurities are introduced (ion-implanted) into the nMIS region 1B and the pMIS regions 1C and 1D of the semiconductor substrate 1 (p-type well PW2 and n-type wells NW1 and NW2) which are not covered by the photoresist pattern PR1, and the gate electrodes GE2, GE3, and GE4 in the ion implantation IM1.

In contrast, since the nMIS region 1A is not covered with the photoresist pattern PR1 in the ion implantation IM1, the ion implantation can be performed on the nMIS region 1A of the semiconductor substrate 1 (p-type well PW1), while the gate structure (gate electrode GE1) in the nMIS region 1A, and the material film 3a located over the sidewalls of the gate structure (gate electrode GE1) can serve as the ion implantation blocking mask. That is, the material films 3a over the sidewalls of the gate structure (gate electrode GE1) in the nMIS region 1A serve as the offset spacer. Thus, no impurities are introduced (ion-implanted) into a region directly under the gate electrode GE1 in the p-type well PW1, and a region directly under the material film 3a on the sidewall of the gate electrode GE1 in the ion implantation IM1. The thickness (depth) $T_3$ of the formed material film 3 allows impurity ions to pass therethrough by the ion implantation IM1 with an ion implantation energy (acceleration energy). The impurity ions implanted by the ion implantation IM1 pass through the material film 3c over the p-type well PW1 to be introduced (implanted) into the p-type well PW1 (an upper layer part thereof) positioned under the material film 3c. In the ion implantation IM1, the impurity ions implanted can also pass through the material film 3b over the gate electrode GE1 to be implanted into the gate electrode GE1.

In the ion implantation IM1, n-type impurities, such as phosphorus (P) or arsenic (As), are introduced (ion-implanted) into both side regions of the gate electrode GE1 of the semiconductor substrate 1 (p-type well PW1) to thereby form extension regions (source and drain extension regions, $n^-$-type semiconductor regions, or n-type impurity diffusion layers) EX1. The extension region EX1 is an n-type semiconductor region, and has a lower concentration of impurities than that of the $n^+$-type source/drain region SD1 to be formed later. The depth (junction depth) of the extension region EX1 is shallower than the depth (junction depth) of the $n^+$-source/drain region SD1 to be formed later.

The extension region EX1 is formed by introducing (ion-implanting) impurities into the p-type well PW1 (an upper layer part thereof) through the material film 3c. Thus, the extension region EX1 is formed in alignment (self-alignment) with the side of the material film 3a on each sidewall of the gate electrode GE1 (surface opposite to the side in contact with the gate electrode GE1).

The ion implantation IM1 for formation of the extension region EX1 is preferably not the oblique ion implantation, but the ion implantation in the direction perpendicular to the main surface of the semiconductor substrate 1.

Before or after the ion implantation IM1 (with the material film 3 and the photoresist pattern PR1 formed), another ion implantation, for example, halo ion implantation can be performed on the semiconductor substrate 1. The halo ion implantation is performed to form a halo region (p-type semiconductor region) in the n-MIS region 1A of the semiconductor substrate 1 (p-type well PW1). The halo region is formed within the p-type well PW1 so as to enclose (cover) the extension region EX1. The halo region is the p-type semiconductor region (p-type impurity diffusion region) having a higher concentration of impurities than that of the p-type well PW1. The formation of the halo region can further suppress the short channel characteristics. The halo ion implantation is performed by ion-implanting p-type impurities, such as boron (B), (which are impurities of an opposed type to that of impurities implanted by the ion implantation IM1). The inclined ion implantation (oblique ion implantation) is more preferably performed. Thus, the halo region can be surely formed so as to enclose (cover) the extension region EX1. The general ion implantation involves accelerating and implanting impurity ions in the direction perpendicular to the main surface of the semiconductor substrate 1. In the oblique ion implantation, impurity ions are accelerated and implanted in the direction inclined at a predetermined angle (inclination angle) from the direction perpendicular to the main surface of the semiconductor substrate 1. In the halo ion implantation, no impurities are introduced (ion-implanted) into the nMIS region 1B and the pMIS regions 1C and 1D of the semiconductor substrate 1 (p-type well PW2 and n-type wells NW1 and NW2), and the gate electrodes GE2, GE3, and GE4, which are covered with the photoresist pattern PR1. The formation of the halo region can be omitted when not needed (that is, the halo ion implantation will be omitted).

Figure 9:
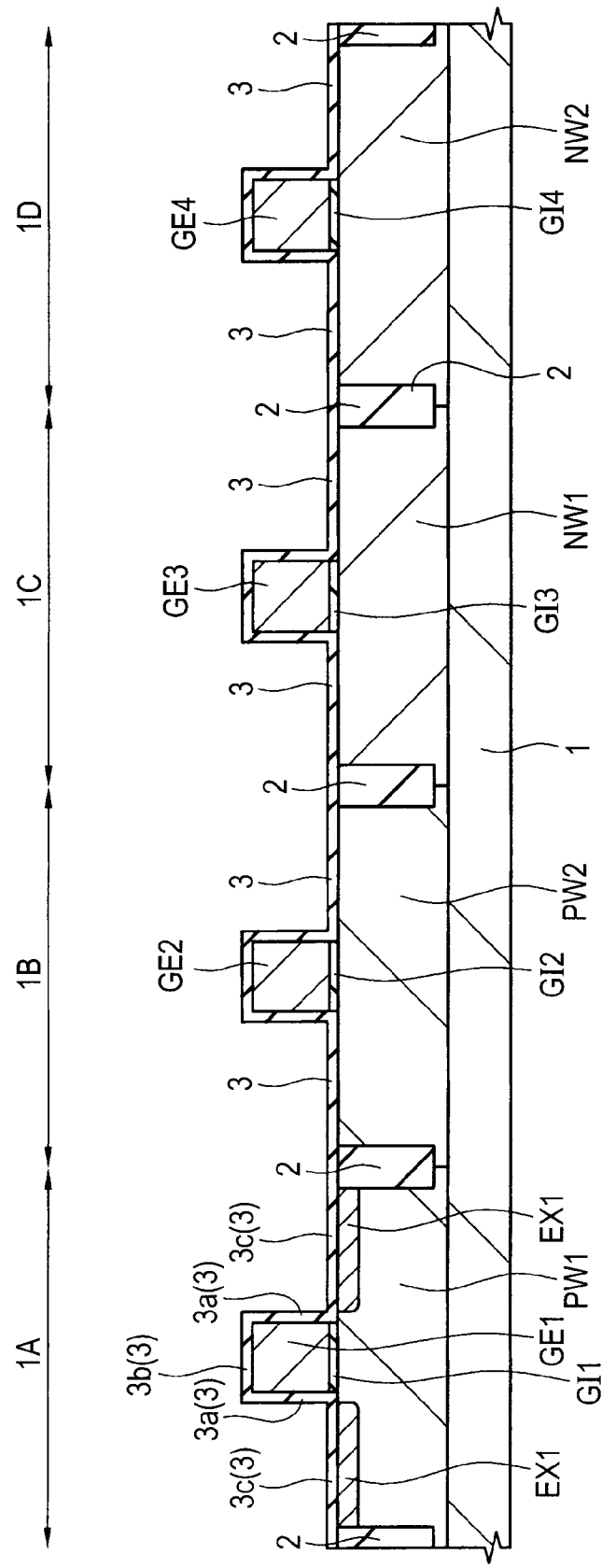
FIG. 9 is a cross-sectional view of a main part of another manufacturing step of the semiconductor device, following the step shown in FIG. 8.

Then, as shown in FIG. 9, the photoresist pattern PR1 is removed (in step S8a shown in FIG. 1). The photoresist pattern PR1 can be removed by ashing. In another embodiment, the photoresist pattern PR1 can be removed by the wet process.

Figure 10:
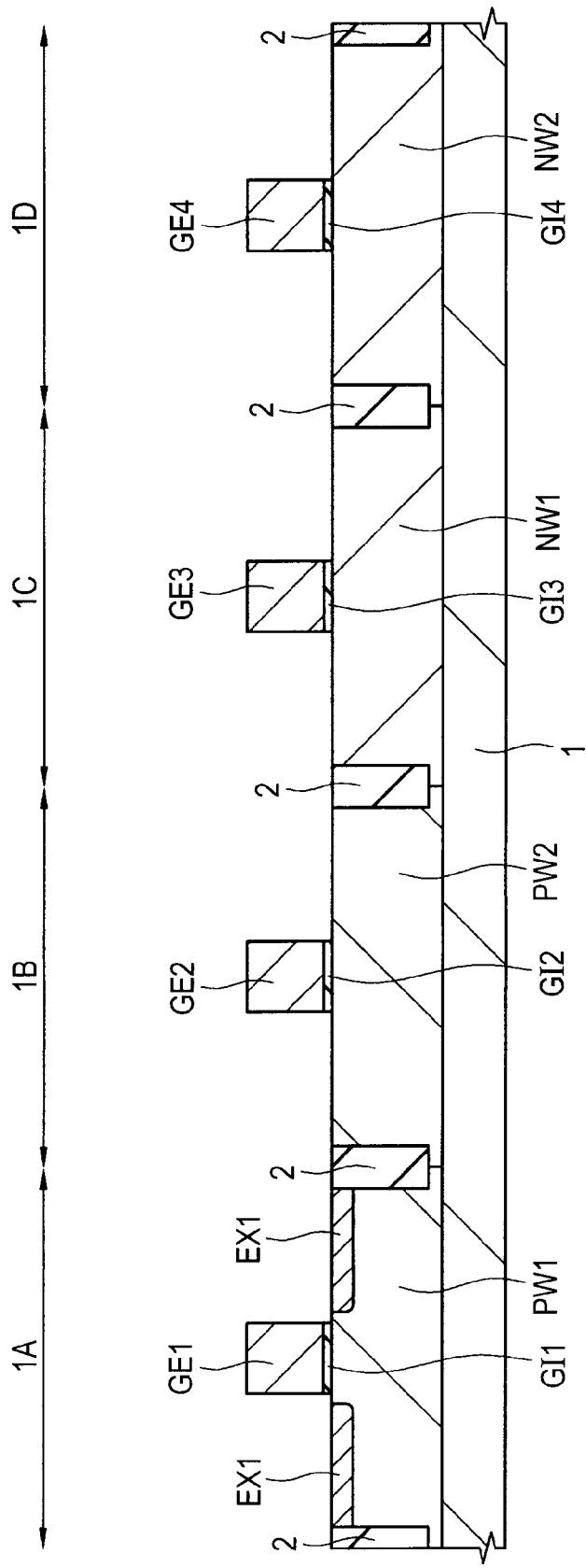
FIG. 10 is a cross-sectional view of a main part of another manufacturing step of the semiconductor device, following the step shown in FIG. 9.

Then, as shown in FIG. 10, the material film 3 is removed (in step S9a shown in FIG. 1). The material film 3 can be removed by the wet process using chemicals (wet etching process, or dissolving process using chemicals).

In step S9a, the material film 3 is removed to expose the gate structures in the nMIS regions 1A and 1B and the pMIS regions 1C and 1D. At this time, the entire gate structure (all the upper surface and the sides thereof) are preferably exposed in the respective nMIS regions 1A and 1B, and the pMIS regions 1C and 1D (that is, the material film 3 does not remain at the surface of the gate structure). The semiconductor substrate 1 is more preferably exposed in regions where the source and drain regions SD1, SD2, SD3, and SD4 are to be formed later (such that the material film 3 does not remain in the above regions). The gate structures exposed in step S9a (the structure including the gate insulating film GI1 and the gate electrode GE1, the structure including the gate insulating film GI2 and the gate electrode GE2, the structure including the gate insulating film GI3 and the gate electrode GE3, and the structure including the gate insulating film GI4 and the gate electrode GE4) correspond to the gate structures directly before forming the material film 3 in step S5a. Thus, when an oxide film (for example, a natural oxide film) is formed over the surface of each of the gate electrodes (GE1, GE2, GE3, and GE4) directly before the formation of the material film 3 in step S5a, the oxide film or the like can be contained in the gate structure.

A suitable chemical (wet process solution, or etchant) used for removing the material film 3 in step S9a can be selected depending on the kind of the material film 3, and is especially as follows.

When a silicon nitride film (typified by $Si_3N_4$ film) is used for the material film 3 for the offset spacer, a thermal phosphoric acid can be preferably used for removing the silicon nitride film (material film 3) in step S9a. The temperature of the liquid thermal phosphoric acid used is preferably in a range of 130 to 170° C. When the gate electrodes (GE1, GE2, GE3, GE4) are metal gate electrodes, and the gate insulating films (GI1, GI2, GI3, GI4) are high dielectric films (high-k) films, the chemical used in step S9a is preferably a phosphoric acid containing Si(silicon) in a high concentration so as to suppress the dissolution of the metal film included in the metal gate electrode or the high dielectric film included in the gate insulating film as much as possible. The Si concentration at this time is more preferably equal to or more than 30 ppm. Further, the temperature of the liquid thermal phosphoric acid is more preferably a relatively low temperature of 130 to 140° C., and thus can suppress the dissolution of the metal film (metal film included in the metal gate electrode) or the high dielectric film (high dielectric film included in the gate insulating film). If the surface of the silicon nitride film (material film 3) is oxidized by ashing for removal of the photoresist pattern PR1, the dissolution of the silicon nitride film (material film 3) by the thermal phosphoric acid will be inhibited. The ashing for removal of the photoresist pattern PR1 may more preferably use not an oxidized gas, such as $O_2$(oxygen gas), but $H_2$(hydrogen gas) or $N_2$(nitrogen gas). Even in this case, the silicon nitride film (material film 3) has its surface naturally oxidized, and thus can also be subjected to slight etching by a diluted hydrofluoric acid process directly before the thermal phosphoric acid process. In order to suppress or prevent the dissolution of the gate electrode material (metal film or polysilicon film) by the thermal phosphoric acid, the plasma process (ashing) can be performed using the oxidized gas, such as $O_2$ (oxygen gas) to oxidize the surfaces of the gate electrodes GE1, GE2, GE3, and GE4 (surfaces of the metallic film or polysilicon film) after formation of the gate electrode in step S4 until deposition of the material film 3 in step S5a. Thus, the thermal phosphoric acid containing Si in a high concentration (and another thermal phosphoric acid having a relatively low temperature of 130 to 140° C.) has a low dissolution rate of oxides. Under use of such a thermal phosphorus acid, the gate electrodes GE1, GE2, GE3, and GE4 (surfaces of metal films or polysilicon films included in the gate electrodes GE1, GE2, GE3, and GE4) are protected by the oxidized layer of the gate electrodes, so that the shape of each gate electrode can be maintained more securely.

When the silicon oxide film (silicon oxide film formed by the CVD method, that is, a CVD oxide film) is used as the material film 3 for the offset spacer, a diluted hydrofluoric acid can be suitably used to remove the oxide silicon film (material film 3) in step S9a. At this time, the concentration of the diluted hydrofluoric acid, that is, the HF concentration is preferably equal to or less than 1 wt % (% by weight), preferably, 0.1 wt % (% by weight) or less. By lowering the concentration of fluoric acid, an etching selectivity between the CVD oxide film (material film 3) and the high dielectric film (high dielectric film forming the gate insulating films GI1, GI2, GI3, and GI4) can be increased, so that the CVD oxide film (material film 3) can be surely removed without dissolving the high dielectric film. For example, when the diluted fluoric acid solution of 0.05 wt % (% by weight) is set at a liquid temperature of room temperature to about 50° C., the etching rate selectivity of the etching rate of the CVD oxide film (material film 3) to that of the high dielectric film (high dielectric film forming the gate insulating films GI1, GI2, GI3, and GI4) (that is, the ratio of the etching rate of the CVD oxide film to that of the high dielectric film; Etching Rate of CVD Oxide Film/Etching Rate of High Dielectric Film) can be set to 50 or more.

A metal film can be used as the material film 3 for the offset spacer. In this case, suitable metal materials for use can include a single metal, such as Al(aluminum), Ni(nickel), W(tungsten), Co(cobalt), or Ti(titanium), or an alloy containing one or more kinds of elements selected from the group consisting of Al, Ni, W, Co, and Ti as a principal component. In this case, the removal of the metal film (material film 3) for the offset spacer can suitably use a chemical containing an oxidant, such as hydrogen peroxide or ozone water, or an acid or alkaline chemical. For example, SPM ($H_2SO_4+H_2O_2$), HPM($HCl+H_2O_2+H_2O$), APM ($NH_4OH+H_2O_2+H_2O$), nitric acid, sulfuric acid, or hydrochloric acid can be suitably used. For example, when titanium nitride (TiN) is used for the metal film included in the meal gate electrodes (corresponding to the gate electrodes GE1, GE2, GE3, and GE4 comprised of the metal gate electrode), and tungsten (W) is used for the metal film for the offset spacer (metal film 3), only the tungsten can be dissolved with high selectivity by conc. $H_2O_2$ (30 wt %). The plasma (ashing) using the oxidized gas, such as $O_2$(oxygen gas), is performed until the material film 3 may be deposited after the formation of the gate electrodes GE1, GE2, GE3, and GE4, so that the surface of the metal film included in the metal gate electrode is oxidized to prevent the dissolution of the metal film due to the presence of the chemical for removal of the material film 3 for the offset spacer. For example, the oxidization of the side of the titanium nitride (TiN) film included in the metal gate electrode (exposed side at the sidewall of the metal gate electrode) by the $O_2$-plasma process (ashing) can prevent the dissolution of the metal film in the conc. $H_2O_2$ (concentrated $H_2O_2$).

After removing the material film 3 in step S9a, a cleaning process can be performed again on the semiconductor substrate 1. The cleaning process after the removal of the material film 3 for the offset spacer can include a physical cleaning process for physically removing particles. For example, jet cleaning using two fluids, namely, a liquid (pure water) and a gas (nitrogen, or dried air), or megasonic cleaning using dissolved gas and water can be suitably performed. The dissolved gas and water megasonic cleaning is preferably performed in sequence in a water pool after the thermal phosphoric acid process by a batch processor using the thermal phosphorus acid (process for removing the material film 3 made of silicon nitride by the thermal phosphoric acid). In this embodiment, the particles upon removing the material film 3 for the offset spacer and the residues of the resist after the ashing of the resist (photoresist pattern PR1) are removed together with the material film 3 for the offset spacer. Even when the particles and residues are attached to a wafer (semiconductor substrate 1) again, they can be easily removed by only the physical cleaning. Thus, in first and second comparative examples to be described later, cleaning conditions need to be set so as to suppress the etching of the offset spacer film as much as possible. The comparative examples have a low removing capacity of particles and possibly have a low yield. In contrast, this embodiment has a high removing capacity of particles, and thus has an advantage in improvement of the yield.

Figure 11:
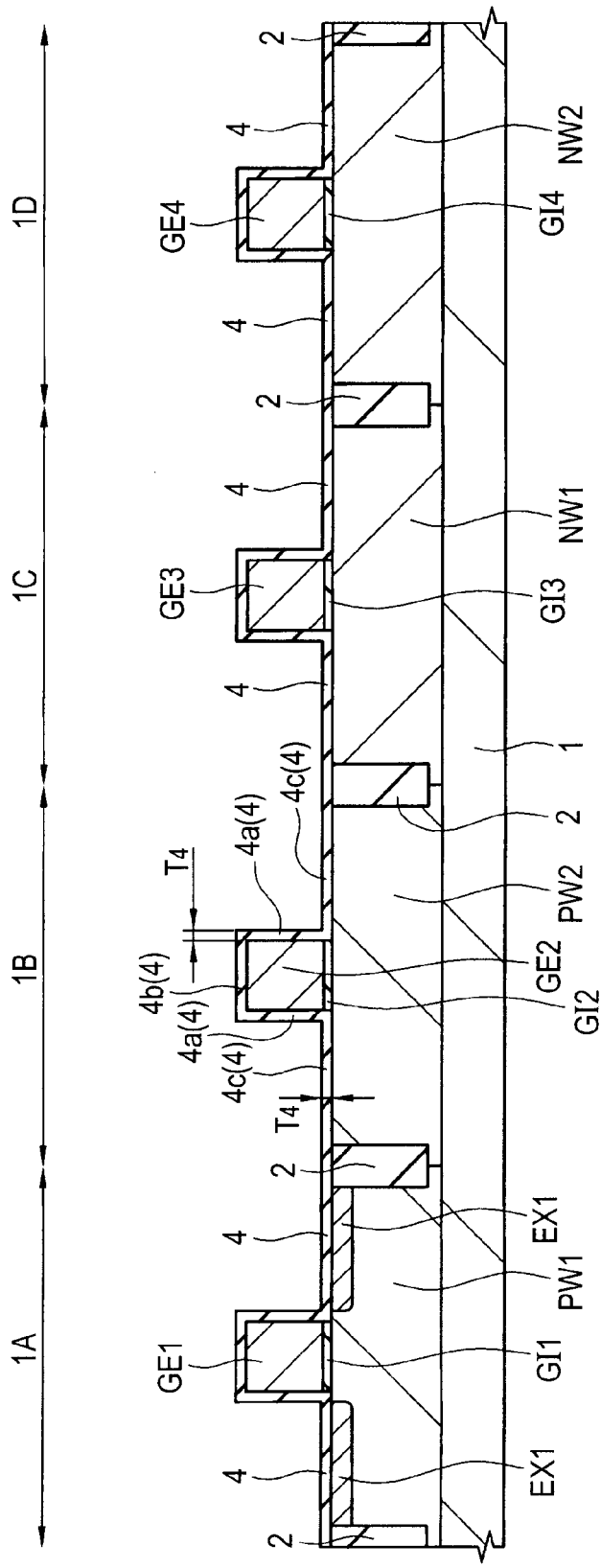
FIG. 11 is a cross-sectional view of a main part of another manufacturing step of the semiconductor device, following the step shown in FIG. 10.

Then, as shown in FIG. 11, a material film 4 for the offset spacer is formed (deposited) over the main surface (entire main surface) of the semiconductor substrate 1 so as to cover the gate structures (gate electrodes GE1, GE2, GE3, and GE4) of the nMIS regions 1A and 1B and the pMIS regions 1C and 1D (in step S5b shown in FIG. 1). In the nMIS regions 1A and 1B and the pMIS regions 1C and 1D, the material film 4 is formed over the upper surfaces and sidewalls of the gate structures (gate electrodes GE1, GE2, GE3, and GE4), and over parts (p-type wells PW1 and PW1, and n-type wells NW1 and NW2) of the semiconductor substrate 1 not covered by the gate structures (gate electrodes GE1, GE2, GE3, and GE4). Suitable materials and formation methods for the material film 4 are basically the same as those of the above material film 3, and thus a repeated description thereof will be omitted below. The thickness (depth) $T_4$ of the formed material film 4 can be, for example, in a range of about 2 to 5 nm so as to serve as the offset spacer of the ion implantation IM2 to be performed later.

Parts of the material film 4 formed at both sidewalls of the gate structure (gate electrode GE2) in the nMIS region 1B each are referred to as a "material film 4a" indicated by reference numeral 4a. A part of the material film 3 formed over an upper surface of the gate structure (gate electrode GE2) is referred to as a "material film 4b" indicated by reference numeral 4b. Other parts of the material film 3 formed over a p-type well PW2 are referred to as a "material film 4c" indicated by reference numeral 4c. The thickness of the material film 4c in the direction substantially perpendicular to the main surface of the semiconductor substrate 1 almost corresponds to the above thickness $T_4$. The thickness of the material film 4b in the direction substantially perpendicular to the main surface of the semiconductor substrate 1 almost corresponds to the above thickness $T_4$. The thickness of the material film 4a in the direction substantially parallel to the main surface of the semiconductor substrate 1 almost corresponds to the above thickness $T_4$.

Figure 12:
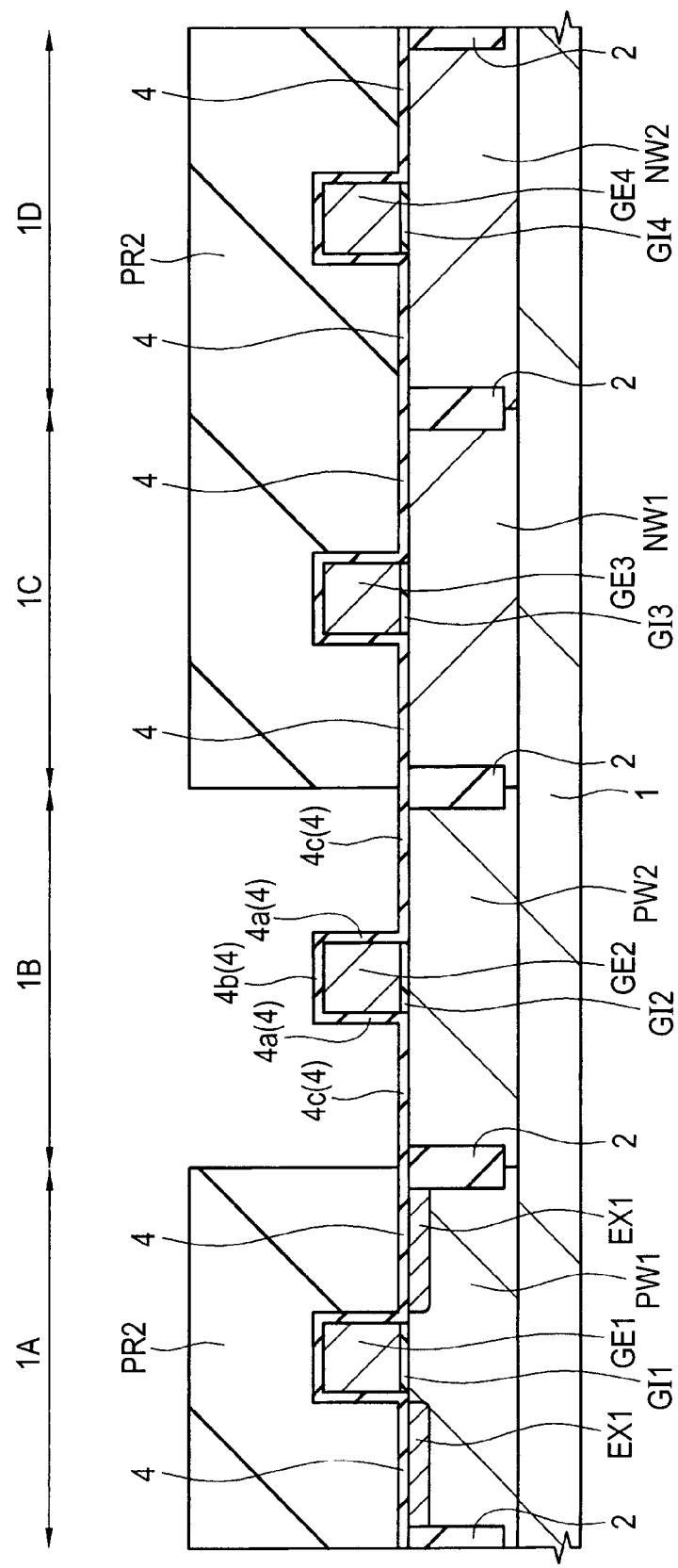
FIG. 12 is a cross-sectional view of a main part of another manufacturing step of the semiconductor device, following the step shown in FIG. 11.

Then, a photoresist film is applied to the main surface of the semiconductor substrate 1, that is, over the material film 4, and is then exposed and developed, so that a photoresist pattern (resist patter, or mask layer) PR2 is formed as a mask layer as shown in FIG. 12 (in step S6b shown in FIG. 1).

The photoresist pattern PR2 is formed in the nMIS region 1A, the pMIS region 1C, and the pMIS region 1D, but not formed in the nMIS region 1B. Thus, the material film 4 in the nMIS region 1A, the pMIS region 1C, and the pMIS region 1D is covered with the photoresist pattern PR2, but the material film 4 in the nMIS region 1B is not covered with the photoresist pattern PR2 and exposed to the outside.

Figure 13:
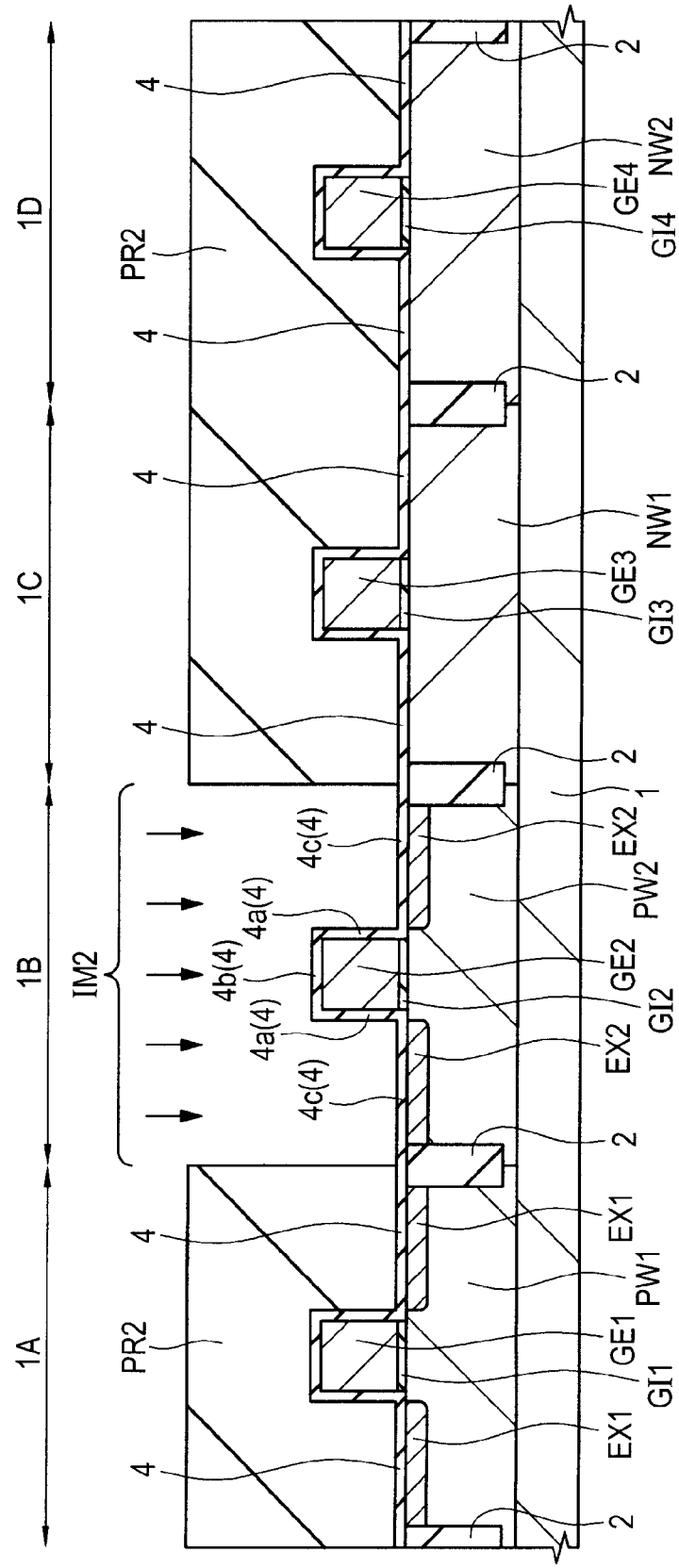
FIG. 13 is a cross-sectional view of a main part of another manufacturing step of the semiconductor device, following the step shown in FIG. 12.

Then, as shown in FIG. 13, ion implantation IM2 is performed into the semiconductor substrate 1 (in step S7b shown in FIG. 1). In the ion implantation IM2, n-type impurities, such as phosphorus (P) or arsenic (As), are introduced (ion-implanted) into the semiconductor substrate 1. The ion implantation IM2 differs from the above ion implantation IM1 in conditions for ion implantation, for example, the amount of dose or the implantation energy (in some cases, in impurity to be implanted). That is, the conditions for ion implantation into the nMIS region 1A, and the conditions for ion implantation into the nMIS region 1B are different from each other. Thus, the ion implantation IM1 using the photoresist pattern PR1 for selectively exposing the nMIS region 1A is performed separately from the ion implantation IM2 using the photoresist pattern PR2 for selectively exposing the nMIS region 1B. This goes the same for the ion implantations IM3 and IM4 to be described later.

The photoresist pattern PR2 serves as an ion implantation blocking mask in the ion implantation IM2. No impurities are introduced (ion-implanted) into the nMIS region 1A and the pMIS regions 1C and 1D of the semiconductor substrate 1 (p-type well PW2 and n-type wells NW1 and NW2), which are not covered with the photoresist pattern PR2, and the gate electrodes GE1, GE3, and GE4 in the ion implantation. IM2.

In contrast, since the photoresist pattern PR2 is not formed in the nMIS region 1B in the ion implantation IM2, the ion implantation can be performed on the nMIS region 1B of the semiconductor substrate 1 (p-type well PW2), while the gate structure (gate electrode GE2) in the nMIS region 1B, and the material films 4a over the sidewalls of the gate structure (gate electrode GE2) can serve as the ion implantation blocking mask. That is, the material films 4a over the sidewalls of the gate structure (gate electrode GE2) in the nMIS region 1B serve as the offset spacer. Thus, no impurities are introduced (ion-implanted) into a region directly under the gate electrode GE2 in the p-type well PW2, and a region directly under the material film 4a at the sidewall of the gate electrode GE2 in the ion implantation IM2. The thickness (depth) $T_4$ of the formed material film 4 allows impurity ions to pass therethrough by the ion implantation IM2 with the ion implantation energy (acceleration energy). The impurity ions implanted by the ion implantation IM2 pass through the material film 4c over the p-type well PW2 to be introduced (implanted) into the p-type well PW2 (an upper layer part thereof) positioned under the material film 4c. In the ion implantation IM2, the impurity ions implanted can also pass through the material film 4b over the gate electrode GE2 to be implanted into the gate electrode GE2.

In the ion implantation IM2, n-type impurities, such as phosphorus (P) or arsenic (As), are introduced (ion-implanted) into both side regions of the gate electrode GE2 of the semiconductor substrate 1 (p-type well PW2) to thereby form extension regions (source and drain extension regions, n⁻-type semiconductor regions, or n-type impurity diffusion layers) EX2. The extension region EX2 is an n-type semiconductor region, and has a lower concentration of impurities than that of the n⁺-type source/drain region SD2 to be formed later. The depth (junction depth) of the extension region EX2 is shallower than the depth (junction depth) of the n⁺-source/drain region SD2 to be formed later.

The extension region EX2 is formed by introducing (ion-implanting) impurities into the p-type well PW2 (an upper layer part thereof) through the material film 4c. Thus, the extension region EX2 is formed in alignment (self-alignment) with the side of the material film 4a at each sidewall of the gate electrode GE2 (surface opposite to the side in contact with the gate electrode GE2).

The ion implantation IM2 for formation of the extension region EX2 is preferably not the oblique ion implantation, but the ion implantation in the direction perpendicular to the main surface of the semiconductor substrate 1.

Before or after the ion implantation IM2 (with the material film 4 and the photoresist pattern PR2 formed), another ion implantation, for example, halo ion implantation can be performed on the semiconductor substrate 1. The halo ion implantation is performed to form a halo region (p-type semiconductor region) in the n-MIS region 1B of the semiconductor substrate 1 (p-type well PW2). The halo region is formed within the p-type well PW2 so as to enclose (cover) the extension region EX2. The halo region is the p-type semiconductor region (p-type impurity diffusion region) having a higher concentration of impurities than that of the p-type well PW2. The halo ion implantation is performed by ion-implanting p-type impurities, such as boron (B), (which are impurities of an opposed type to that of impurities implanted by the ion implantation IM2). The inclined implantation (oblique ion implantation) is more preferably performed. In the halo ion implantation, no impurities are introduced (ion-implanted) into the nMIS region 1A and the pMIS regions 1C and 1D of the semiconductor substrate 1 (p-type well PW1 and n-type wells NW1 and NW2), and the gate electrodes GE1, GE3, and GE4, which are covered with the photoresist pattern PR2. The formation of the halo region can be omitted when not needed (that is, the halo ion implantation will be omitted).

Figure 14:
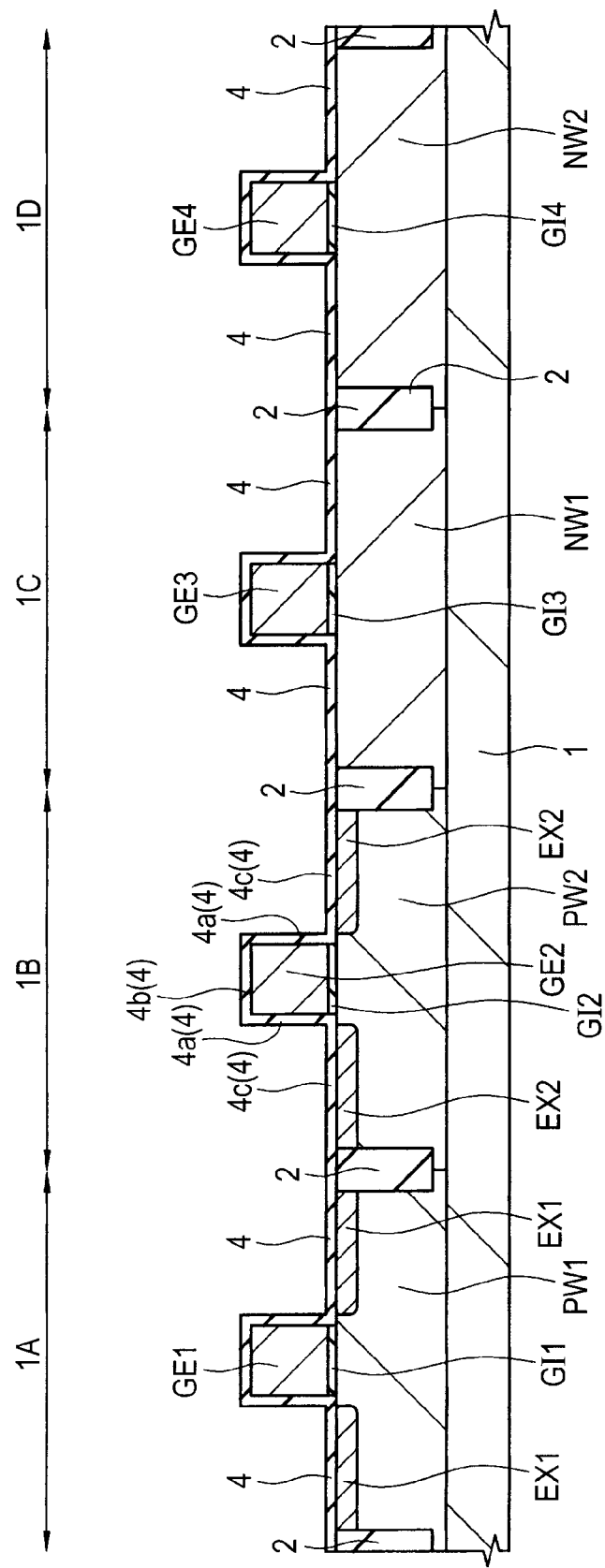
FIG. 14 is a cross-sectional view of a main part of another manufacturing step of the semiconductor device, following the step shown in FIG. 13.

Then, as shown in FIG. 14, the photoresist pattern PR2 is removed (in step S8a shown in FIG. 1). The photoresist pattern PR2 can be removed by ashing. In another embodiment, the photoresist pattern PR2 can be removed by a wet process.

Figure 15:
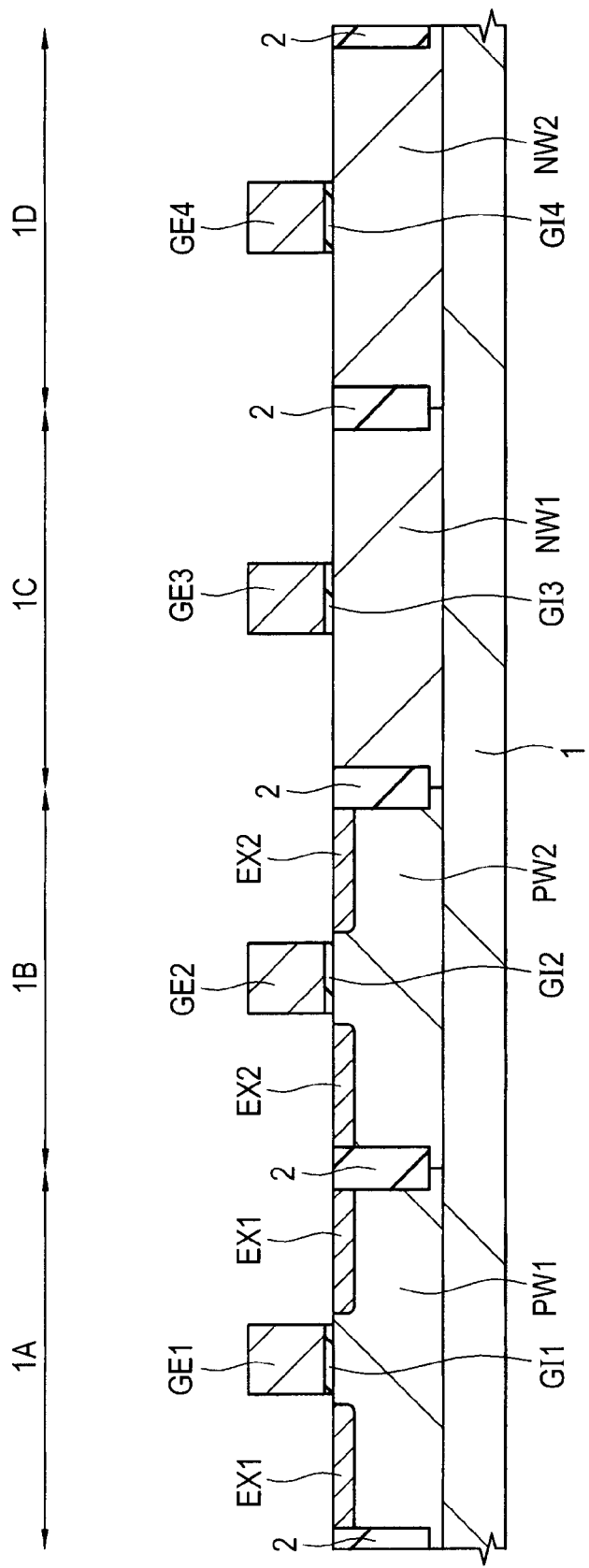
FIG. 15 is a cross-sectional view of a main part of another manufacturing step of the semiconductor device, following the step shown in FIG. 14.

Then, as shown in FIG. 15, the material film 4 is removed (in step S9b shown in FIG. 1). The material film 4 can be removed by the wet process using chemicals (wet etching process, dissolving process using chemicals). The removal process of the material film 4 in step S9b is basically the same as that of the material film 3 in the above step S9a.

In step S9b, the respective gate structures are exposed from the nMIS regions 1A and 1B, and the pMIS regions 1C and 1D by removing the material film 4. At this time, the entire gate structures (entire upper surfaces and sidewalls thereof) are preferably exposed from each of the nMIS regions 1A and 1B and the pMIS regions 1C and 1D (such that the material film 4 is not left at the surface of the gate structure). Further, regions of the semiconductor substrate 1 where the source and drain regions SD1, SD2, SD3, and SD4 are to be formed are preferably exposed (such that the material film 4 is not left at the regions where the source and drain regions are to be formed). The gate structures exposed in step S9b (the structure including the gate insulating film GI1 and the gate electrode GE1, the structure including the gate insulating film GI2 and the gate electrode GE2, the structure including the gate insulating film GI3 and the gate electrode GE3, and the structure including the gate insulating film GI4 and the gate electrode GE4) correspond to the gate structures directly before the formation of the material film 4 in step S5b. When an oxide film (for example, natural oxide film) or the like is formed over the surface of each of the gate electrodes (GE1, GE2, GE3, and GE4) directly before the formation of the material film 4 in step S5b, such an oxide film can be included in the gate structures. Like the process after the above step S9a, another cleaning process can also be performed on the semiconductor substrate 1 after removing the material film 4 in step S9b.

Figure 16:
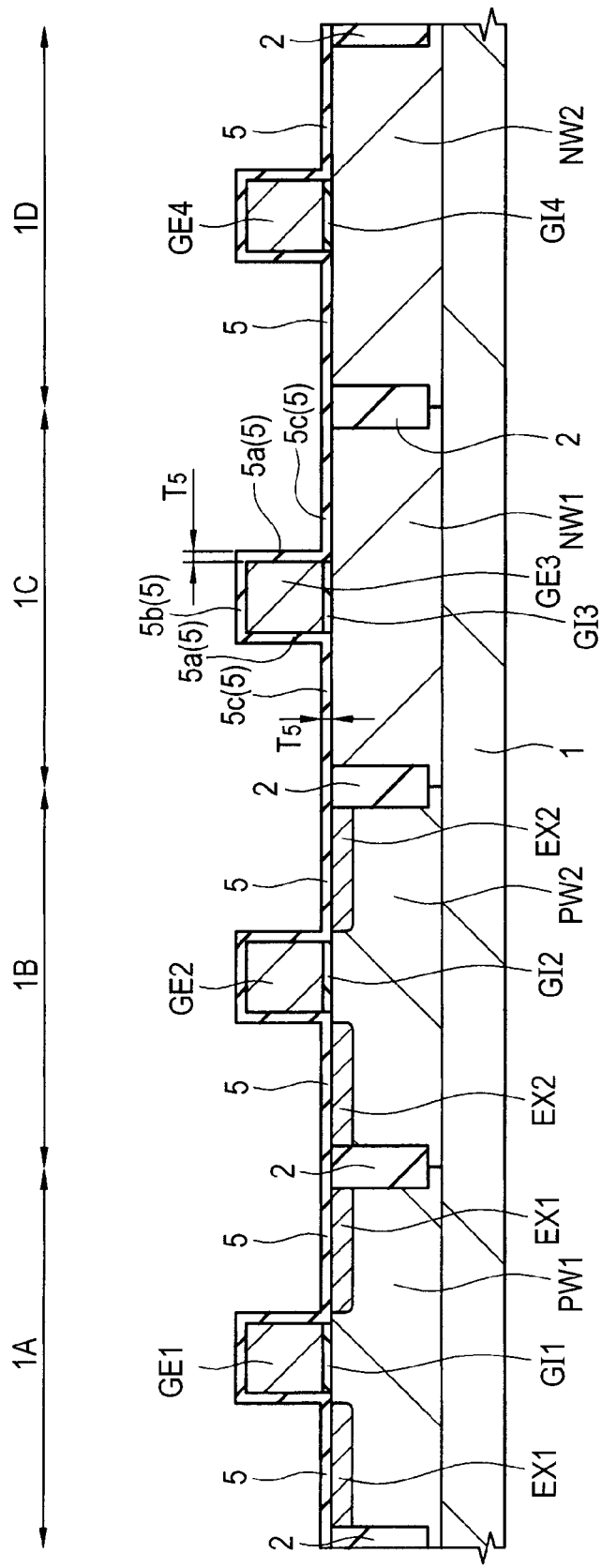
FIG. 16 is a cross-sectional view of a main part of another manufacturing step of the semiconductor device, following the step shown in FIG. 15.

Then, as shown in FIG. 16, a material film 5 for the offset spacer is formed (deposited) over the main surface (entire main surface) of the semiconductor substrate 1 so as to cover the gate structures (gate electrodes GE1, GE2, GE3, and GE4) in the nMIS regions 1A and 1B and the pMIS regions 1C and 1D (in step S5c shown in FIG. 1). In the nMIS regions 1A and 1B, and the pMIS regions 1C and 1D, the material film 5 is formed over the upper surfaces and side walls of the gate structures (gate electrodes GE1, GE2, GE3, and GE4) and over the parts of the semiconductor substrate 1 (p-type wells PW1 and PW2, and n-type wells NW1 and NW2) not covered with the gate structures (gate electrodes GE1, GE2, GE3, and GE4). Suitable materials and formation methods of the material film 5 are basically the same as those of the above material film 3, and thus a repeated description thereof will be omitted below. The thickness (depth) $T_5$ of the formed material film 5 can be, for example, in a range of about 2 to 5 nm so as to serve as the offset spacer of the ion implantation IM3 to be performed later.

Parts of the material film 5 formed at both sidewalls of the gate structure (gate electrode GE3) in the pMIS region 1C each are referred to as a "material film 5a" indicated by reference numeral 5a. A part of the material film 5 formed over an upper surface of the gate structure (gate electrode GE3) is referred to as a "material film 5b" indicated by reference numeral 5b. Other parts of the material film 5 formed over the n-type well NW1 are referred to as a "material film 5c" indicated by reference numeral 5c. The thickness of the material film 5c in the direction substantially perpendicular to the main surface of the semiconductor substrate 1 almost corresponds to the above thickness $T_5$. The thickness of the material film 5b in the direction substantially perpendicular to the main surface of the semiconductor substrate 1 almost corresponds to the above thickness $T_5$. The thickness of the material film 5a in the direction substantially parallel to the main surface of the semiconductor substrate 1 almost corresponds to the above thickness $T_5$.

Figure 17:
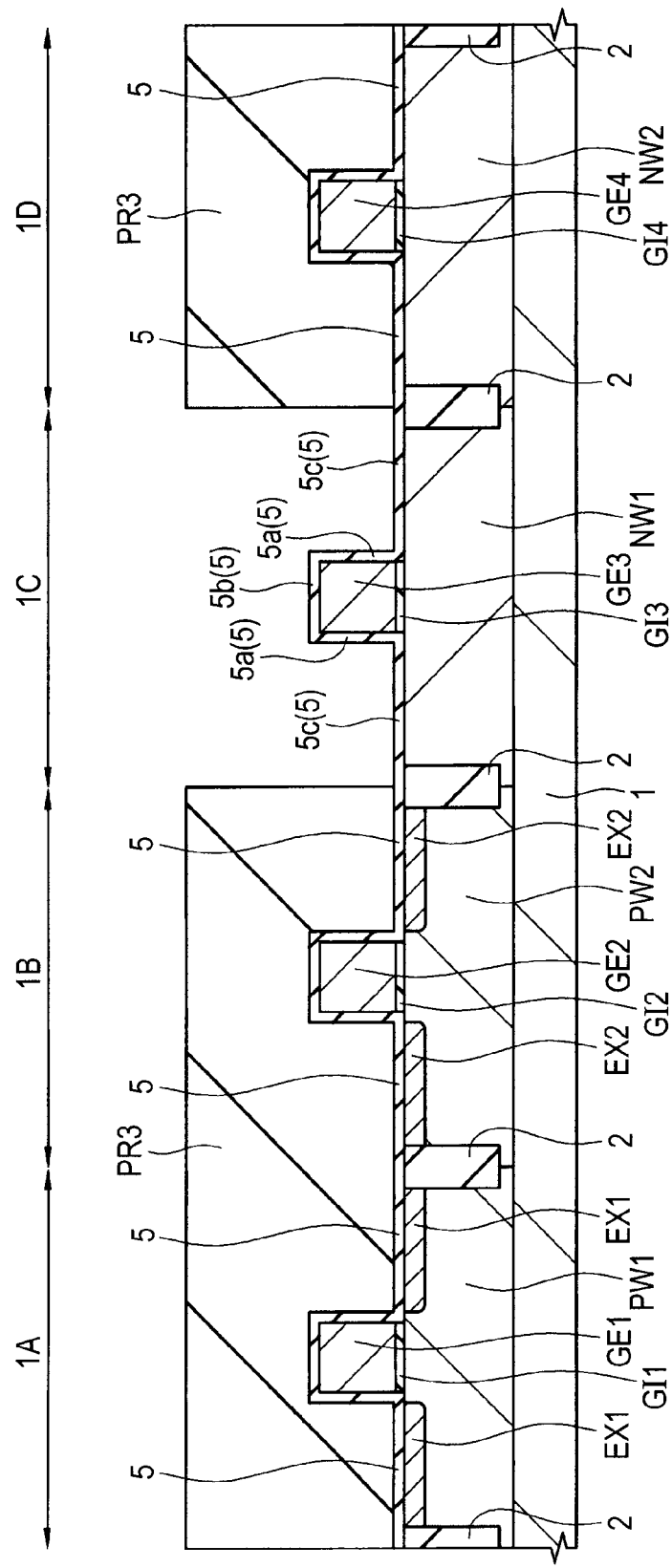
FIG. 17 is a cross-sectional view of a main part of another manufacturing step of the semiconductor device, following the step shown in FIG. 16.

Then, a photoresist film is applied to the main surface of the semiconductor substrate 1, that is, over the material film 5, and is then exposed and developed, so that a photoresist pattern (resist pattern, or mask layer) PR3 is formed as a mask layer as shown in FIG. 17 (in step S6c shown in FIG. 2).

The photoresist pattern PR3 is formed in the nMIS region 1A, the nMIS region 1B, and the pMIS region 1D, but not formed in the pMIS region 1C. Thus, the material film 5 in the nMIS region 1A, the nMIS region 1B, and the pMIS region 1D is covered with the photoresist pattern PR3, but the material film 5 in the pMIS region 1C is not covered with the photoresist pattern PR3 and exposed to the outside.

Figure 18:
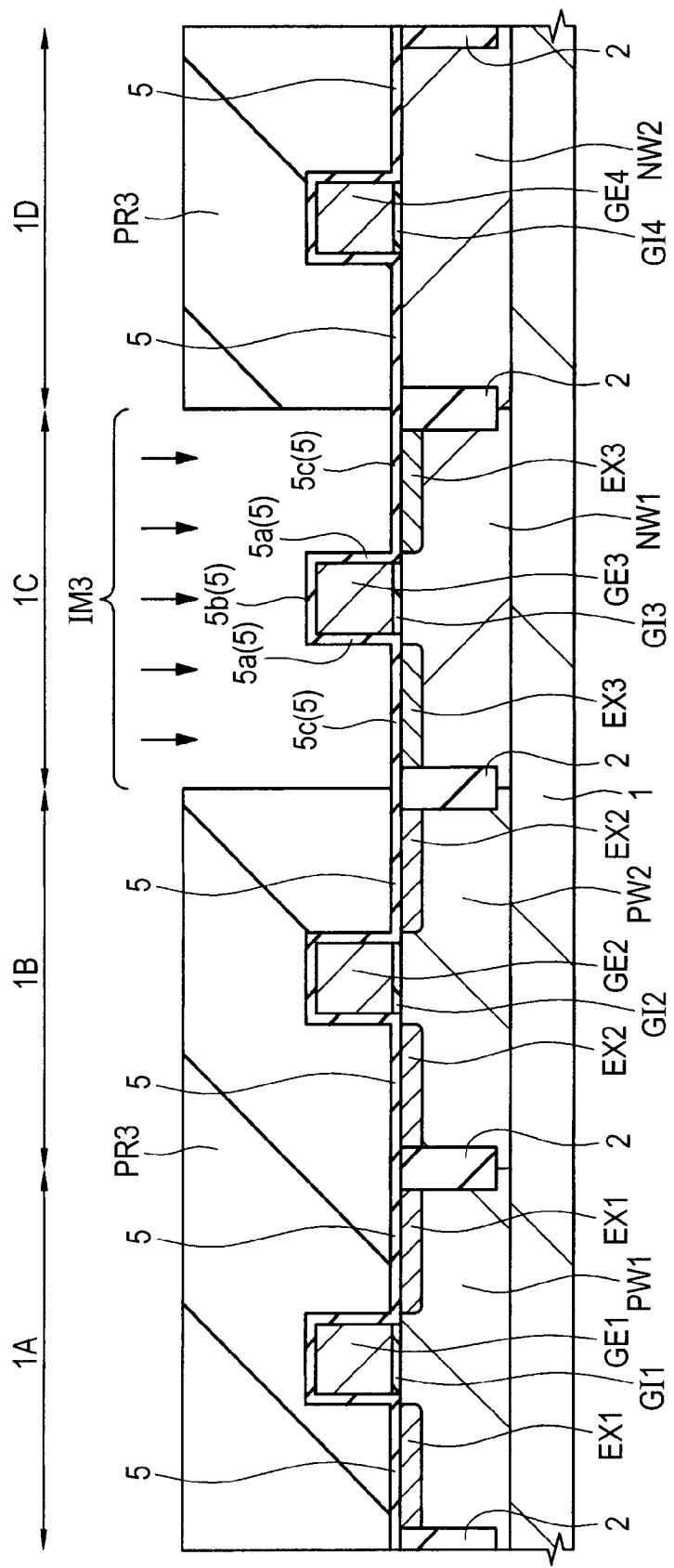
FIG. 18 is a cross-sectional view of a main part of another manufacturing step of the semiconductor device, following the step shown in FIG. 17.

Then, as shown in FIG. 18, ion implantation IM3 is performed into the semiconductor substrate 1 (in step S7c shown in FIG. 2). In the ion implantation IM3, p-type impurities, such as boron (B), are introduced (ion-implanted) into the semiconductor substrate 1. The ion implantation IM3 differs from the above ion implantations IM1 and IM2 in conditions for ion implantation. That is, the ion implantation IM3 differs from the above ion implantations IM1 and IM2 in kind of impurity to be implanted (also in the amount of dose or the implantation energy or the like).

In the ion implantation IM3, the photoresist pattern PR3 functions as the ion implantation inhibiting mask, and no impurities are introduced (ion-implanted) into the nMIS regions 1A and 1B and the pMIS region 1D of the semiconductor substrate 1 (p-type wells PW1 and PW2, and n-type well NW2) and the gate electrodes GE1, GE2, and GE4, which are covered with the photoresist pattern PR3.

In contrast, upon the ion implantation IM3, the pMIS region 1c does not have any photoresist pattern PR3 formed therein, and thus the ion implantation can be performed on the semiconductor substrate 1 in the pMIS region 1C (n-type well NW1). The material film 5a formed at the gate structure of the pMIS region (gate electrode GE3), and sidewalls of the gate structure (gate electrode GE3) can serve as the ion implantation blocking mask. That is, the material film 5a over the sidewall of the gate structure (gate electrode GE3) in the pMIS region 1C serves as the offset spacer. Thus, no impurities are introduced (ion-implanted) into a region directly under the gate electrode GE3 in the n-type well NW1, and a region directly under the material film 5a over the sidewall of the gate electrode GE3 in the ion implantation IM3. The thickness (depth) $T_5$ of the formed material film 5 allows impurity ions to pass therethrough by the ion implantation IM3 with an ion implantation energy (acceleration energy). The impurity ions implanted by the ion implantation IM3 pass through the material film 5c over the n-type well NW1 to be introduced (implanted) into the n-type well NW1 (upper layer part thereof) located under the material film 5c. In the ion implantation IM3, the impurity ions implanted can also pass through the material film 5b over the gate electrode GE3 to be implanted into the gate electrode GE3.

In the ion implantation IM3, p-type impurities, such as boron (B), are introduced (ion-implanted) into both side regions of the gate electrode GE3 of the semiconductor substrate 1 (n-type well NW1) to thereby form extension regions (source and drain extension regions, p$^-$-type semiconductor regions, or p-type impurity diffusion layers) EX3. The extension region EX3 is a p-type semiconductor region, and has a lower concentration of impurities than that of the p$^+$-type source/drain region SD3 to be formed later. The depth (junction depth) of the extension region EX3 is shallower than the depth (junction depth) of the p$^+$-source/drain region SD3 to be formed later.

The extension region EX3 is formed by introducing (ion-implanting) impurities into the n-type well NW1 (an upper layer part thereof) through the material film 5c. Thus, the extension region EX3 is formed in alignment (self-alignment) with the side of the material film 5a over each sidewall of the gate electrode GE3 (surface opposite to the side in contact with the gate electrode GE3).

The ion implantation IM3 for formation of the extension region EX3 is preferably not the oblique ion implantation, but the ion implantation in the direction perpendicular to the main surface of the semiconductor substrate 1.

Before or after the ion implantation IM3 (with the material film 5 and the photoresist pattern PR3 formed), other ion implantations, for example, the halo ion implantation can be performed on the semiconductor substrate 1. The halo ion implantation is performed to form a halo region (n-type semiconductor region) in the pMIS region 1C of the semiconductor substrate 1 (n-type well NW1). The halo region is formed within the n-type well NW1 so as to enclose (cover) the extension region EX3. The halo region is the n-type semiconductor region (n-type impurity diffusion region) having a higher concentration of impurities than that of the n-type well NW1. The halo ion implantation is performed by ion-implanting n-type impurities, such as phosphorus (P) or arsenic (As), (which are impurities of an opposed type to that of impurities implanted by the ion implantation IM3). The inclined ion implantation (oblique ion implantation) is more preferably performed. In the halo ion implantation, no impurities are introduced (ion-implanted) into the nMIS regions 1A and 1B and the pMIS region 1D of the semiconductor substrate 1 (p-type wells PW1 and PW2 and n-type wells NW2), and the gate electrodes GE1, GE2, and GE4, which are covered with the photoresist pattern PR3. The formation of the halo region can be omitted if not needed (that is, the halo ion implantation will be omitted).

Figure 19:
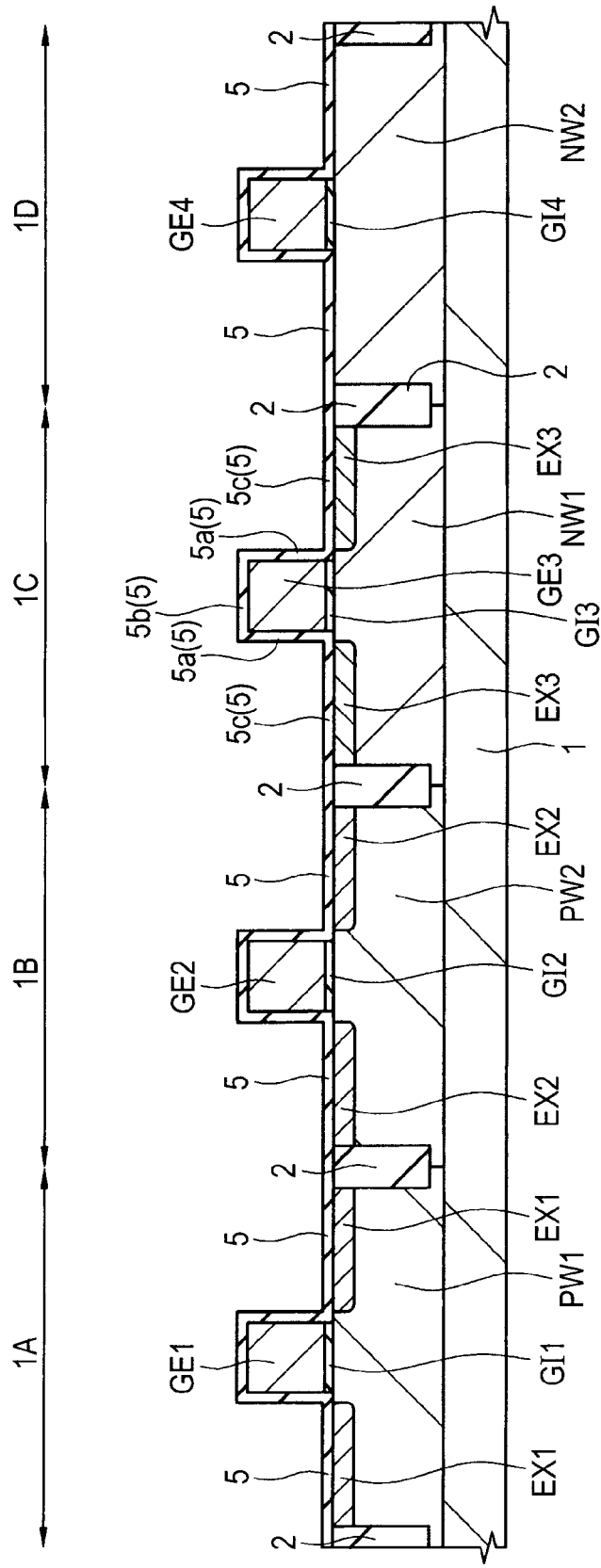
FIG. 19 is a cross-sectional view of a main part of another manufacturing step of the semiconductor device, following the step shown in FIG. 18.

Then, as shown in FIG. 19, the photoresist pattern PR3 is removed (in step S8c shown in FIG. 2). The photoresist pattern PR3 can be removed by ashing. In another embodiment, the photoresist pattern PR3 can be removed by the wet process.

Figure 20:
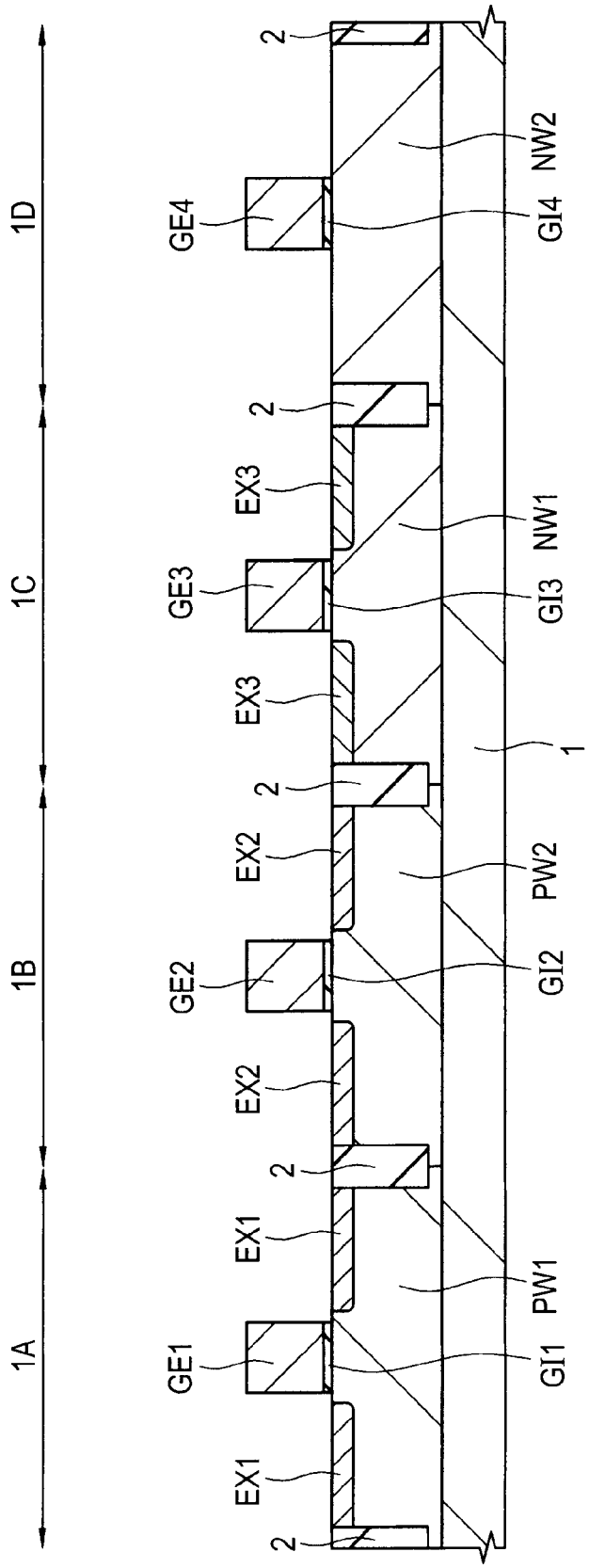
FIG. 20 is a cross-sectional view of a main part of another manufacturing step of the semiconductor device, following the step shown in FIG. 19.

Then, as shown in FIG. 20, the material film 5 is removed (in step S9c shown in FIG. 2). The material film 5 can be removed by the wet process using chemicals (wet etching process, dissolving process using a chemical). The removal process of the material film 5 in step S9c is basically the same as the removal process of the material film 3 in the above step S9a.

In step S9c, the material film 5 is removed to expose the gate structures in the nMIS regions 1A and 1B and the pMIS regions 1C and 1D. At this time, the entire gate structure (all the upper surface and the sides thereof) are preferably disposed in the respective nMIS regions 1A and 1B, and the pMIS regions 1C and 1D (that is, the material film 5 does not remain at the surface of the gate structure). The semiconductor substrate 1 is more preferably exposed in regions where the source and drain regions SD1, SD2, SD3, and SD4 are to be formed later (such that the material film 5 does not remain in the above regions). The gate structures exposed in step S9c (the structure including the gate insulating film GI1 and the gate electrode GE1, the structure including the gate insulating film GI2 and the gate electrode GE2, the structure including the gate insulating film GI3 and the gate electrode GE3, and the structure including the gate insulating film GI4 and the gate electrode GE4) correspond to the gate structures directly before forming the material film 5 in step S5c. Thus, when an oxide film (for example, a natural oxide film) is formed over the surface of each of the gate electrodes (GE1, GE2, GE3, and GE4) directly before the formation of the material film in step S5a, the oxide film or the like can be contained in the gate structure. Like the process after the above step S9a, another cleaning process (wet cleaning process) can also be performed on the semiconductor substrate 1 after removing the material film 5 in step S9c.

Figure 21:
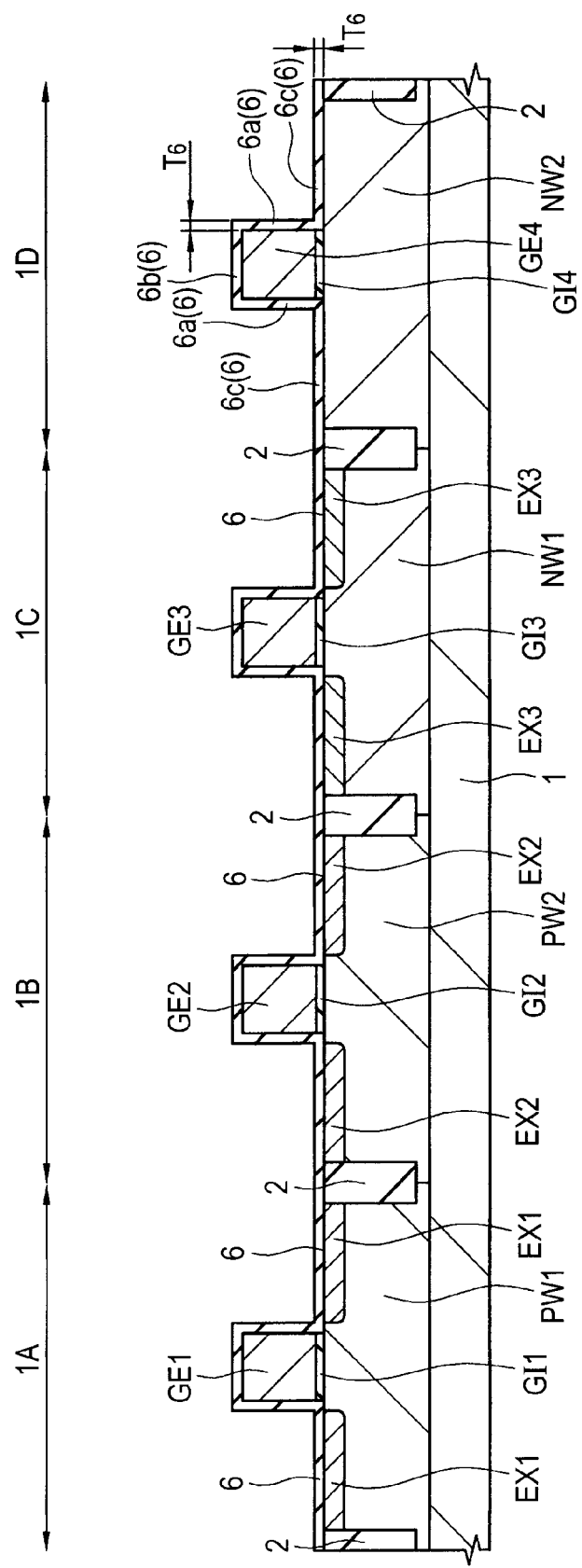
FIG. 21 is a cross-sectional view of a main part of another manufacturing step of the semiconductor device, following the step shown in FIG. 20.

Then, as shown in FIG. 21, a material film 6 for the offset spacer is formed (deposited) over the main surface (entire main surface) of the semiconductor substrate 1 so as to cover the gate structures (gate electrodes GE1, GE2, GE3, and GE4) in the nMIS regions 1A and 1B and pMIS regions 1C and 1D (in step S5d shown in FIG. 1). In the nMIS regions 1A and 1B, and the pMIS regions 1C and 1D, the material film 6 is formed over the upper surfaces and side walls of the gate structures (gate electrodes GE1, GE2, GE3, and GE4) and over the parts of the semiconductor substrate 1 (p-type wells PW1 and PW2, and n-type wells NW1 and NW2) not covered with the gate structures (gate electrodes GE1, GE2, GE3, and GE4). Suitable materials and formation methods of the material film 6 are basically the same as those of the above material film 3, and thus a repeated description thereof will be omitted below. The thickness (depth) $T_6$ of the formed material film 6 can be, for example, in a range of about 2 to 5 nm so as to serve as the offset spacer of the ion implantation IM4 to be performed later.

Parts of the material film 6 formed at both sidewalls of the gate structure (gate electrode GE4) in the pMIS region 1D each are referred to as a "material film 6a" indicated by reference numeral 6a. A part of the material film 6 formed over an upper surface of the gate structure (gate electrode GE4) is referred to as a "material film 6b" indicated by reference numeral 6b. Other parts of the material film 6 formed over the n-type well NW2 are referred to as a "material film 6c" indicated by reference numeral 6c. The thickness of the material film 6c in the direction substantially perpendicular to the main surface of the semiconductor substrate 1 almost corresponds to the above thickness $T_6$. The thickness of the material film 6b in the direction substantially perpendicular to the main surface of the semiconductor substrate 1 almost corresponds to the above thickness $T_6$. The thickness of the material film 6a in the direction substantially parallel to the main surface of the semiconductor substrate 1 almost corresponds to the above thickness $T_6$.

Figure 22:
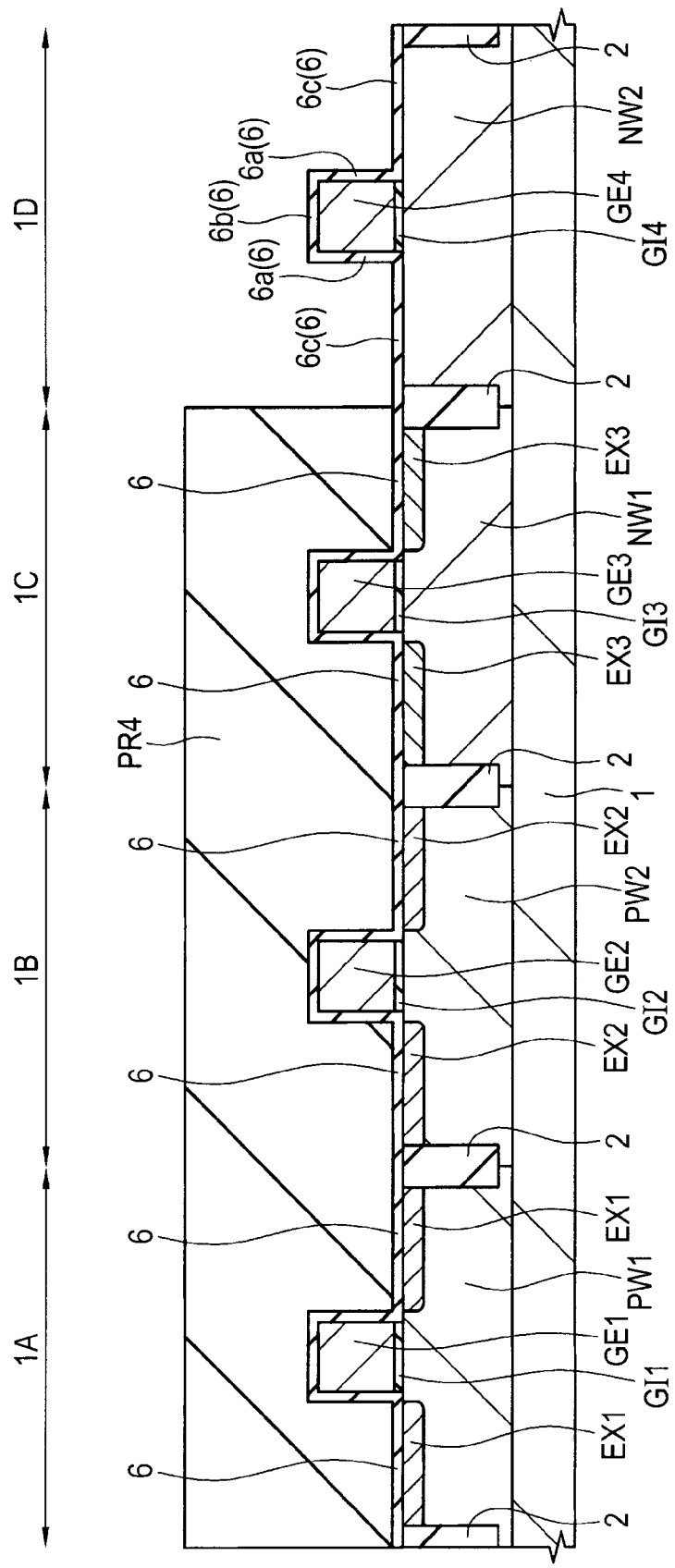
FIG. 22 is a cross-sectional view of a main part of another manufacturing step of the semiconductor device, following the step shown in FIG. 21.

Then, a photoresist film is applied to the main surface of the semiconductor substrate 1, that is, to the material film 6, and is then exposed and developed, so that as shown in FIG. 22, a photoresist pattern (resist patter, or mask layer) PR4 is formed as a mask layer (in step S6d shown in FIG. 2).

The photoresist pattern PR4 is formed in the nMIS region 1A, the nMIS region 1B, and the pMIS region 1C, but not formed in the pMIS region 1D. Thus, the material film 6 in the nMIS regions 1A and 1B and the pMIS region 1C is covered with the photoresist pattern PR4, but the material film 6 in the pMIS region 1D is not covered with the photoresist pattern PR4 and exposed to the outside.

Figure 23:
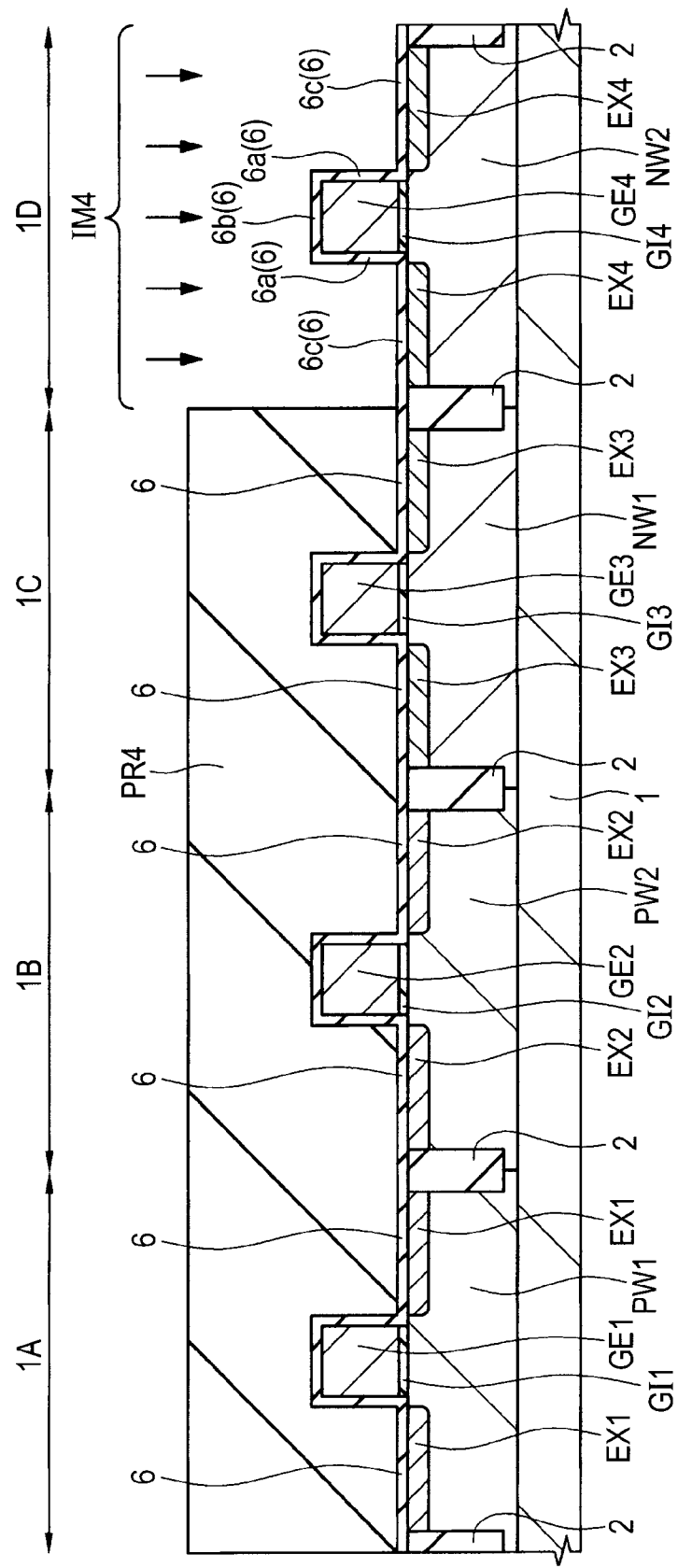
FIG. 23 is a cross-sectional view of a main part of another manufacturing step of the semiconductor device, following the step shown in FIG. 22.

Then, as shown in FIG. 23, ion implantation IM4 is performed into the semiconductor substrate 1 (in step S7d shown in FIG. 2). In the ion implantation IM4, p-type impurities, such as boron (B), are introduced (ion-implanted) into the semiconductor substrate 1. That is, the ion implantation IM4 differs from the above ion implantations IM1 and IM2 in kind of ions to be implanted. That is, the ion implantation IM4 differs from the above ion implantations IM1 and IM2 in type of the impurities (also in dose amount, implantation energy, or the like). The ion implantation IM4 differs from the above ion implantation IM3 in conditions for ion implantation, for example, in amount of dose or implantation energy (also in type of impurities implanted).

The photoresist pattern PR4 serves as an ion implantation blocking mask in the ion implantation IM4. No impurities are introduced (ion-implanted) into the nMIS regions 1A and 1B and the pMIS region 1C of the semiconductor substrate 1 (p-type wells PW1 and PW2 and n-type well NW1) and the gate electrodes GE1, GE2, and GE3 in the ion implantation IM4, which are covered with the photoresist pattern PR4.

In contrast, since the pMIS region 1D is not covered with the photoresist pattern PR4 in the ion implantation IM4, the ion implantation can be performed on the pMIS region 1D of the semiconductor substrate 1 (n-type well NW2), while the gate structure (gate electrode GE4) in the pMIS region 1D, and the material film 6a located over the gate structure (gate electrode GE4) of the pMIS region 1D, and the sidewalls of the gate structure (gate electrode GE4) can serve as the ion implantation blocking mask. That is, the material films 6a over the sidewalls of the gate structure (gate electrode GE4) in the pMIS region 1D serve as the offset spacer. Thus, no impurities are introduced (ion-implanted) into a region directly under the gate electrode GE4 in the n-type well NW2, and into a region directly under the material film 6a at the sidewall of the gate electrode GE4 in the ion implantation IM4. The thickness (depth) $T_6$ of the formed material film 6 allows impurity ions to pass therethrough by the ion implantation IM4 with an ion implantation energy (acceleration energy). The impurity ions implanted by the ion implantation IM4 pass through the material film 6c over the n-type well NW2 to be introduced (implanted) into the n-type well NW2 (an upper layer part thereof) positioned under the material film 6c. In the ion implantation IM4, the impurity ions implanted can also pass through the material film 6b over the gate electrode GE4 to be implanted into the gate electrode GE4.

In the ion implantation IM4, p-type impurities, such as boron (B), are introduced (ion-implanted) into both side regions of the gate electrode GE4 of the semiconductor substrate 1 (n-type well NW2) to thereby form extension regions (source and drain extension regions, p⁻-type semiconductor regions, or p-type impurity diffusion layers) EX4. The extension region EX4 is a p-type semiconductor region, and has a lower concentration of impurities than that of the p⁺-type source/drain region SD4 to be formed later. The depth (junction depth) of the extension region EX4 is shallower than the depth (junction depth) of the p⁺-source/drain region SD4 to be formed later.

The extension region EX4 is formed by introducing (ion-implanting) impurities into the n-type well NW2 (an upper layer part thereof) through the material film 6c. Thus, the extension region EX4 is formed in alignment (self-alignment) with the side of the material film 6a on each sidewall of the gate electrode GE4 (surface opposite to the side in contact with the gate electrode GE4).

The ion implantation IM4 for forming the extension region EX4 is not the oblique ion implantation, but preferably the ion implantation performed in the direction perpendicular to the main surface of the semiconductor substrate 1.

Before or after the ion implantation IM4 (with the material film 6 and the photoresist pattern PR4 formed), another ion implantation, for example, halo ion implantation can be performed on the semiconductor substrate 1. The halo ion implantation is performed to form a halo region (n-type semiconductor region) in the p-MIS region 1D of the semiconductor substrate 1 (n-type well NW2). The halo region is formed within the n-type well NW2 so as to enclose (cover) the extension region EX4. The halo region is the n-type semiconductor region (n-type impurity diffusion region) having a higher concentration of impurities than that of the n-type well NW2. The halo ion implantation is performed by ion-implanting n-type impurities, such as phosphorus (P) or arsenic (As), (which are impurities of an opposed type to that of impurities implanted in the ion implantation IM4). The inclined implantation (oblique ion implantation) is more preferably performed. In the halo ion implantation, no impurities are introduced (ion-implanted) into the nMIS regions 1A and 1B and the pMIS region 1C of the semiconductor substrate 1 (p-type wells PW1 and PW2 and n-type well NW1), and the gate electrodes GE1, GE2, and GE3, which are covered with the photoresist pattern PR4. The formation of the halo region can be omitted when not needed (that is, the halo ion implantation will be omitted).

Figure 24:
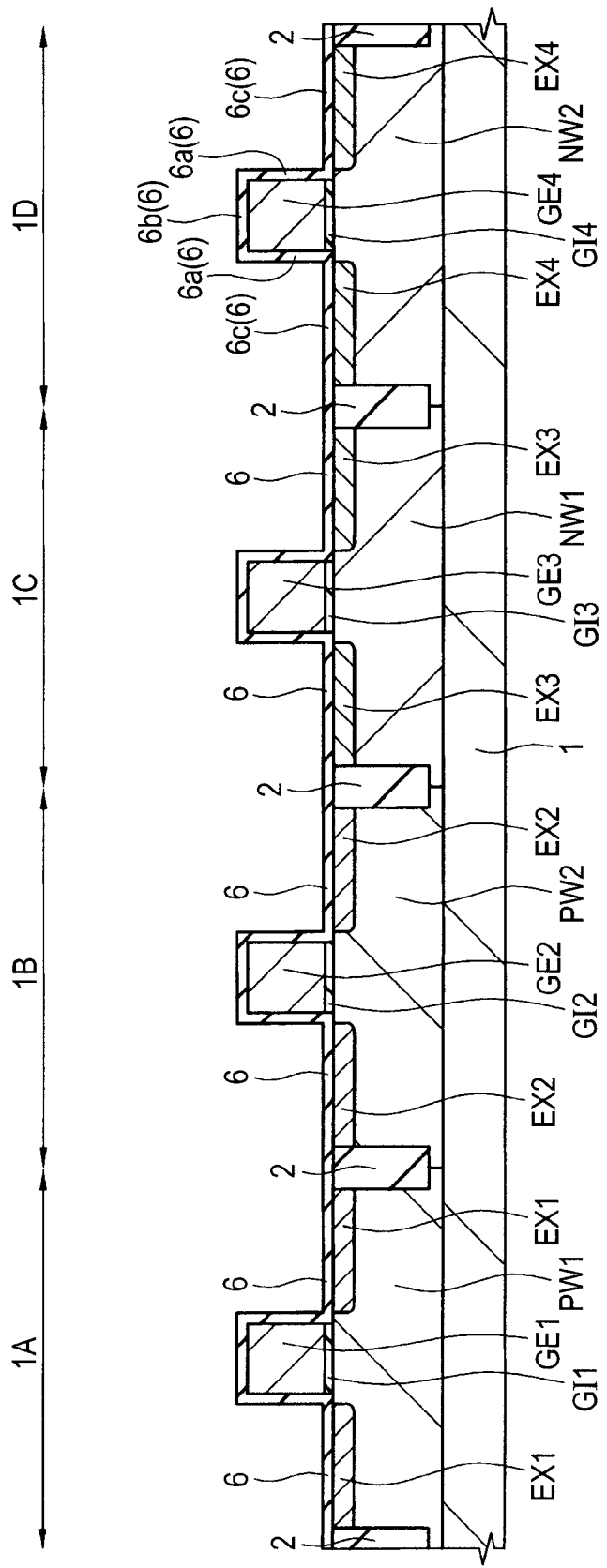
FIG. 24 is a cross-sectional view of a main part of another manufacturing step of the semiconductor device, following the step shown in FIG. 23.

Then, as shown in FIG. 24, the photoresist pattern PR4 is removed (in step S8d shown in FIG. 2). The photoresist pattern PR4 can be removed by the ashing. In another embodiment, the photoresist pattern PR4 can be removed by a wet process.

Figure 25:
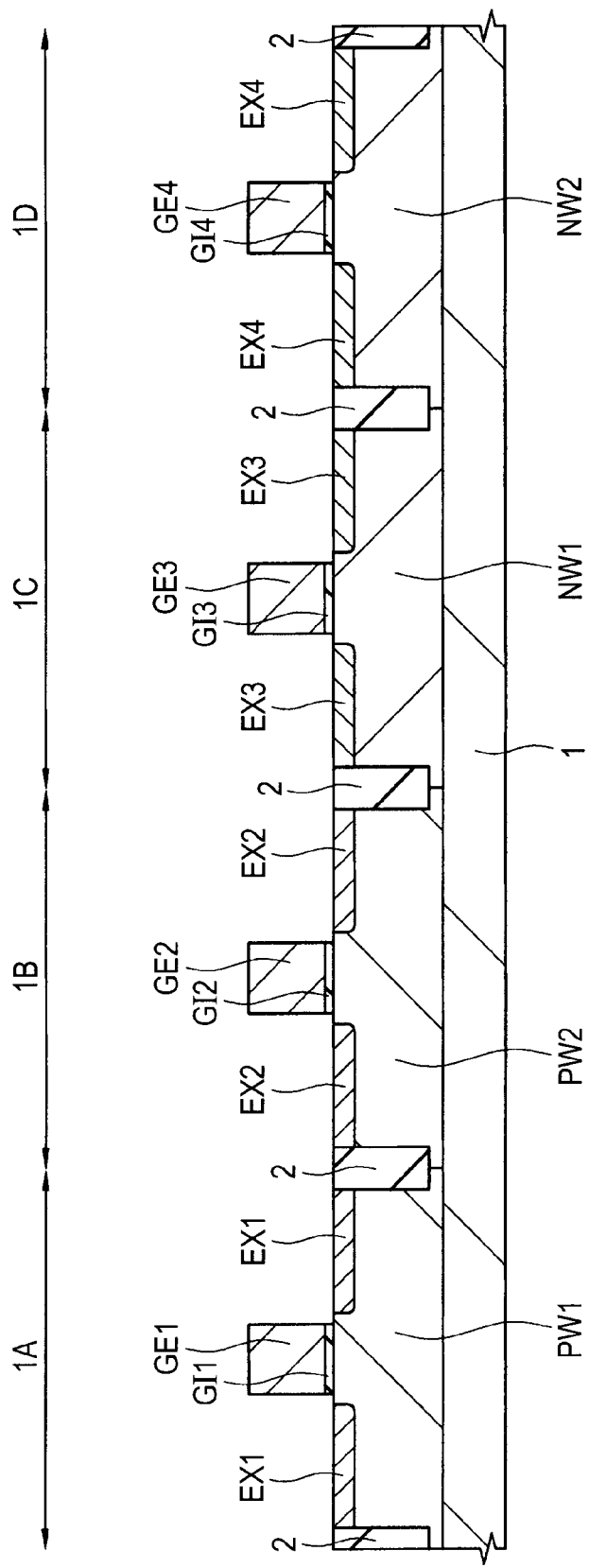
FIG. 25 is a cross-sectional view of a main part of another manufacturing step of the semiconductor device, following the step shown in FIG. 24.

Then, as shown in FIG. 25, the material film 6 is removed (in step S9d shown in FIG. 2). The material film 6 can be removed by a wet process using a chemical (wet etching, or diffusion process using a chemical). The removal process of the material film 6 in step S9d is basically the same as that of the material film 3 in the above step S9a.

In step S9d, the respective gate structures are exposed from the nMIS regions 1A and 1B, and the pMIS regions 1C and 1D by removing the material film 6. At this time, the entire gate structure (entire upper surface and sidewalls thereof) is preferably exposed from each of the nMIS regions 1A and 1B and the pMIS regions 1C and 1D (such that the material film 6 is not left at the surface of the gate structure). Further, regions of the semiconductor substrate 1 where the source and drain regions SD1, SD2, SD3, and SD4 are to be formed later are preferably exposed (such that the material film 6 is not left at the regions where the source and drain regions are to be formed). The gate structures exposed in step S9d (that is, the structure including the gate insulating film GI1 and the gate electrode GE1, the structure including the gate insulating film GI2 and the gate electrode GE2, the structure including the gate insulating film GI3 and the gate electrode GE3, and the structure including the gate insulating film GI4 and the gate electrode GE4) correspond to the gate structures directly before the formation of the material film 6 in step S5d. When an oxide film (for example, natural oxide film) or the like is formed over the gate electrodes (GE1, GE2, GE3, and GE4) directly before the formation of the material film 6 in step S5d, the oxide film can be included in the gate structures. Like the process after the above step S9a, another cleaning process (wet cleaning process) can also be performed on the semiconductor substrate 1 after removing the material film 6 in step S9d.

In this embodiment, the use of the offset spacer film (material films 3, 4, 5, and 6) can cause the starting points for diffusing the impurities in the ion implantations IM1, IM2, IM 3, and IM4 to be spaced apart from the sidewalls of the gate electrodes GE1, GE2, GE3, and GE4 by the thickness of the offset spacer film (material film 3, 4, 5, and 6). This arrangement can reduce the leaks between the source and drain to improve the short channel characteristics. Every time the photoresist pattern (PR1, PR2, PR3, PR4) is formed again (removed and re-created), the film (material film 3, 4, 5, 6) for the offset spacer is formed again (removed and re-deposited), so that the ion implantations IM1, IM2, IM3, and IM4 can be performed using the material films 3, 4, 5, and 6 having the thickness appropriate for the offset spacer. Thus, the MISFETs respectively formed in the nMIS region 1A, the nMIS region 1B, the pMIS region 1C, and the pMIS region 1D can be stabilized to thereby improve the performance of the semiconductor device. When the films (material films 3, 4, 5, and 6) for the offset spacer are removed with the chemical, the resist residues and implantation species remaining on the films (material films 3, 4, 5, and 6) for the offset spacer can be easily removed after the removing the photoresist patterns (PR1, PR2, PR3, and PR4). The yield of the semiconductor device is improved, and thus the characteristics of the MISFET can be effectively stabilized (additionally, the performance of the semiconductor device can be improved).

Figure 26:
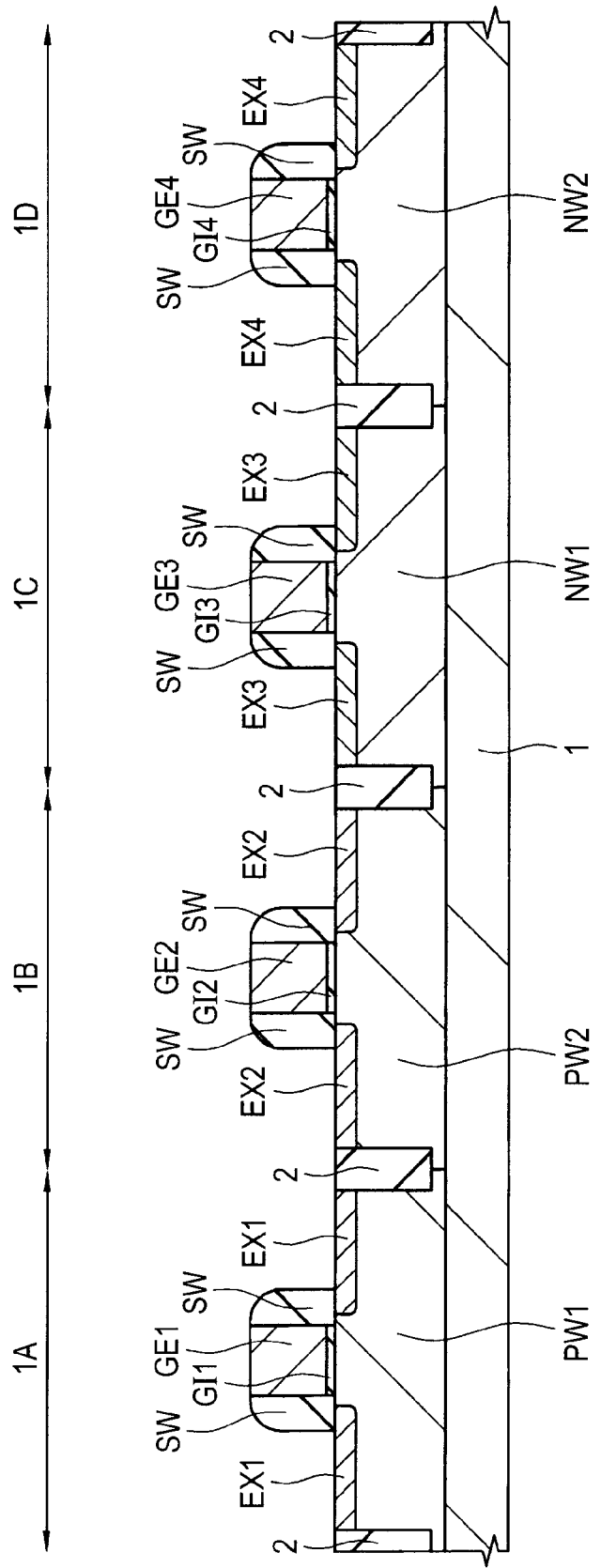
FIG. 26 is a cross-sectional view of a main part of another manufacturing step of the semiconductor device, following the step shown in FIG. 25.

As shown in FIG. 26, a sidewall spacer (sidewall spacer, sidewall insulating film, or sidewall) SW is formed over the sidewall of each of the gate structures (gate electrodes GE1, GE2, GE3 and GE4) in the nMIS regions 1A and 1B and the pMIS regions 1C and 1D (in step S10 shown in FIG. 2).

The sidewall spacer SW can be formed, for example, as follows. First, an insulating film (insulating film for the sidewall spacer SW) is formed over the main surface (entire main surface) of the semiconductor substrate 1 so as to cover the gate structures (gate electrodes GE1, GE2, GE3, and GE4). Then, the insulating film (insulating film for the sidewall spacer SW) is etched (etched back) by a reactive ion etching method (RIE) or the like. Thus, the insulating film (insulating film for the sidewall spacer SW) remains at the sidewalls of the gate structures (gate electrodes GE1, GE2, GE3, and GE4), and the insulating films (insulating films for the sidewall spacers SW) in other regions (over the gate structure and over the parts of the semiconductor substrate 1 not covered with the gate structures) are removed. In this way, the sidewall spacers SW comprised of the insulating film (insulating film for the sidewall spacer SW) remaining at the sidewalls of each of the gate structures (gate electrodes GE1, GE2, GE3, and GE4) are formed. The insulating film for the sidewall spacer SW can be formed using, for example, a silicon nitride film, a silicon oxide film, or a laminated film thereof, by the CVD method or the like. The formed insulating film can have a thickness (depth) of, for example, 20 to 25 nm, which is thicker than that of each of the above formed material films 3, 4, 5, and 6.

Figure 27:
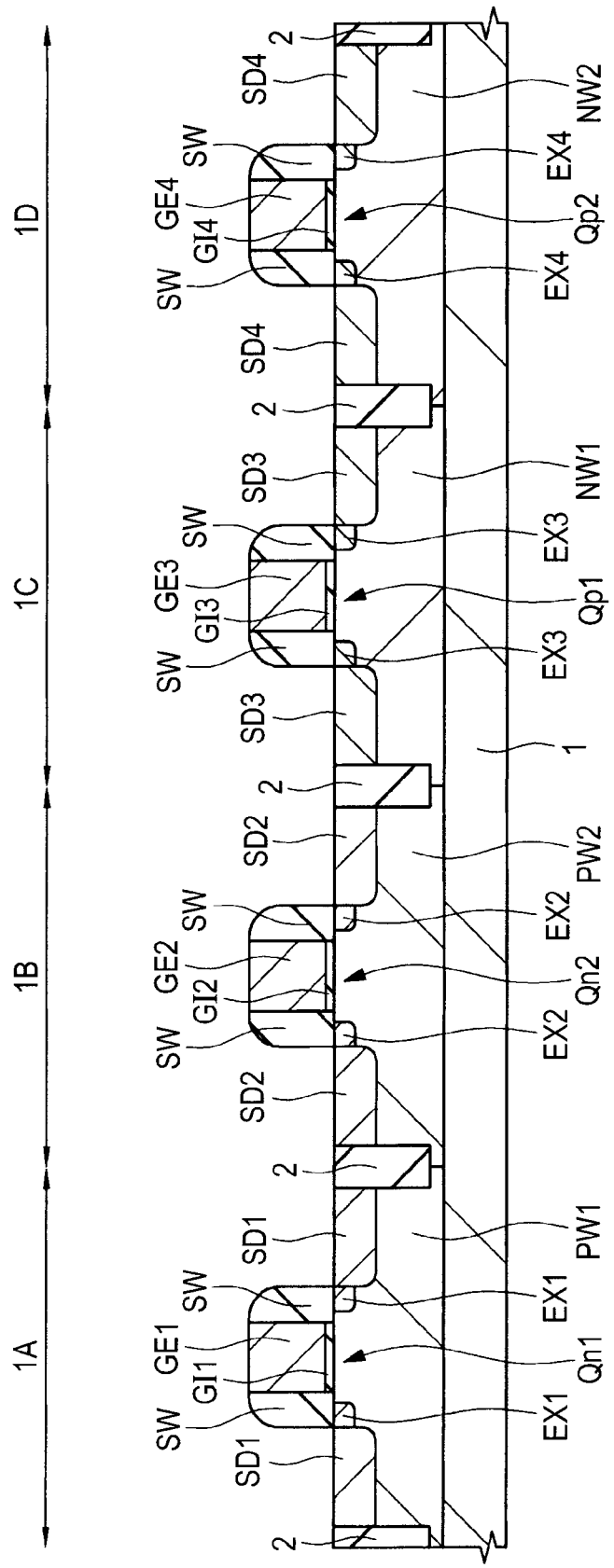
FIG. 27 is a cross-sectional view of a main part of another manufacturing step of the semiconductor device, following the step shown in FIG. 26.

After forming the sidewall spacers SW in step S10, as shown in FIG. 27, source and drain regions SD1 and SD2 which are n$^+$-type semiconductor regions (n-type impurity diffusion layers), and source and drain regions SD3 and SD4 which are p$^+$-type semiconductor regions (p-type impurity diffusion layers) are formed (in step S11 shown in FIG. 2).

The source and drain regions SD1 are formed on both side regions of the gate electrode GE1 of the semiconductor substrate 1 (p-type well PW1) and the sidewall spacers SW (sidewall spacers SW at sidewalls of the gate electrode GE1) in the nMIS region 1A by ion-implanting n-type impurities, such as arsenic, (As) or phosphorus (P). The source and drain regions SD2 are formed in both side regions of the gate electrode GE2 of the semiconductor substrate 1 (p-type well PW2) and the sidewall spacers SW (sidewall spacers SW at sidewalls of the gate electrode GE2) in the nMIS region 1B by ion-implanting n-type impurities, such as arsenic (As) or phosphorus (P). The source and drain regions SD3 are formed in both side regions of the gate electrode GE3 of the semiconductor substrate 1 (n-type well NW1) and the sidewall spacers SW (sidewall spacers SW at sidewalls of the gate electrode GE3) in the pMIS region 1C by ion-implanting p-type, impurities, such as boron (B). The source and drain regions SD4 are formed in both side regions of the gate electrode GE4 of the semiconductor substrate 1 (n-type well NW2) and the sidewall spacers SW (sidewall spacers SW at sidewalls of the gate electrode GE4) in the pMIS region 1D by ion-implanting p-type impurities, such as boron (B).

Upon ion-implanting for forming the source and drain regions SD1, the gate electrode GE1 and the sidewall spacers SW at the sidewalls thereof can serve as a mask (ion implantation blocking mask). Thus, the source and drain regions SD1 are formed in alignment (self-alignment) with (sidewalls) of the sidewall spacers SW at the sidewalls of the gate electrode GE1. No impurities are introduced (ion-implanted) into regions directly under the gate electrode GE1 and the sidewall spacer SW. Upon ion-implanting for forming the source and drain regions SD1, n-type impurities can also be ion-implanted into the gate electrode GE1.

The source and drain regions SD1 and the extension regions EX1 formed in the nMIS region 1A are of the same conduction type. Each of the source and drain regions SD1 has a higher concentration of impurities (n-type impurities) than that of the extension region EX1. The depth (junction depth) of the source and drain region SD1 is more than the depth (junction depth) of the extension region EX1. In this way, the n-type semiconductor regions (impurity diffusion layers) serving as a source or drain of the n-channel MISFETQn1 include the source and drain region SD1 and the extension regions EX1. That is, the extension region EX1 and the source and drain regions SD1 having a higher concentration of impurities than that of the extension region serve as the semiconductor region (n-type semiconductor region) for the source or drain of n-channel MISFETQn1. Thus, the source and drain regions in the n-channel MISFETQn1 has a lightly doped drain (LDD) structure.

Upon ion-implanting for forming the source and drain regions SD2, the gate electrode GE2 and the sidewall spacers SW at the sidewalls can serve as a mask (ion implantation blocking mask). Thus, the source and drain regions SD2 are formed in alignment (self-alignment) with the sidewall spacers SW (sidewalls) at the sidewalls of the gate electrode GE2. No impurities are introduced (ion-implanted) into regions directly under the gate electrode GE2 and the sidewall spacers SW. Upon the ion implantation for forming the source and drain regions SD2, n-type impurities can also be ion-implanted into the gate electrode GE2.

The source and drain regions SD2 and the extension regions EX2 formed in the nMIS region 1B are of the same conduction type. Each of the source and drain region SD2 has a higher concentration of impurities (n-type impurities) than that of the extension region EX2. The depth (junction depth) of the source and drain region SD2 is more than the depth (junction depth) of the extension region EX2. In this way, the n-type semiconductor regions (impurity diffusion layers) serving as a source or drain of the n-channel MISFETQn2 include the source and drain region SD2 and the extension regions EX2. That is, the extension region EX2 and the source and drain regions SD2 having a higher concentration of impurities than that of the extension region serve as the semiconductor region (n-type semiconductor region) for the source or drain of the n-channel MISFETQn2. Thus, the source region and the drain region of the n-channel MISFEDTQn2 include the LDD structure.

Upon ion-implanting for forming the source and drain regions SD3, the gate electrode GE3 and the sidewall spacers SW at the sidewalls thereof can serve as a mask (ion implantation inhibiting mask). Thus, the source and drain regions SD3 are formed in alignment (self-alignment) with the sidewall spacers SW (sidewalls) at the sidewalls of the gate electrode GE3. No impurities are introduced (ion-implanted) into regions directly under the gate electrode GE3 and the sidewall spacer SW. Upon ion-implanting for forming the source and drain regions SD3, n-type impurities can also be ion-implanted into the gate electrode GE3.

The source and drain regions SD3 and the extension regions EX3 formed in the pMIS region 1C are of the same conduction type. Each of the source and drain region SD3 has a higher concentration of impurities (p-type impurities) than that of the extension region EX3. The depth (junction depth) of the source and drain region SD3 is more than the depth (junction depth) of the extension region EX3. In this way, the p-type semiconductor regions (impurity diffusion layers) serving as a source or drain of the p-channel MISFETQp1 include the source and drain region SD3 and the extension regions EX3. That is, the extension region EX3 and the source and drain regions SD3 having a higher concentration of impurities than that of the extension region serve as the semiconductor region (p-type semiconductor region) for the source or drain of the p-channel MISFETQp1. Thus, the source region and the drain region of the p-channel MISFEDTQp1 include the LDD structure.

Upon ion-implanting for forming the source and drain regions SD4, the gate electrode GE4 and the sidewall spacers SW at the sidewalls thereof can serve as a mask (ion implantation blocking mask). Thus, the source and drain regions SD4 are formed in alignment (self-alignment) with the sidewall spacers SW (sidewalls) at the sidewalls of the gate electrode GE4. No impurities are introduced (ion-implanted) into regions directly under the gate electrode GE4 and the sidewall spacer SW. Upon ion-implanting for forming the source and drain regions SD4, n-type impurities can also be ion-implanted into the gate electrode GE4.

The source and drain regions SD4 and the extension regions
EX4 formed in the pMIS region 1D are of the same conduction type. Each of the source and drain region SD4 has a higher concentration of impurities (p-type impurities) than that of the extension region EX4. The depth (junction depth) of the source and drain region SD4 is more than the depth (junction depth) of the extension region EX4. In this way, the p-type semiconductor regions (impurity diffusion layers) serving as a source or drain of the p-channel MISFETQp2 include the source and drain region SD4 and the extension regions EX4. That is, the extension region EX4 and the source and drain regions SD4 having a higher concentration of impurities than that of the extension region serve as the semiconductor region (p-type semiconductor region) for the source or drain of the p-channel MISFETQp2. Thus, the source region and the drain region of the p-channel MISFEDTQp2 include the LDD structure.

The source and drain regions SD1, SD2, SD3, and SD4 are formed by the ion implantation. The ion implantation for forming the source and drain regions SD1, the ion implantation for forming the source and drain regions SD2, the ion implantation for forming the source and drain regions SD3, and the ion implantation for forming the source and drain region SD4 can be separately performed (as different processes). In this case, upon ion-implanting for forming the source and drain regions SD1, like the above photoresist pattern PR1, a photoresist pattern is formed to cover the nMIS region 1B and pMIS regions 1C and 1D and to expose the nMIS region 1A, and then the thus-formed photoresist pattern is used as an ion implantation blocking mask. Upon ion-implanting for forming the source and drain regions SD2, like the above photoresist pattern PR2, another photoresist pattern is formed to cover the nMIS region 1A and pMIS regions 1C and 1D and to expose the nMIS region 1B, and then the thus-formed photoresist pattern is used as another ion implantation blocking mask. Upon ion-implanting for forming the source and drain regions SD3, like the above photoresist pattern PR3, another photoresist pattern is formed to cover the nMIS regions 1A and 1B and pMIS region 1D and to expose the pMIS region 1C, and then the thus-formed photoresist pattern is used as another ion implantation blocking mask. Upon ion-implanting for forming the source and drain regions SD4, like the above photoresist pattern PR4, another photoresist pattern is formed to cover, the nMIS regions 1A and 1B and pMIS region 1C and to expose the pMIS region 1D, and then the thus-formed photoresist pattern is used as another ion implantation blocking mask.

In another embodiment, the source and drain regions SD1 and the source and drain regions SD2 for the n-channel MISFET can be formed in the common (same) ion implantation process even when these regions may as well have the same impurity concentration and junction depth thereof to each other. In this case, upon ion-implantation for forming the source and drain regions SD1 and SD2, another photoresist pattern is formed to cover the pMIS regions 1C and 1D and to expose the nMIS regions 1A and 1B, and then the photoresist pattern is used as the ion implantation blocking mask. The source and drain regions SD3 and the source and drain regions SD4 for the p-channel MISFET can be formed in the common (same) ion implantation process even when these regions may as well have the same impurity concentration and junction depth to each other. In this case, upon ion-implantation for forming the source and drain regions SD3 and SD4, another photoresist pattern is formed to cover the nMIS regions 1A and 1B and to expose the pMIS regions 1C and 1D, and then the photoresist pattern is used as the ion implantation blocking mask. The ion implantation for forming the source and drain regions (source and drain regions SD1 and SD2) for the n-channel MISFET, and the ion implantation for forming the source and drain regions (source an drain regions SD3 and SD4) for the p-channel MISFET need to be separately performed (as different processes) because of different conduction of impurities implanted.

Then, annealing (heat treatment) is performed to activate the impurities introduced in the above ion implantation processes (in step S12 shown in FIG. 2). The annealing can be performed, for example, by a flash lamp annealing process at about 1050° C.

In this way, the n-channel MISFETQn1 is formed in the p-type well PW1 of the nMIS region 1A, the n-channel MISFETQn2 is formed in the p-type well PW2 of the nMIS region 1B, the p-channel MISFETQp1 is formed in the n-type well NW1 of the pMIS region 1C, and the p-channel MISFETQp2 is formed in the n-type well NW2 of the pMIS region 1D. Thus, the structure shown in FIG. 27 is obtained. The n-channel MISFETQn1 and Qn2 can be regarded as an n-channel field effect transistor, and the p-channel MISFETQp1 and Qp2 can be regarded as a p-channel field effect transistor.

Then, a metal silicide layer (not shown) having a low resistance is formed of cobalt silicide or nickel silicide at the surfaces (superficial layer part or upper layer part) of the gate electrodes GE1, GE2, GE3, and GE4 and the source and drain regions SD1, SD2, SD3, and SD4 by a self aligned silicide (salicide) technique. The metal silicide layer can be formed by exposing the surface (upper surface) of each of the gate electrodes GE1, GE2, GE3, and GE4 and the source and drain regions SD1, SD2, SD3, and SD4, depositing a metal film, for example, a cobalt (Co) film or a nickel (Ni) film, and applying the heat treatment to the metal film. Then, an unreacted part of the metal film is removed.

Figure 28:
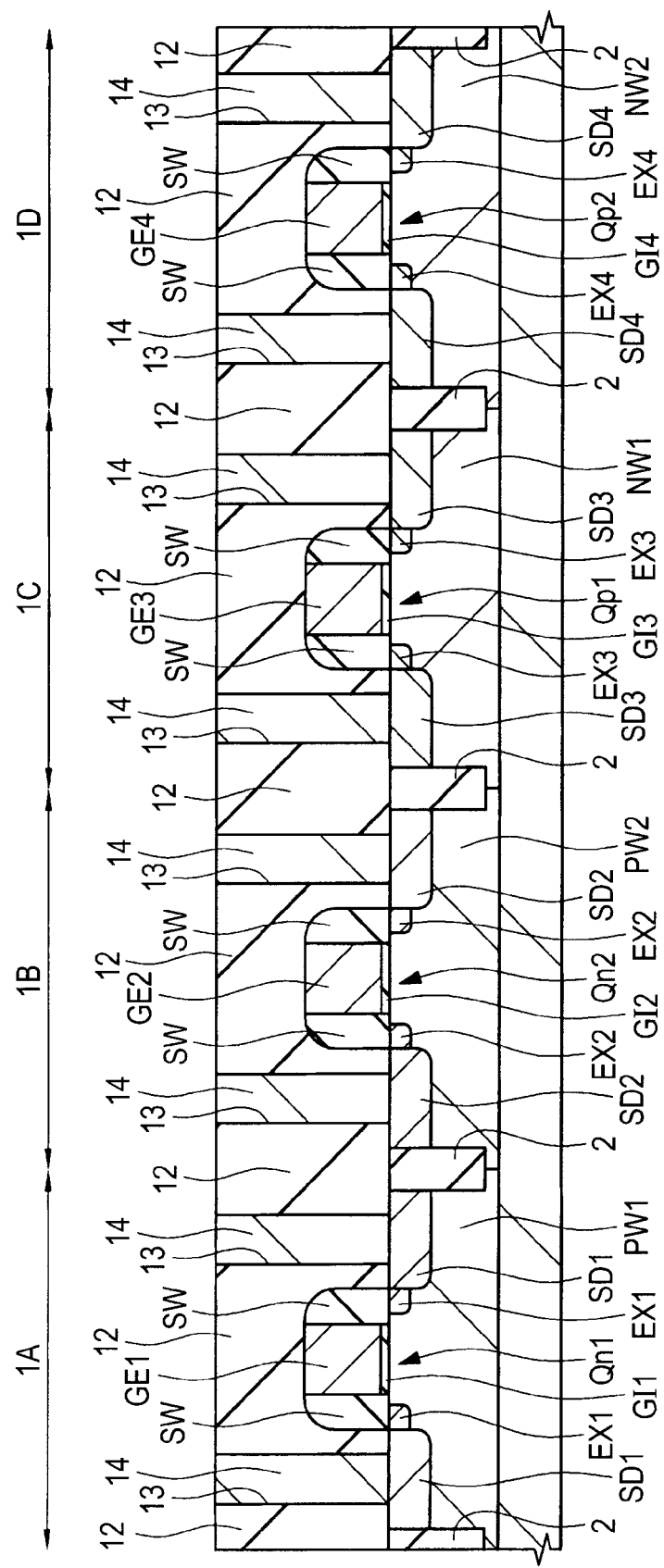
FIG. 28 is a cross-sectional view of a main part of another manufacturing step of the semiconductor device, following the step shown in FIG. 27.

Then, as shown in FIG. 28, an insulating film (interlayer insulating film) 12 is formed over the main surface (entire main surface) of the semiconductor substrate 1. That is, the insulating film 12 is formed over the main surface of the semiconductor substrate 1 so as to cover the gate electrodes GE1, GE2, GE3, and GE4 and the sidewall spacers SW. The insulating film 12 is comprised of, for example, a single film, such as a silicon oxide film, or a laminated film composed of a silicon nitride film and a silicon oxide film which is thicker than the silicon nitride film. Thereafter, the surface (upper surface) of the insulating film 12 is ground by a chemical mechanical polishing (CMP) method, so that the upper surface of the insulating film 12 is flattened. Even when the surface of the insulating film 12 becomes uneven because of an irregular surface of an underlayer, the polishing of the surface of the insulating film 12 by the CMP method can provide an interlayer insulating film whose surface is flattened.

Then, the insulating film 12 is dry-etched using a photoresist pattern (not shown) formed over the insulating film 12 as an etching mask to form contact holes (through holes, or holes) 13 in the insulating film 12. Parts of the main surface of the semiconductor substrate 1 are exposed at the bottoms of the contact holes 13. Specifically, a part of the surface of each of the source and drain regions SD1, SD2, SD3, and SD4 (metal silicide layer when the metal silicide layer is formed over each surface of the regions), and a part of the surface of each of the gate electrodes GE1, GE2, GE3, and GE4 (metal silicide layer when the metal silicide layer is formed over each surface of the electrodes).

Then, a conductive plug 14 (conductor for connection) composed of tungsten (W) is formed in each contact hole 13. The plug 14 is formed by forming a barrier conductive film (for example, a titanium film, a titanium nitride film, or a lamination thereof) over the insulating film 12 located at the inner side (bottom and sidewalls) of each contact hole 13 by a plasma CVD method or the like. Then, a main conductive film is formed of a tungsten film or the like over the barrier conductive film by the CVD method or the like to embed the contact holes 13, and unnecessary parts of the main conductive film and the barrier conductive film over the insulating film 12 are removed by the CMP method or etching back method, whereby the plugs 14 can be formed. For easy understanding of the drawings, the main conductive film and main barrier film of the plug 14 are integrally illustrated. Each plug 14 has its bottom in contact with any one of the gate electrodes GE1, GE2, GE3, and GE4, or any one of the surfaces of the source and drain regions SD1, SD2, SD3, and SD4 (metal silicide layer when the metal silicide layer is formed over each surface of the electrodes or regions), and thus is electrically coupled thereto.

Figure 29:
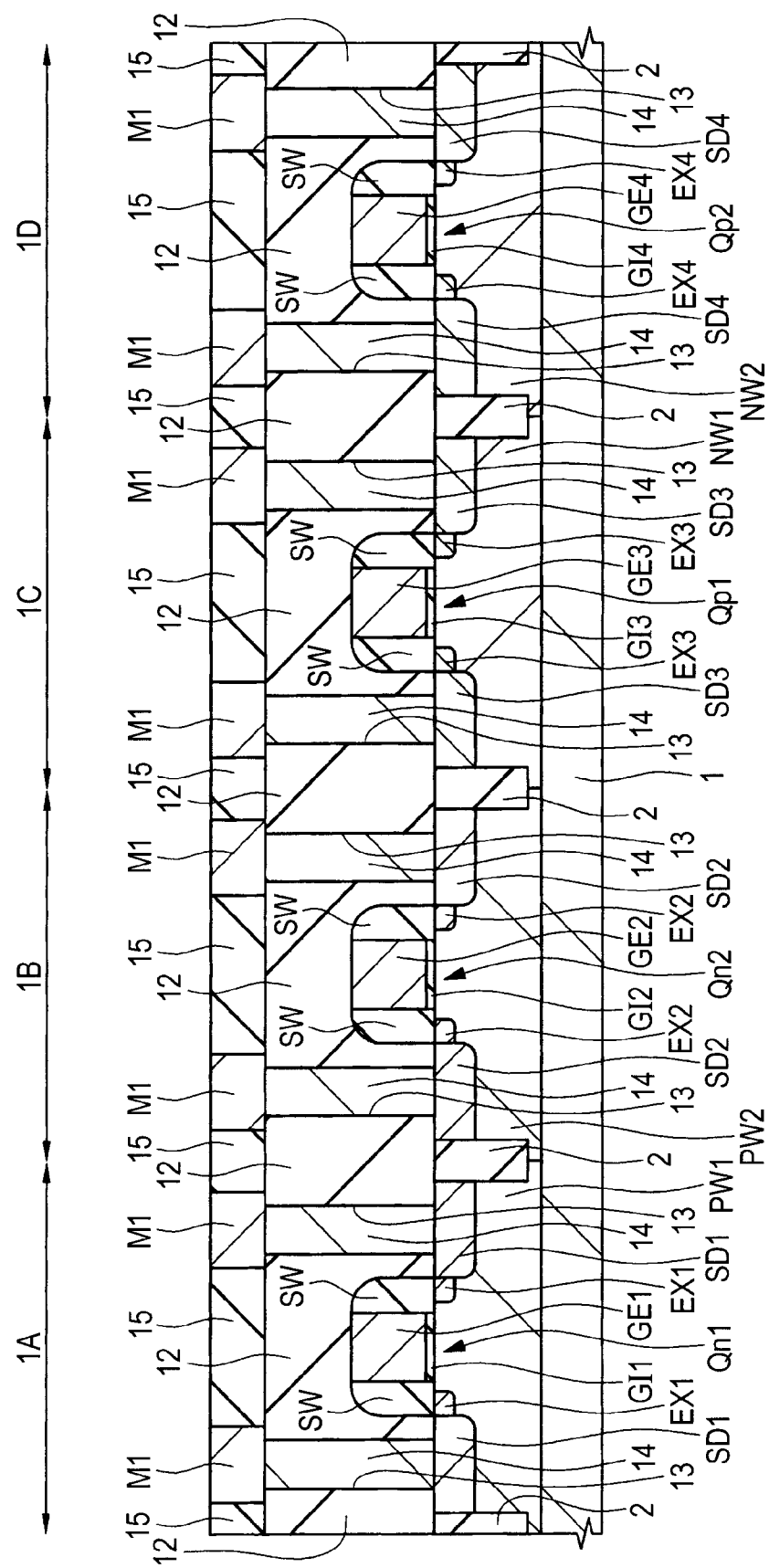
FIG. 29 is a cross-sectional view of a main part of another manufacturing step of the semiconductor device, following the step shown in FIG. 28.

Then, as shown in FIG. 29, an insulating film 15 is formed over the insulating film 12 with the plugs 14 embedded therein. The insulating film 15 can be formed of a lamination of a plurality of insulating films.

Then, a wiring M1 which is the first layer wiring is formed by a single damascene method. Specifically, the wiring M1 can be formed as the follows. First, wiring trenches are formed in predetermined regions of the insulating film 15 by dry etching using a photoresist pattern (not shown) as a mask, and then a barrier conductive film (for example, a titanium nitride film, a tantalum film, or a tantalum nitride film, or the like) is formed over the insulating film 15 containing the bottom and sidewalls of each wiring trench. Subsequently, a copper seed layer is formed over the barrier conductive film by the CVD method or sputtering method. A copper plating film is formed over the seed layer using electrolytic plating or the like to embed the inside of each wiring trench. Then, the main conductive film (copper plating film and seed layer) in regions other than the wiring trenches and the barrier conductive films are removed by the CMP method to thereby form the first layer wiring M1 embedded in the wiring trench and made of copper as a principal conductive material. For simplifying the drawings, the wiring M1 is illustrated in such a manner as to integrally include the barrier conductive film, the seed layer, and the copper plating film.

The wiring M1 is electrically coupled to the gate electrodes GE1, GE2, GE3, and GE4, or the source and drain regions SD1, SD2, SD3, and SD4 via plugs 14. Thereafter, a second layer wiring is formed by a dual damascene method, and the illustration and description thereof will be omitted below.

In the way described above, the semiconductor device of this embodiment is manufactured.

Now, the features of this embodiment will be described in more detail below by comparison with a manufacturing process of a semiconductor device in comparative examples (in the first comparative example and second comparative example).

A manufacturing process of the semiconductor device in the first comparative example will be described below with reference to FIGS. 30 to 34. FIGS. 30 to 34 are cross-sectional views of main parts of the manufacturing process of the semiconductor device in the first comparative example.

Figure 30:
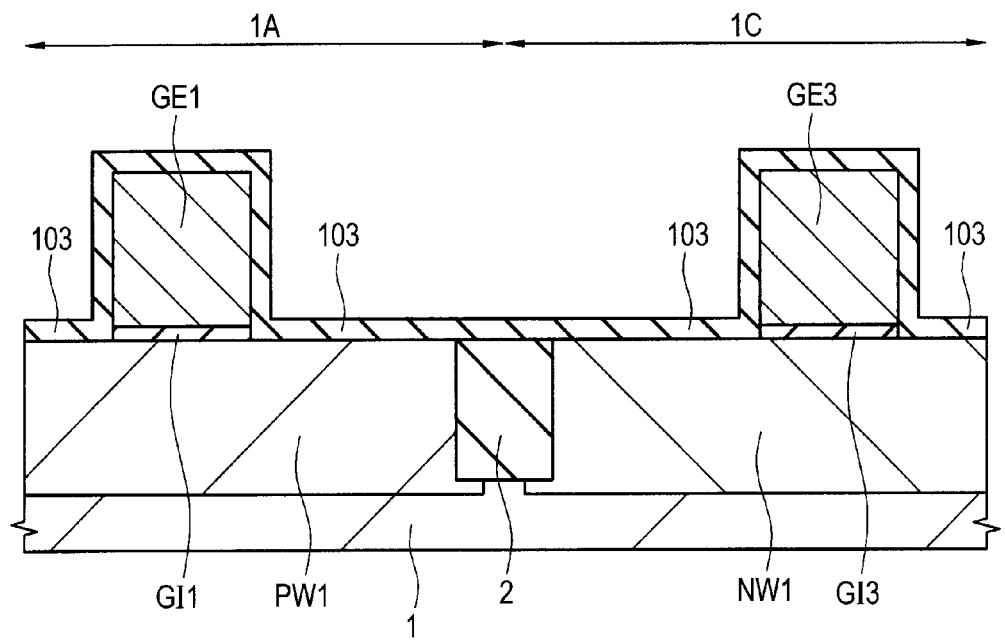
FIG. 30 is a cross-sectional view of a main part of a manufacturing step of a semiconductor device in a first comparative example.

In the manufacturing process of the semiconductor device in the first comparative example, the same steps as the above steps S1 to S4 are performed to obtain the same structure as that shown in FIG. 5. As shown in FIG. 30, an insulating film 103 for the offset spacer is formed over the main surface (entire main surface) of the semiconductor substrate 1 so as to cover the gate electrodes (gate electrodes GE1 and GE3 as shown in FIG. 30). FIGS. 30 to 39 illustrate the nMIS region 1A and the pMIS region 1C among the nMIS regions 1A and 1B and the pMIS regions 1C and 1D shown in FIG. 5.

Figure 31:
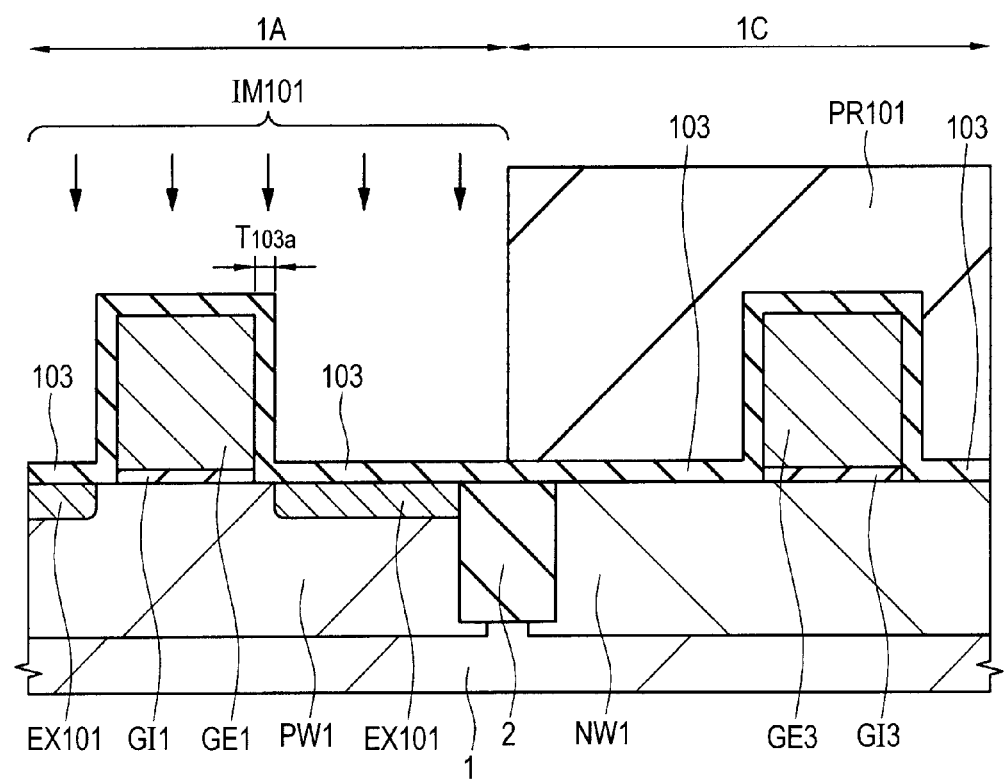
FIG. 31 is a cross-sectional view of a main part of another manufacturing step of the semiconductor device in the first comparative example, following the step shown in FIG. 30.

Then, as shown in FIG. 31, a photoresist pattern PR101 is formed over the main surface of the semiconductor substrate 1, that is, over the insulating film 103. The photoresist pattern PR101 corresponds to the above photoresist pattern PR1, and covers the pMIS region 1C, while exposing the nMIS region 1A.

Then, the ion implantation IM101 of n-type impurities is performed on the semiconductor substrate 1 using the photoresist pattern PR101 as an ion implantation blocking mask, so that the extension region EX101 as the n-type semiconductor region is formed in the p-type well PW1 of the nMIS region 1A. Upon the ion implantation IM101, the gate electrode GE1 and the insulating film 103 located at its sidewalls function as the ion implantation blocking mask. Thus, the extension region EX101 is formed in alignment (self-alignment) with the side (surface opposite to the side in contact with the gate electrode GE1) of the insulating film 103 at each sidewall of the gate electrode GE1. The ion implantation IM101 corresponds to the above ion implantation IM1. The extension region EX101 corresponds to the above extension region EX1.

Figure 32:
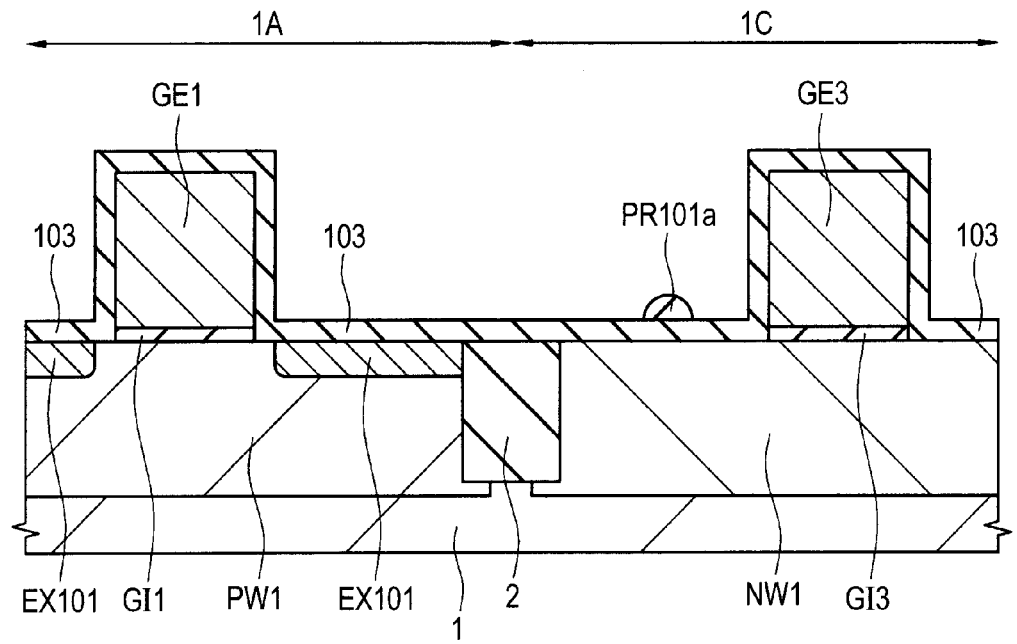
FIG. 32 is a cross-sectional view of a main part of another manufacturing step of the semiconductor device in the first comparative example, following the step shown in FIG. 31.
Figure 33:
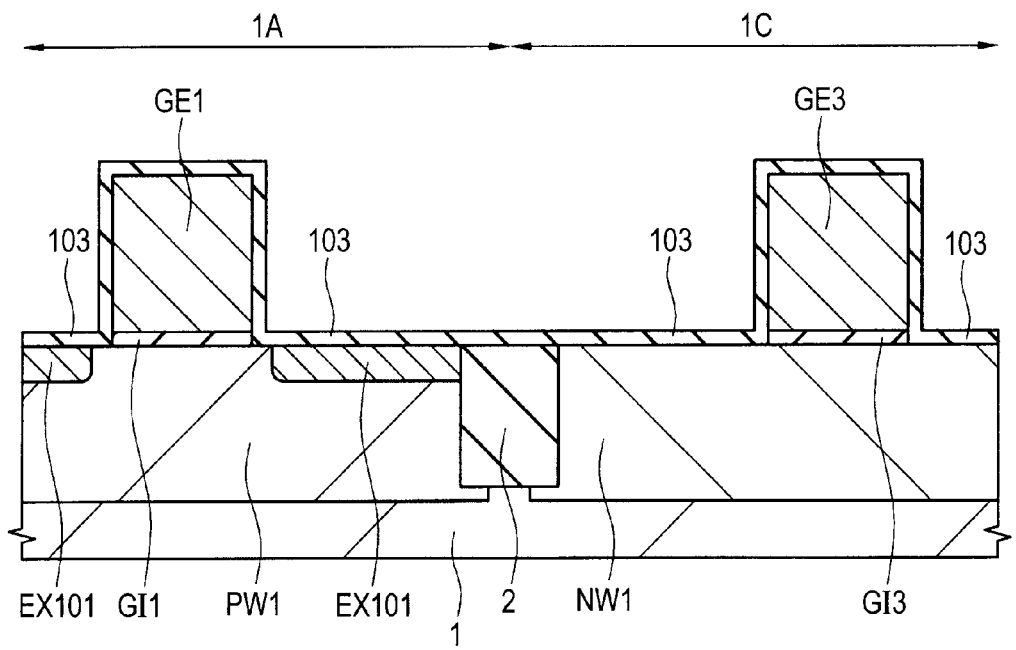
FIG. 33 is a cross-sectional view of a main part of another manufacturing step of the semiconductor device in the first comparative example, following the step shown in FIG. 32.

Then, as shown in FIG. 32, the photoresist pattern PR101 is removed by ashing or the like. At this time, residues (resist residues) PR101a of the photoresist pattern PR101 tend to remain at the insulating film 103. This is because the residues PR101a not removed by the ashing remain along the edge of the photoresist pattern PR101 because the ions are implanted into the photoresist pattern PR101 by the ion implantation IM101 to harden and alter the resist. Thus, as shown in FIG. 33, the cleaning process (wet process) is performed to remove the residues PR101a.

Figure 34:
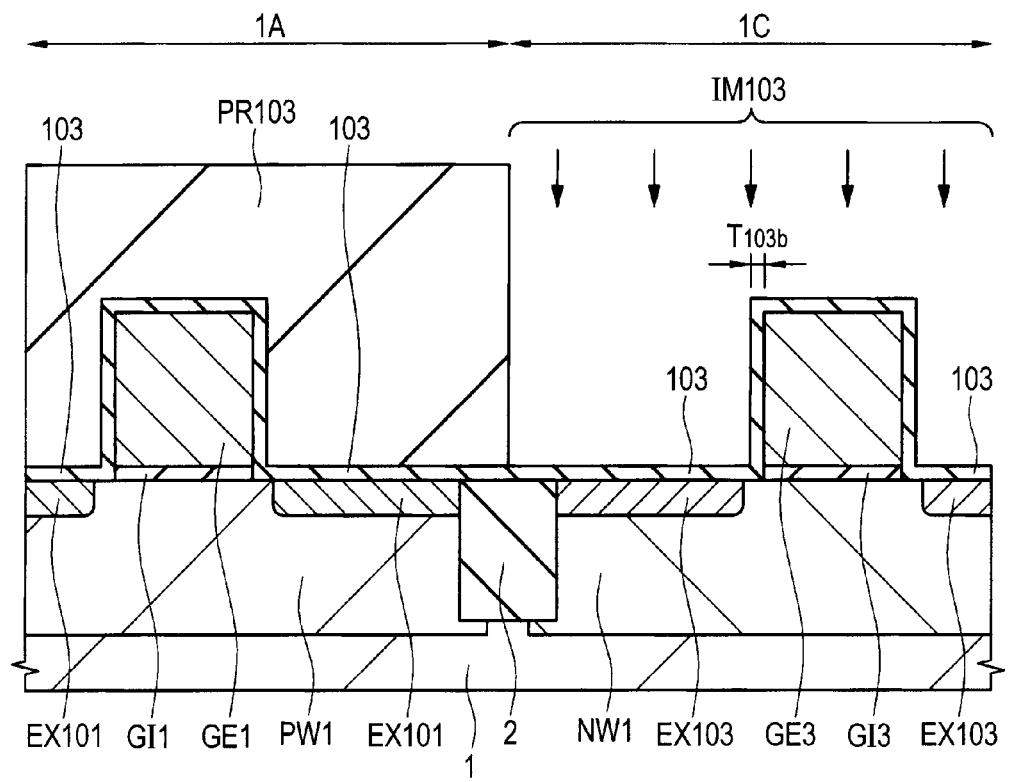
FIG. 34 is a cross-sectional view of a main part of another manufacturing step of the semiconductor device in the first comparative example, following the step shown in FIG. 33.

Then, as shown in FIG. 34, a photoresist pattern PR103 is formed over the main surface of the semiconductor substrate 1, that is, the insulating film 103. The photoresist pattern PR103 corresponds to the above photoresist pattern PR3 to cover the nMIS region 1A and to expose the pMIS region 1C.

Then, the ion implantation IM103 of p-type impurities are performed on the semiconductor substrate 1 using the photoresist pattern PR103 as another ion implantation blocking mask, whereby an extension region EX103 is formed as the p-type semiconductor region in the n-type well NW1 of the pMIS region 1C. Upon the ion implantation IM103, the gate electrode GE3 and the insulating films 103 at its sidewalls function as the ion implantation blocking mask. Thus, the extension region EX103 is formed in alignment (self-alignment) with the side (surface opposite to the side in contact with the gate electrode GE3) of the insulating film 103 at each sidewall of the gate electrode GE3. The ion implantation IM103 corresponds to the above ion implantation IM3, and the extension region EX103 corresponds to the above extension region EX3.

Thereafter, the photoresist pattern PR103 is removed, and thus the illustration and description of the following steps (including the formation step of the above sidewall spacer SW formation step, the formation step of the above source and drain regions SD1, SD2, SD3, and SD4, and the like) will be omitted below.

Next, a manufacturing process of the semiconductor device in the second comparative example will be described below with reference to FIGS. 35 to 39. FIGS. 35 to 39 are cross-sectional views of main parts of the manufacturing steps of the semiconductor device in the second comparative example.

Figure 35:
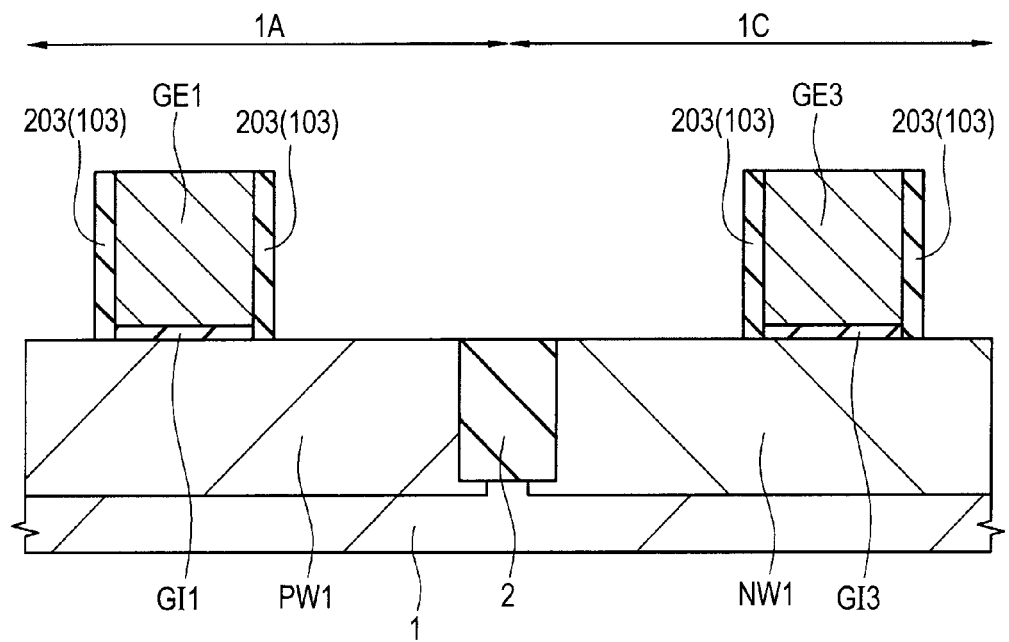
FIG. 35 is a cross-sectional view of a main part of a manufacturing step of a semiconductor device in a second comparative example.

The manufacturing process of the semiconductor device in the second comparative example is the same as that of the semiconductor device in the first comparative example. After forming the insulating film 103 as shown in FIG. 30, the above, insulating film 103 is subjected to the anisotropic etching (etched back) as shown in FIG. 35, whereby a sidewall insulating film 203 is formed by leaving the above insulating film 103 at each sidewall of the gate electrode (gate electrodes GE1 and GE3 in FIG. 30), and the insulating films 103 in other regions are removed. The second comparative example differs from the first comparative example in the following points. In the first comparative example, the insulating film 103 is formed not only over the sidewalls of the gate electrode, but also over the upper surface of the gate electrode and over the part of the main surface of the semiconductor substrate 1 not having the gate electrode formed therein. In contrast, in the second comparative example, a sidewall insulating film 203 is formed only over the sidewall of the gate electrode.

Figure 36:
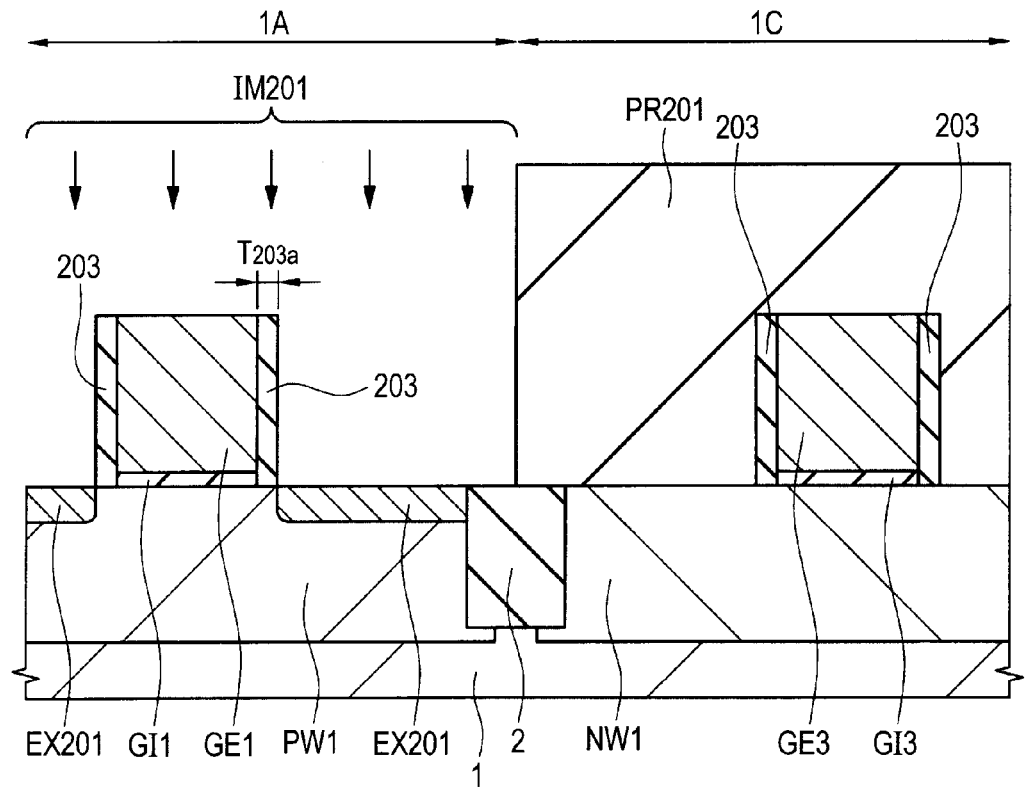
FIG. 36 is a cross-sectional view of a main part of another manufacturing step of the semiconductor device in the second comparative example, following the step shown in FIG. 35.

Then, as shown in FIG. 36, a photoresist pattern PR201 is formed over the main surface of the semiconductor substrate 1. The photoresist pattern PR201 corresponds to the above photoresist patterns PR1 and PR101 to cover the pMIS region 1C and to expose the nMIS region 1A.

Then, the ion implantation IM201 of n-type impurities are performed on the semiconductor substrate 1 using the photoresist pattern PR201 as another ion implantation blocking mask, whereby an extension region EX201 is formed as the n-type semiconductor region in the p-type well PW1 of the nMIS region 1A. Upon the ion implantation IM201, the gate electrode GE1 and the sidewall insulating film 203 at its sidewall function as the ion implantation blocking mask. Thus, the extension region EX201 is formed in alignment (self-alignment) with the side (surface opposite to the side in contact with the gate electrode GE1) of the insulating film 203 at each sidewall of the gate electrode GE1. The ion implantation IM201 corresponds to the above ion implantations IM1 and IM101, and the extension region EX203 corresponds to the above extension regions EX1 and EX101.

Figure 37:
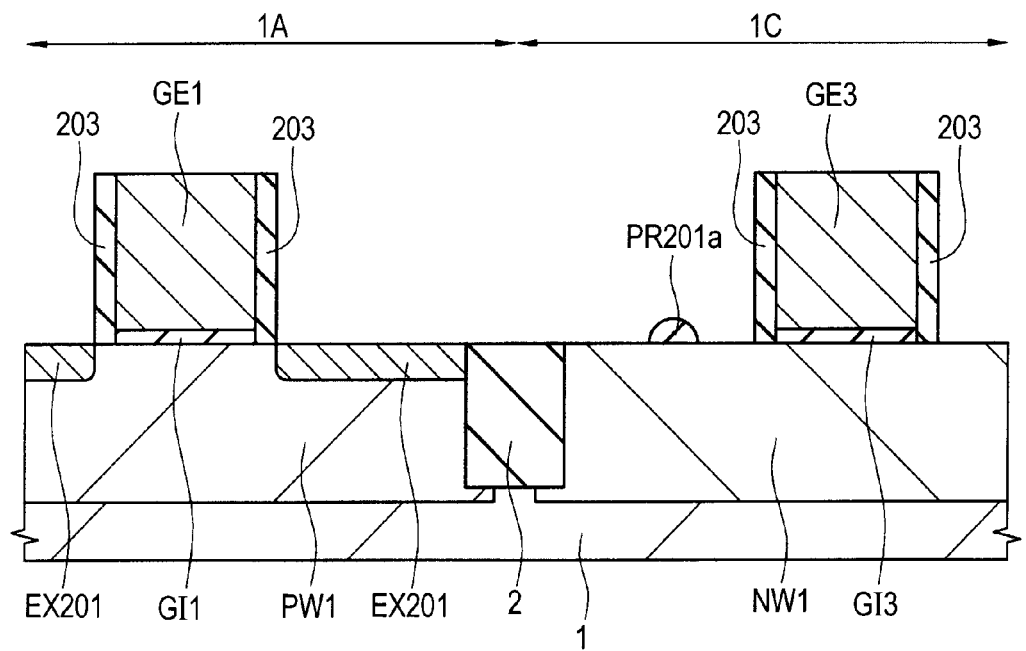
FIG. 37 is a cross-sectional view of a main part of another manufacturing step of the semiconductor device in the second comparative example, following the step shown in FIG. 36.
Figure 38:
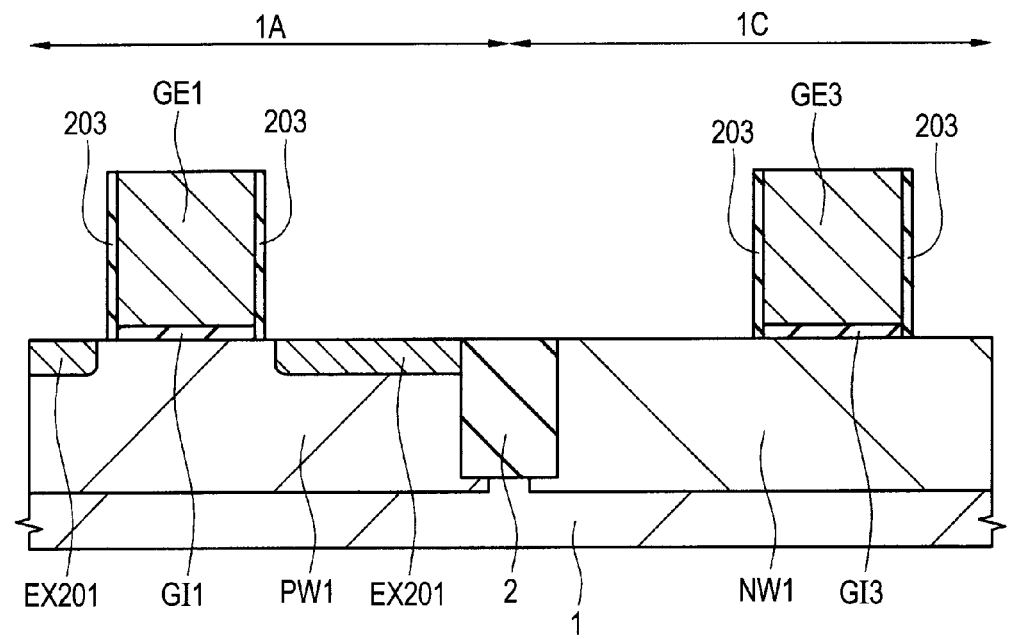
FIG. 38 is a cross-sectional view of a main part of another manufacturing step of the semiconductor device of the second comparative example, following the step shown in FIG. 37.

Then, as shown in FIG. 37, the photoresist pattern PR201 is removed by ashing or the like. At this time, residues PR201a of the photoresist pattern PR201 tend to remain over the semiconductor substrate 1. Thus, as shown in FIG. 38, the cleaning process (wet process) is performed to remove the residues PR201a.

Figure 39:
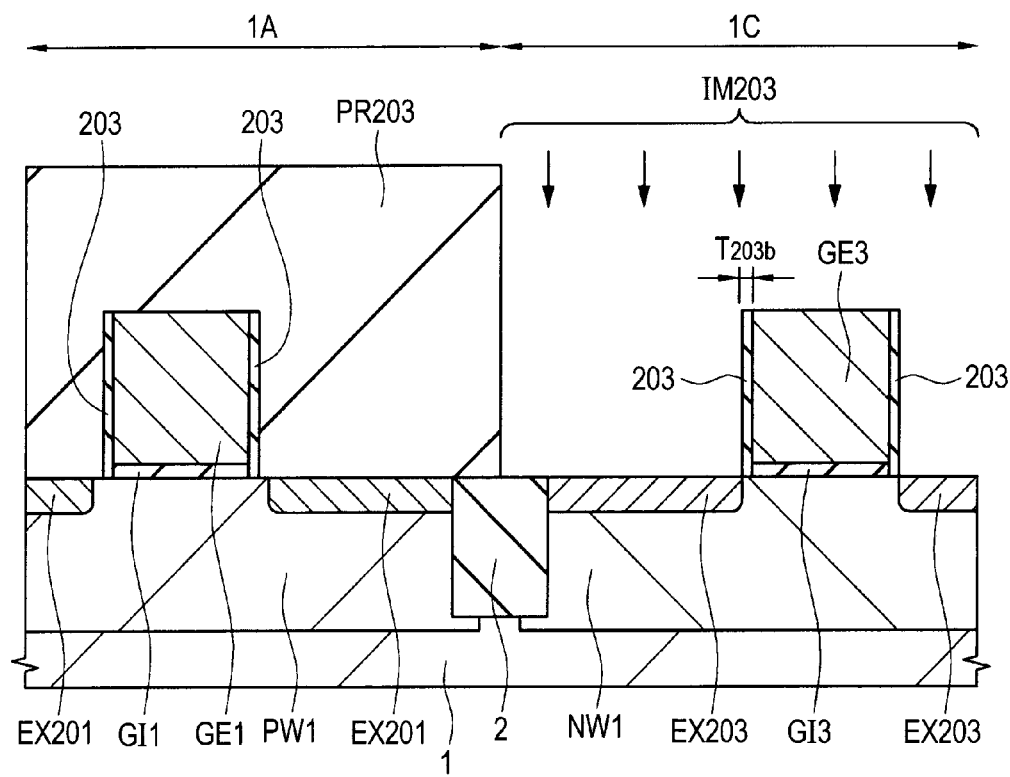
FIG. 39 is a cross-sectional view of a main part of another manufacturing step of the semiconductor device of the second comparative example, following the step shown in FIG. 38.

Then, as shown in FIG. 39, a photoresist pattern PR 203 is formed over the main surface of the semiconductor substrate 1. The photoresist pattern PR203 corresponds to the above photoresist patterns PR3 and PR103, and covers the nMIS region 1A and exposes the pMIS region 1C.

Then, the ion implantation IM203 of p-type impurities is performed on the semiconductor substrate 1 using the photoresist pattern PR203 as another ion implantation blocking mask, whereby an extension region EX203 is formed as the p-type semiconductor region in the n-type well NW1 of the pMIS region 1C. Upon the ion implantation IM203, the gate electrode GE3 and the insulating film 203 at its sidewalls function as the ion implantation blocking mask. Thus, the extension region EX203 is formed in alignment (self-alignment) with the side (surface opposite to the side in contact with the gate electrode GE3) of the insulating film 203 at each sidewall of the gate electrode GE3. The ion implantation IM203 corresponds to the above ion implantations IM3 and IM103, and the extension region EX203 corresponds to the above extension regions EX3 and EX103.

Thereafter, the photoresist pattern PR203 is removed, and thus the illustration and description of the following steps (including the formation step of the above sidewall spacer SW, the formation step of the above source and drain regions SD1, SD2, SD3, and SD4, and the like) will be omitted below.

In the manufacturing process of the semiconductor device in the first and second comparative examples, the photoresist patterns PR101 and PR201 are removed by ashing. The residues PR101a and PR201a of the photoresist patterns PR101 and PR201 need to be removed by the cleaning process (wet process) because the residues PR101a and PR201a tend to be maintained. At this time, the residues PR101a and PR201a are removed, and also the insulating film 103 (in the case of the first comparative example), and the sidewall insulating film 203 (in the case of the second comparative example) are subjected to the anisotropic etching, which results in a decrease in thickness of the insulating film 103 (in the first comparative example) and the sidewall insulating film 203 (in the second comparative example). When the etching capacity is decreased in the cleaning step of removing the residues PR101a and PR201a in order to suppress the decrease in thickness of the insulating film 103 (in the first comparative example) and the sidewall insulating film 203 (in the second comparative example), the residues PR101a and PR201a cannot be removed sufficiently. Thus, it is difficult to prevent the decrease in thickness of the insulating film 103 and the sidewall insulating film 203 in the cleaning step of removing the residues PR101a and PR201a. When the insulating film 103 or the sidewall insulating film 203 at the sidewall of the gate electrode becomes thinner after the cleaning step of removing the residues PR101a and PR201a, the insulating film 103 and the sidewall insulating film 203 serving as the offset spacer in the ion implantations IM103 and IM203 become thinner than the insulating film 103 and the sidewall insulating film 203 serving as the offset spacer in the ion implantations IM101 and IM201. This leads to a decrease in thickness of the insulating film 103 or sidewall insulating film 203 serving as the offset spacer every time the ion implantation is performed, thus resulting in a different distribution of impurities ion-implanted for each ion implantation.

Specifically, in the first comparative example, the thickness $T_{103b}$ of the insulating film 103 at the sidewall of the gate electrode GE3 in the ion implantation IM103 shown in FIG. 34 becomes small as compared to the thickness $T_{103a}$ of the insulating film 103 at the sidewall of the gate electrode GE1 in the ion implantation IM101 shown in FIG. 31 (that is, $T_{103a} > T_{103b}$). Thus, in the first comparative example, an interval (distance) between the end of the extension region EX103 formed in the ion implantation IM103 and the side of the gate electrode GE3 is smaller than that between the end of the extension region EX101 formed in the ion implantation IM101 and the side of the gate electrode GE1. In the second comparative example, the thickness $T_{203b}$ of the sidewall insulating film 203 at the sidewall of the gate electrode GE3 in the ion implantation IM203 of FIG. 39 is smaller than the thickness $T_{203a}$ of the sidewall insulating film 203 at the sidewall of the gate electrode GE1 in the ion implantation IM201 shown in FIG. 36 (that is, $T_{203a} > T_{203b}$). Thus, in the second comparative example, an interval (distance) between the end of the extension region EX203 formed in the ion implantation IM203 and the side of the gate electrode GE3 is smaller than that between the end of the extension region EX201 formed in the ion implantation IM201 and the side of the gate electrode GE1.

When the ion implantation is repeatedly performed using the same insulating film 103 or sidewall insulating film 203 for the offset spacer, like the first and second comparative examples, as the number of repetition of the removal and re-creating of the photoresist pattern becomes more, a decrease in thickness of the insulating film 103 or sidewall insulating film 203 serving as the offset spacer becomes drastically more, which causes the inconveniences.

When the photoresist patterns PR101 and PR201, are removed not by the ashing process, but by the wet process, the insulating film 103 (in the first comparative example) or the sidewall insulating film 203 (in the second comparative example) would be anisotropically etched in the wet process. This would result in a decrease in thickness of the insulating film 103 (in the first comparative example) or sidewall insulating film 203 (in the second comparative example). Thus, in the first and second comparative examples, every time the ion implantation is performed, the insulating film 103 or sidewall insulating film 203 serving as the offset spacer will tend to become thinner. This phenomenon is possibly caused when the photoresist patterns PR101 and PR201 are effectively removed (when the photoresist pattern is removed without degrading the yield). It is possible to remove the photoresist patterns PR101 and PR201 only by ashing without taking into consideration the residues PR101a and PR201a of the photoresist patterns PR101 and PR201. In this case, the manufacturing yield is reduced.

That is, in the first and second comparative examples, the insulating film 103 and the sidewall insulating film 203 which are not desired to be etched are also etched together with removal of the photoresist patterns PR101 and PR201 to have its thickness decreased. And, the thinned insulating film 103 or sidewall insulating film 203 is used again as the offset spacer to perform another ion implantation process, which causes the phenomenon of the undesired distribution of implanted ion impurities with respect to the designed level.

In contrast, the technical idea of this embodiment is as follows. When the film for the offset spacer is possibly etched together with the removal of the photoresist pattern after the ion implantation using the film for the offset spacer, the film for the offset spacer is positively removed after removing the photoresist pattern, and then another film for the offset spacer is re-created. The re-created film for the offset spacer is used to perform the next ion implantation. That is, the invention focuses attention not on the fact that the etching of the film for the offset spacer is suppressed as much as possible, but on the fact that after the film for the offset spacer is positively removed, another film for the offset spacer is re-created. Thus, upon positively removing the film for the offset spacer, the residues of the photoresist pattern can also be removed (lifted off) accurately. Additionally, another film for the offset spacer in a predetermined thickness is re-created to perform the next ion implantation, so that the thickness of the offset spacer can be accurately controlled to a predetermined thickness. This arrangement can solve the problem of a gradual decrease in thickness of the offset spacer (the above insulating film 103 and the sidewall insulating film 203) for each ion implantation, which would be caused in the above first and second comparative examples. In this embodiment reflecting such a technical idea, when performing the ion implantation using the film for the offset spacer, a new step of re-creating a new film for the offset spacer is added to between a step of removing the photoresist pattern and a step of re-creating the photoresist pattern after removing the film for the offset spacer. This step will be descried below with reference to FIGS. 40 to 45.

Figure 40:
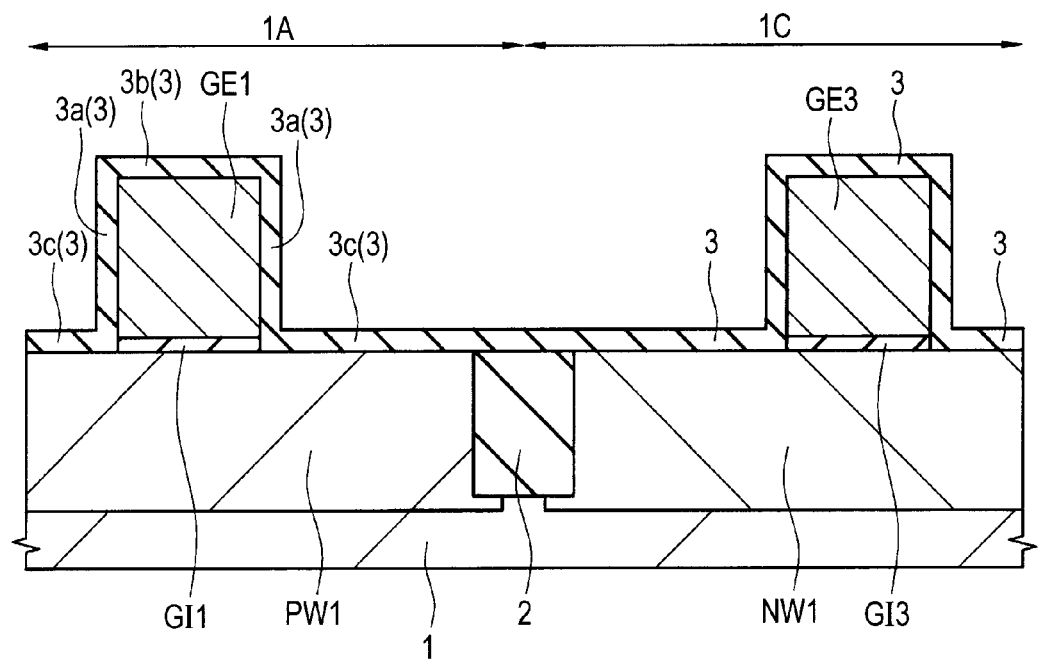
FIG. 40 is a cross-sectional view of a main part of another manufacturing step of the semiconductor device in the one embodiment of the invention.
Figure 41:
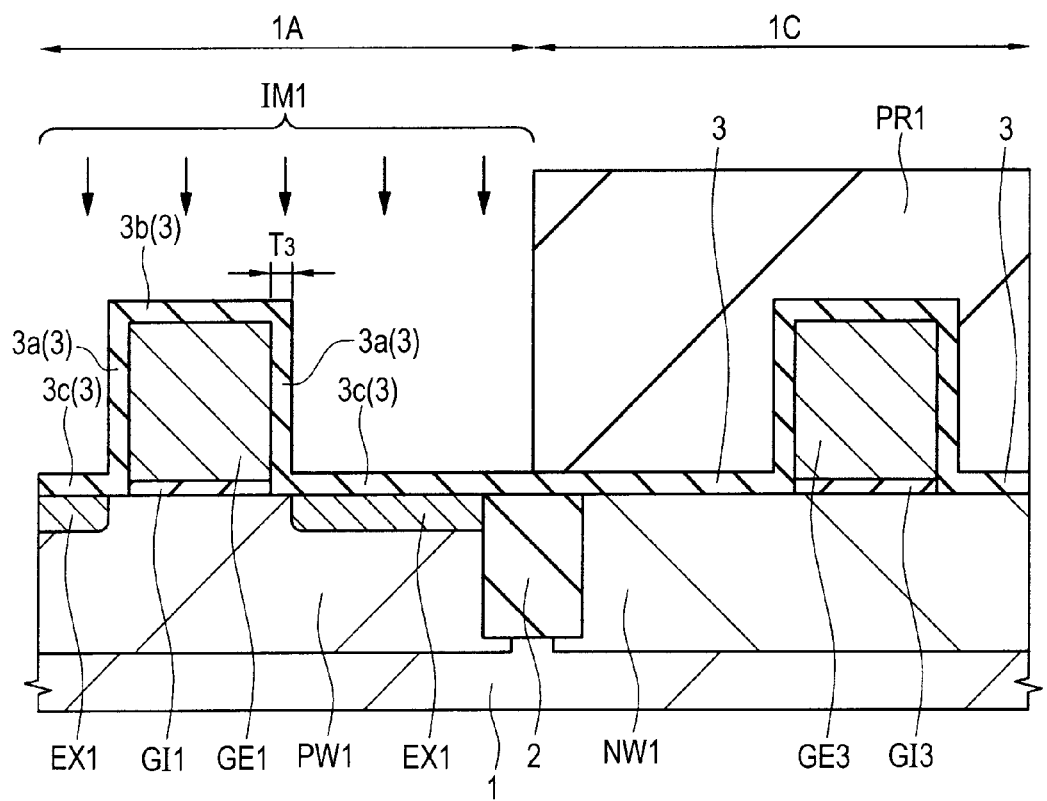
FIG. 41 is a cross-sectional view of a main part of another manufacturing step of the semiconductor device, following the step shown in FIG. 40.
Figure 42:
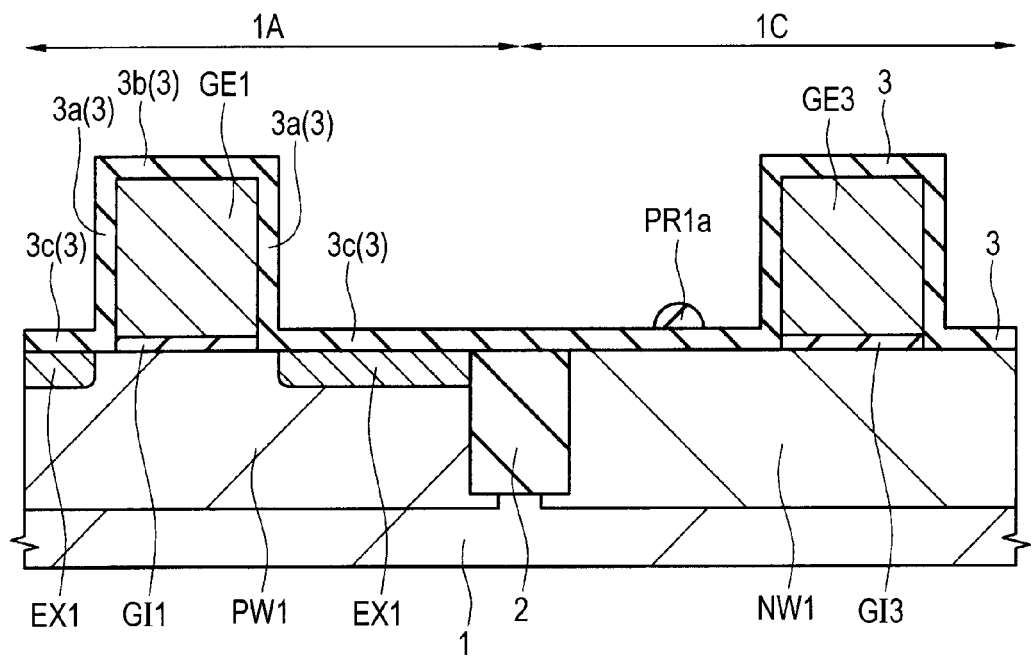
FIG. 42 is a cross-sectional view of a main part of another manufacturing step of the semiconductor device, following the step shown in FIG. 41.
Figure 43:
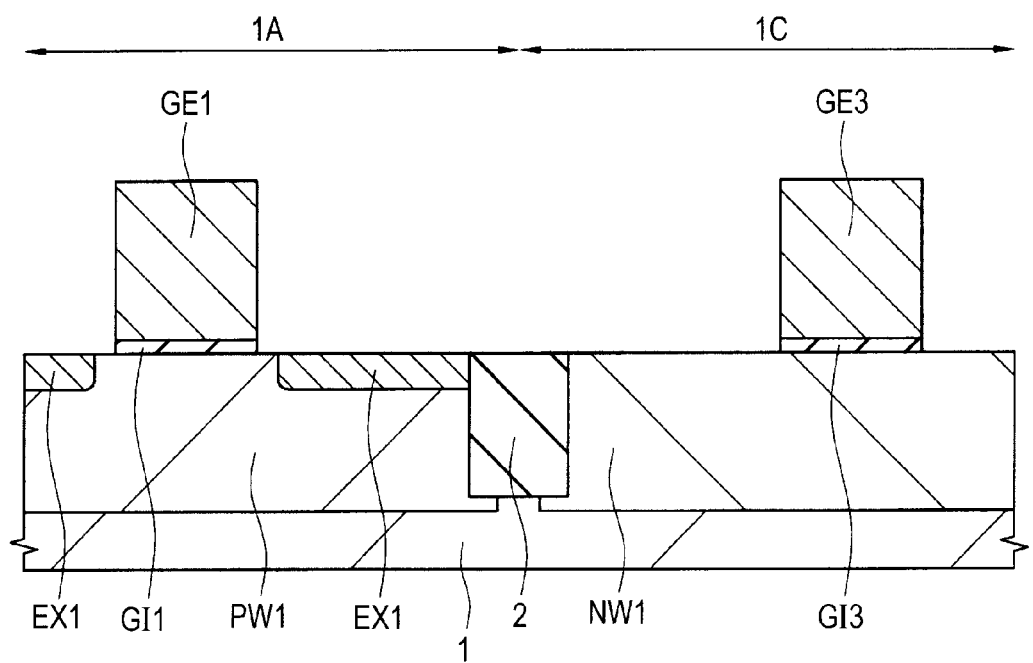
FIG. 43 is a cross-sectional view of a main part of another manufacturing step of the semiconductor device, following the step shown in FIG. 42.
Figure 44:
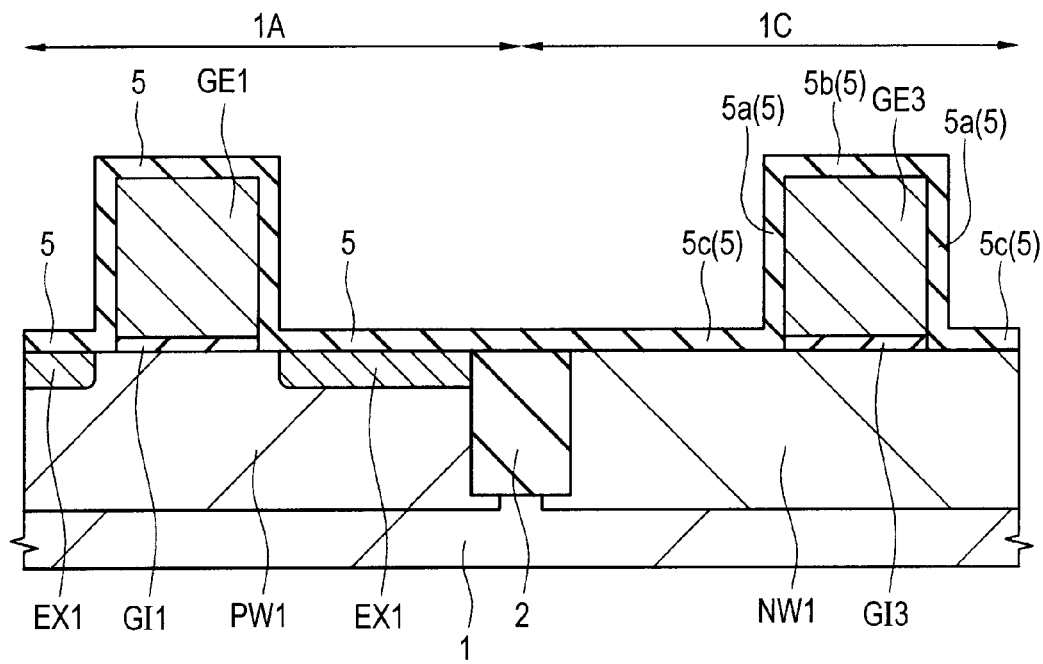
FIG. 44 is a cross-sectional view of a main part of another manufacturing step of the semiconductor device, following the step shown in FIG. 43.
Figure 45:
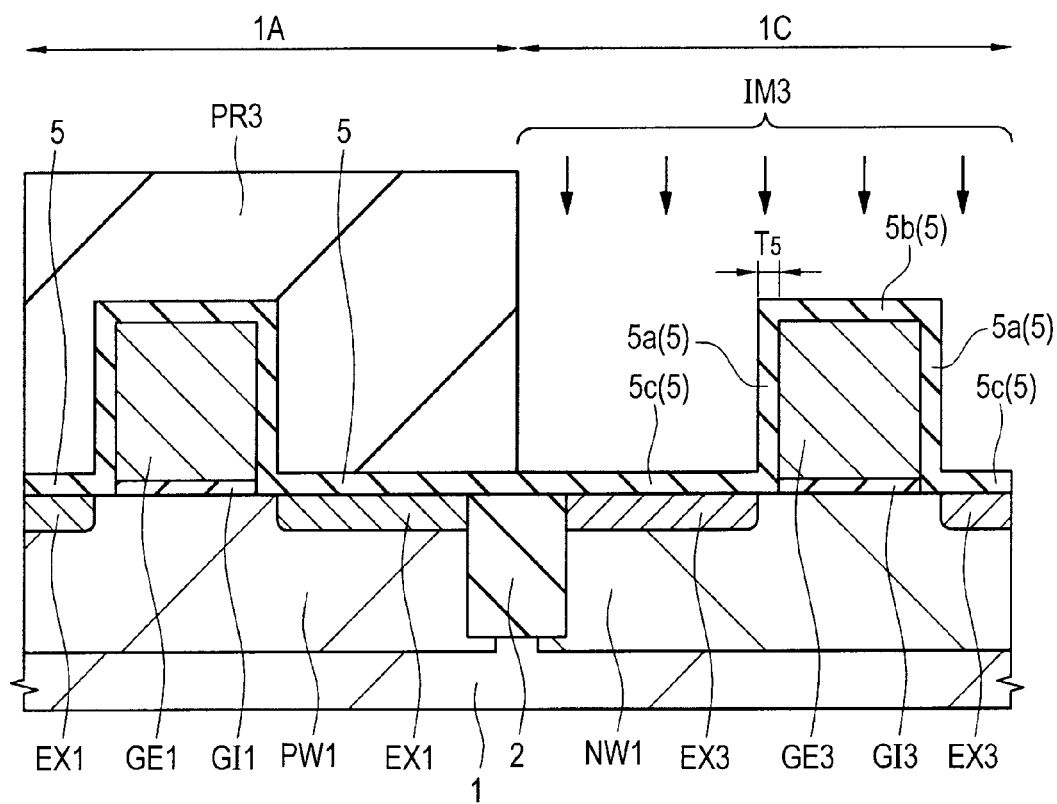
FIG. 45 is a cross-sectional view of a main part of another manufacturing step of the semiconductor device, following the step shown in FIG. 44.

FIGS. 40 to 45 show cross-sectional views of main parts of the manufacturing steps of the semiconductor device of this embodiment. FIGS. 40 to 45 show the nMIS region 1A and the pMIS region 1C among the nMIS regions 1A and 1B, and the pMIS regions 1C and 1D shown in FIGS. 3 to 29. FIG. 40 corresponds to FIG. 6 described above. FIG. 41 corresponds to FIG. 8 described above. FIG. 42 corresponds to FIG. 9 described above. FIG. 43 corresponds to FIG. 10 described above. FIG. 44 corresponds to FIG. 16 described above. FIG. 45 corresponds to FIG. 18 described above.

In the manufacturing process of the semiconductor device of this embodiment, as shown in FIG. 40 corresponding to FIG. 5 described above, the material film 3 for the offset spacer is formed over the main surface (entire main surface) of the semiconductor substrate 1 so as to cover the gate electrodes (in the case of FIG. 40, the gate electrodes GE1 and GE3). Then, as shown in FIG. 41 corresponding to FIG. 7 described above, the photoresist pattern PR1 is formed over the main surface of the semiconductor substrate 1, that is, over the material film 3. The photoresist pattern PR1 covers the pMIS region 1C and exposes the nMIS region 1A.

Then, as shown in FIG. 41 corresponding to FIG. 8 described above, the ion implantation IM1 of n-type impurities is performed on the semiconductor substrate 1 using the photoresist pattern PR1 as an ion implantation blocking mask so that the extension regions EX1 are formed as an n-type semiconductor region in the p-type well PW1 of the nMIS region 1A. As mentioned above, upon the ion implantation IM1, the material film 3 over each sidewall of the gate structure (gate electrode GE1) in the nMIS region 1A serves as the offset spacer (ion implantation blocking mask).

Then, as show in FIG. 42 corresponding to FIG. 9 described above, the photoresist pattern PR1 is removed by ashing or the like. At this time, the residues PR1a of the photoresist pattern PR1 possibly remain over the material film 3. This is because the residues PR1a not removed by the ashing remain along the edge of the photoresist pattern PR1 because the ions are implanted into the photoresist pattern PR1 by the ion implantation IM1 to harden and alter the resist. Even when the residues PR1a of the photoresist pattern PR1 remain over the material film 3, as shown in FIG. 43, the material film 3 is removed in step S9a, whereby the residues PR1a can be removed (lifted off) together with the material film 3. In this embodiment, the photoresist pattern PR1 is removed, and further the material film 3 is positively removed, so that the residues PR1a can be lifted off and removed with the material film 3. Ionic (implanted) species implanted into the photoresist pattern PR1 possibly remain at the surface of the material film 3 for the offset spacer after the ashing process. When the material film 3 is removed in step S9a, the implanted species (ionic implanted species) remaining at the surface of the material film 3 for the offset spacer or the above residues PR1a are also removed from the semiconductor substrate 1 together with the material film 3.

Then, as shown in FIG. 44, the material film 5 for the offset spacer is formed over the main surface (entire main surface) of the semiconductor substrate 1 so as to cover the gate electrode (gate electrodes GE1 and GE3 in the case shown in FIG. 44). As shown in FIG. 45, the photoresist pattern PR3 is formed over the main surface of the semiconductor substrate 1, that is, the material film 5. The photoresist pattern PR3 covers the nMIS region 1A and exposes the pMIS region 1C.

Then, as shown in FIG. 45, the ion implantation IM3 of p-type impurities are performed on the semiconductor substrate 1 using the photoresist pattern PR3 as another ion implantation blocking mask, whereby an extension region EX3 is formed as the p-type semiconductor region in the n-type well NW1 of the pMIS region 1C. As mentioned above, upon the ion implantation IM3, the material film 5 at the sidewalls of the gate structure (gate electrode GE3) in the pMIS region 1C serves as the offset spacer (ion implantation blocking mask).

The thickness $T_5$ of the material film 5 is accurately controlled with relative ease to a predetermined one by adjusting deposition conditions. Thus, in the deposition step of the material film 5, the material film 5 is formed in an appropriate thickness as the offset spacer of the ion implantation IM3. In the first and second comparative examples, the insulating film 103 and the sidewall insulating film 203 becomes thinner than the appropriate thickness as the offset spacer together with the removal of the resist patterns PR101 and PR201, and then the thinned insulating film 103 and sidewall insulating film 203 are used as the offset spacer for the ion implantations IM103 and IM203. In contrast, in this embodiment, the material film 5 (material film 5a) having the appropriate thickness as the offset spacer can be used as the offset spacer to perform the ion implantation IM3.

In the steps shown in FIGS. 1 to 29, the above step S5b (formation step of the material film 4), the above step S6b (formation step of the photoresist pattern PR2), the above step S7b (ion implantation IM2), the above step S8b (removal step of the photoresist pattern PR2), and the above step S9b (removal step of the material film 4) are performed between the step shown in FIG. 43 (removal step of the material film 3) and the step shown in FIG. 44 (formation step of the material film 5). In this case, after removing the material film 3 in step S9a, the material film 4 is formed in the appropriate thickness as the offset spacer for the ion implantation IM2 in step S5b. The material film 4 (material film 4a) having the appropriate thickness as the offset spacer can be used as the offset spacer to perform the ion implantation IM2 in step S7b. In the steps shown in FIGS. 1 to 29, after removing the material film 5 in step S9c, the material film 6 is formed in the appropriate thickness as the offset spacer for the ion implantation IM4 in step S5d. The material film 6 (material film 6a) having the appropriate thickness as the offset spacer can be used as the offset spacer to perform the ion implantation IM4 in step S7d.

The illustration and description of the following steps have been given with reference to FIGS. 1 to 29, and thus will be omitted below.

In this embodiment, upon the ion implantation using the offset spacer, every time the photoresist pattern (each of resist patterns PR1, PR2, PR3, PR4) is re-created, the material film (each of material films 3, 4, 5, and 6) to be used as the offset spacer is also re-created. It is relatively easy to control the thickness (thickness $T_3$, $T_4$, $T_5$, and $T_6$) of the formed material film (material film 3, 4, 5, 6) for the offset spacer to the predetermined thickness (which is made possible, for example, by adjusting the deposition conditions). Accordingly, the material films (material films 3, 4, 5, and 6) each having the appropriate predetermined thickness as the offset spacer can be used as the offset spacer (ion implantation blocking mask) to perform the ion implantation (ion implantations IM1, IM2, IM3, and IM4)

The material films 3, 5, and 6 are formed in steps S5a, S5b, S5c, and S5d such that the thicknesses $T_3$, $T_4$, $T_5$, and $T_6$ are the same to each other ($T_3=T_4=T_5=T_6$) by way of example. Thus, the offset spacers (material films 3a, 4a, 5a, and 6a) can have the same thickness upon the respective ion implantations IM1, IM2, IM3, and IM4. This arrangement can equalize the distribution of impurities introduced into the ion implantations IM1, IM2, IM3, and IM4. Specifically, this embodiment can equalize the interval (distance) between the end of the extension region EX1 and the side of the gate electrode GE1, the interval (distance) between the end of the extension region EX2 and the side of the gate electrode GE2, the interval (distance) between the end of the extension region EX3 and the side of the gate electrode GE3, and the interval (distance) between the end of the extension region EX4 and the side of the gate electrode GE4.

Apparently, the thicknesses $T_3$, $T_4$, $T_5$, and $T_6$ may be different from each other. Some of them may be different from others which have the same thickness, for example, $T_3=T_4$, $T_5=T_6$, and $T_3 \neq T_5$. The thickness thereof should be changed with flexibility in order to change the conduction type of the formed extension region, or in order to change the profiles of the extension region (control of the concentration or depth of impurities, the distance between the gate electrode and the extension region, and the like) according to the difference in driving voltage of the transistors or the required transistor characteristics (designed value of the transistor) even in the same type of conduction.

In this embodiment, every time the photoresist pattern (each of the resist patterns PR1, PR2, PR3, and PR4) is re-created, the material film (material films 3, 4, 5, and 6) to be used as the offset spacer is also re-created. This means that the steps S5, S6, S7, S8, and S9 are combined into one set and that this set is repeatedly performed to obtain a plurality of sets. The formation step of the material film for the offset spacer corresponding to steps S5a, S5b, S5c, and S5d is hereinafter referred to as "step S5". The formation step of the photoresist pattern corresponding to steps S6a, S6b, S6c, and S6d is hereinafter referred to as "step S6". The ion implantation step corresponding to steps S7a, S7b, S7c, and S7d is hereinafter referred to as "step S7". The photoresist pattern removal step corresponding to steps S8a, S8b, S8c, and S8d is hereinafter referred to as "step S8". The removal step of the material film for the offset spacer corresponding to steps S9a, S9b, S9c, and S9d is hereinafter referred to as "step S9". Among a plurality of sets, the photoresist patterns formed in step S6 have different opening regions thereof (exposing region not covered with the photoresist pattern) for each set. In the case shown in FIGS. 1 to 29, the above set is repeated four times, while in the case shown in FIGS. 40 to 45, the above set is repeated two times. The number of repetition may be more than one (that is, two sets or more), that is, may be three sets, or five sets or more.

The number of repeated sets corresponds to the number of regions having different conditions for ion implantation in step S7 (type of implanted impurities, the amount of dose, the implantation energy or the like). The reasons for changing the conditions for the ion implantation in step S7 are that the conduction type of the formed extension region is changed, or that the profiles of the extension region (control of the concentration or depth of impurities, the distance between the gate electrode and the extension region, and the like) are changed according to the difference in driving voltage of the transistors or the required transistor characteristics (designed value of the transistor) even in the same type of conduction. In the case shown in FIGS. 1 to 29, the nMIS region 1A, the nMIS region 1B, the pMIS region 1C, and the pMIS region 1D differ from one another in conditions for ion implantation in step S7 (that is, the condition for the ion implantation IM1 in step S7a, the condition for the ion implantation IM2 in step S7b, the condition for the ion implantation IM3 in step S7c, and the condition for the ion implantation IM4 in step S7d). Thus, the above set is repeated four times. When there is another region for formation of the n-channel MISFET where the ion implantation in step S7 is to be performed on different conditions depending on the ion implantations IM1 and IM2, another set including steps S5, S6, S7, S8, and S9 is added in order to perform the ion implantation in step S7 on the region of interest. Likewise, when there is a further region for formation of the p-channel MISFET where the ion implantation in step S7 is to be performed on different conditions depending on the ion implantations IM3 and IM4, a further set including steps S5, S6, S1, S8, and S9 is added in order to perform the ion implantation in step S7 on the region of interest.

In this embodiment, the set including steps S5a to S9a, the set including steps S5b to S9b, the set including steps S5c to S9c, and the set including steps S5d to S9d are performed in that order, but are not limited thereto. The order of these sets can be changed. For example, the set including steps S5c to S9c, the set including steps S5d to S9d, the set including steps S5a to S9a, and the set including steps S5b to S9b can be performed in that order. Alternatively, the set including steps S5a to S9a, the set including steps S5c to S9c, the set including steps S5b to S9b, and the following set including step S5d can be performed in that order.

Steps S5, S6, S7, S8, and S9 are combined into one set, and the set is repeated a plurality of times, but the step of removing the material film for the offset spacer in step S9 of the last set can be omitted, or the removal step in step S9 of the last set can be slightly performed to leave the material film in a layered shape. Specifically, in the case shown in FIGS. 1 to 29, the step of removing the material film 6 in step S6d is omitted, or the removal step of the material film 6 in step S9d is slightly performed to leave the material film 6 in the layered shape. The inherent thickness of the film for the offset spacer is so small that the removal of the photoresist pattern would further disadvantageously decrease the thickness of the film for the offset spacer in the first and second comparative examples. For this reason, in this embodiment, after the film for the offset spacer is removed, a new film for the offset spacer is re-created. However, the sidewall spacer SW formed in the following step S10 has a larger thickness than the thickness (corresponding to $T_3$, $T_4$, $T_5$, and $T_6$) of the offset spacer. Even when the material film 6 becomes thinner together with the removal of the photoresist pattern PR4 and remains in the layered shape, the adverse effect given by the ion implantation in step S11 (ion implantation for forming the source and drain regions SD1, SD2, SD3, and SD4) is reduced. Thus, in the case shown in FIGS. 1 to 29, the step of removing the material film 6 in step S9d may be omitted. Alternatively, the step of removing the material film 6 in step S9d is slightly performed to remain the material film 6 in the layered shape, and then the sidewall spacer SW is formed in step S10. Even in this case, the adverse effect of the decrease in thickness of the material film 6 together with the removal of the photoresist pattern PR4 can be prevented. In this case, the material film 6 exists between the side of the sidewall spacer SW and the sidewall of the gate electrode, and between the lower surface of the sidewall spacer SW and the main surface of the semiconductor substrate 1. The step of removing the material film for the offset spacer in step S9 of the last set (removal step of the material film 6 in step S9d in the case shown in FIGS. 1 to 29) may be preferably omitted. Alternatively, when the removing step may be slightly performed to leave the material film (material film 6 in the case shown in FIGS. 1 to 29) in a layered shape, the material film (material film 6 in the case of FIGS. 1 to 29) may be preferably an insulating material film (not be comprised of conductive material).

Figure 46:
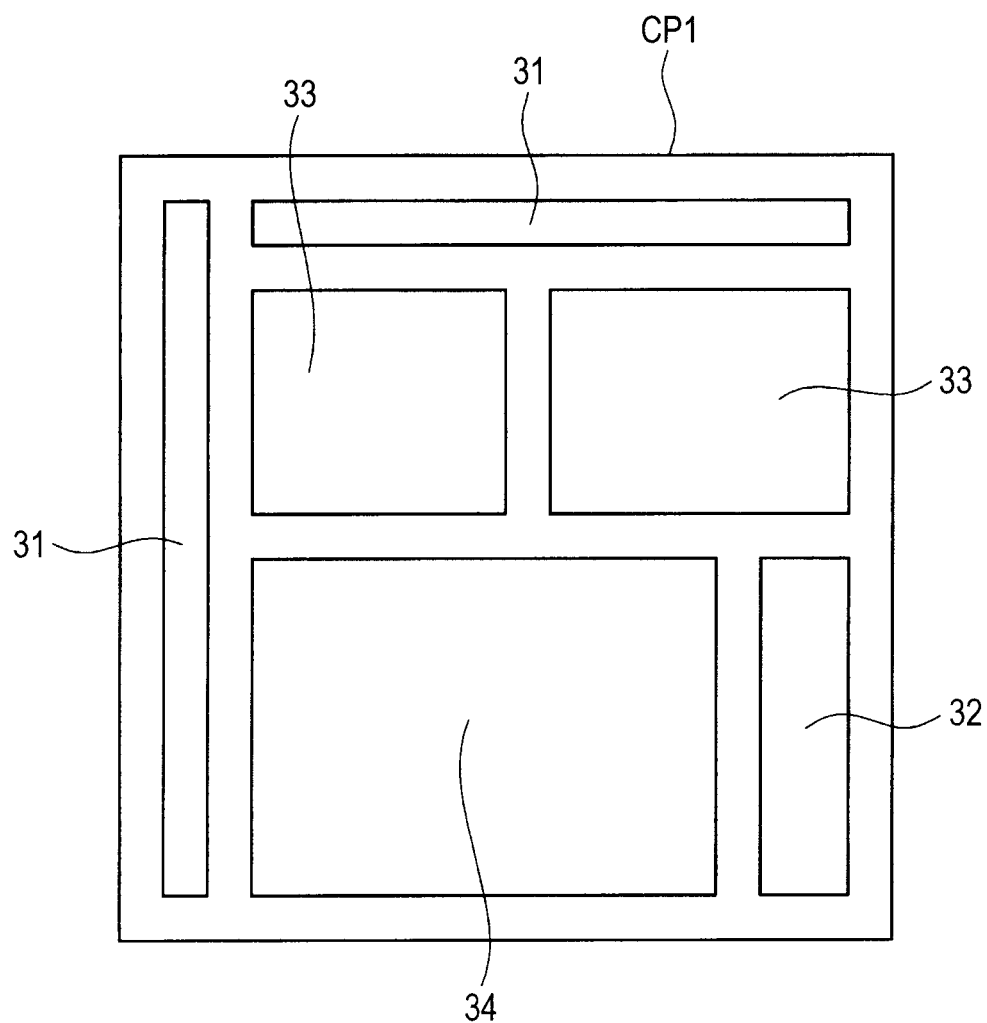
FIG. 46 is a plan layout diagram showing an example of a semiconductor chip to which the one embodiment of the invention is applied.

FIG. 46 shows a plan layout view of one example of a semiconductor chip (semiconductor device) CP1 to which this embodiment is applied, while showing one example of the layout of a circuit block formed in the semiconductor chip or the like.

The semiconductor chip (semiconductor device) CP1 shown in FIG. 46 includes an I/O circuit region 31 with an I/O circuit (input/output circuit) formed therein, a power supply voltage circuit region 32 with a power supply voltage circuit (power supply voltage generation circuit) formed therein, a core circuit region 33 with a core circuit, such as a CPU or an analog circuit, and a SRAM region 34 with a SRAM formed therein. These circuit regions (31, 32, 33, and 34) have a plurality of n-channel MISFETs and a plurality of p-channel MISFETs.

In order to change the profiles (concentration or depth of the impurities) in the extension regions according to the difference in driving voltage or the required transistor characteristics (designed value of the transistor) between the MISFETs of the same channel conduction type, it is often necessary to change the conditions for ion implantation (ion implantation corresponding to the above ion implantations IM1, IM2, IM3, and IM4) for formation of the extension region. For example, eight conditions in total for ion implantation (ion implantation for forming the extension regions), including four conditions for the n-channel MISFET and four conditions for the p-channel MISFET are set in some cases. Specifically, these conditions include two conditions for the n-channel MISFET formed in the I/O circuit region 31 (on which different ion implantations are used for each driving voltage or the like), and two conditions for the n-channel MISFET formed in other circuit regions (32, 33, 34) (on which different ion implantations are used for each driving voltage or the like). Specifically, these conditions include two conditions for the p-channel MISFET formed in the I/O circuit region 31 (on which different ion implantations are used for each driving voltage or the like), and two conditions for the p-channel MISFET formed in other circuit regions (32, 33, 34) (on which different ion implantations are used for each driving voltage or the like). When the ion implantations (ion implantations corresponding to the above ion implantations IM1, IM2, IM3, and IM4) for forming the extension regions have eight preset conditions, the set including the above steps S5, S6, S7, S8, and S9 may be performed on each region to be subjected to the ion implantation on each of the eight conditions (in this case, the set is repeated eight times to provide the eight sets).

Second Embodiment

This embodiment corresponds to a modified example of the first embodiment. FIGS. 47 to 54 show cross-sectional views of main parts of manufacturing steps of the semiconductor device of this embodiment, and correspond to FIGS. 40 to 45 of the first embodiment.

Figure 47:
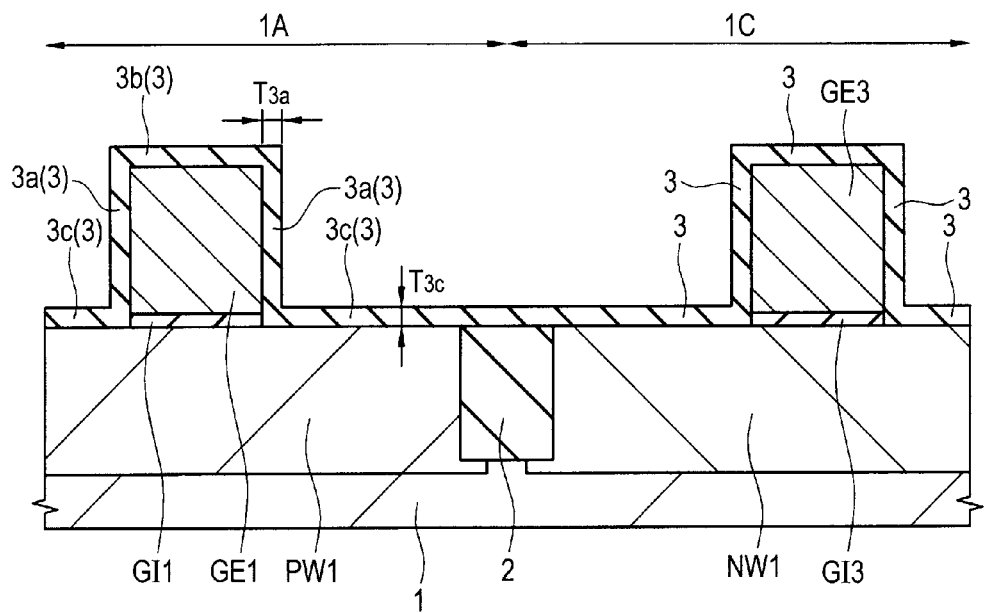
FIG. 47 is a cross-sectional view of a main part of a manufacturing step of a semiconductor device according to another embodiment of the invention.
Figure 48:
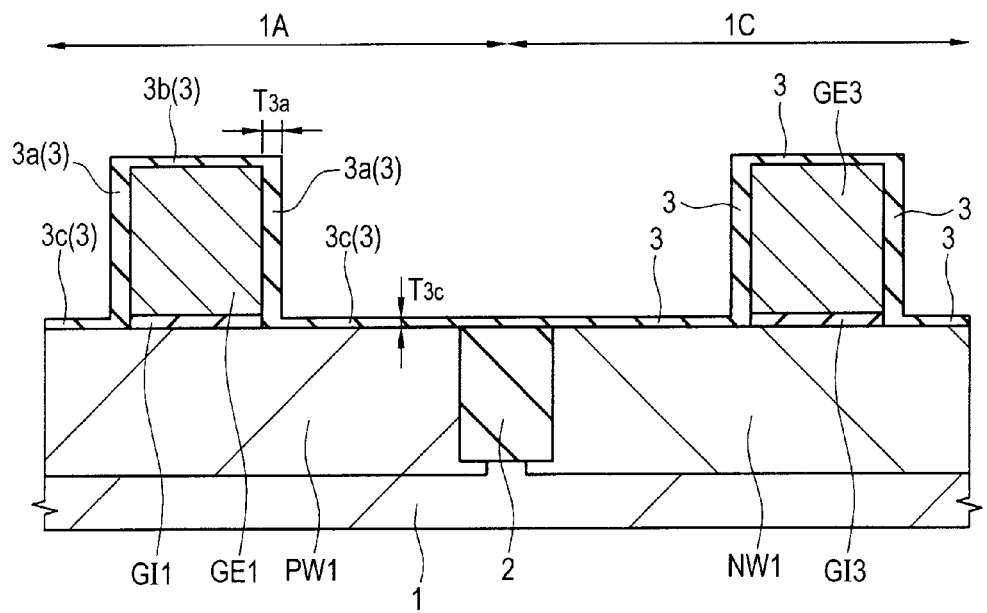
FIG. 48 is a cross-sectional view of a main part of another manufacturing step of the semiconductor device, following the step shown in FIG. 47.
Figure 49:
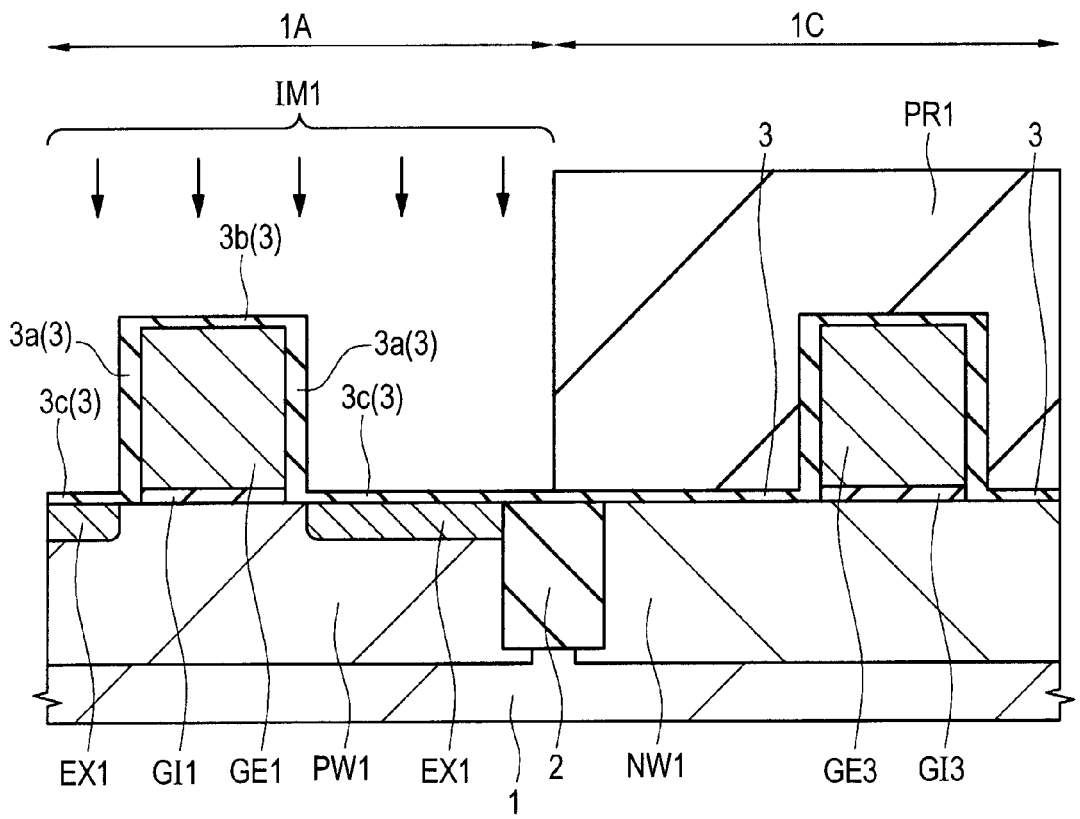
FIG. 49 is a cross-sectional view of a main part of another manufacturing step of the semiconductor device, following the step shown in FIG. 48.
Figure 50:
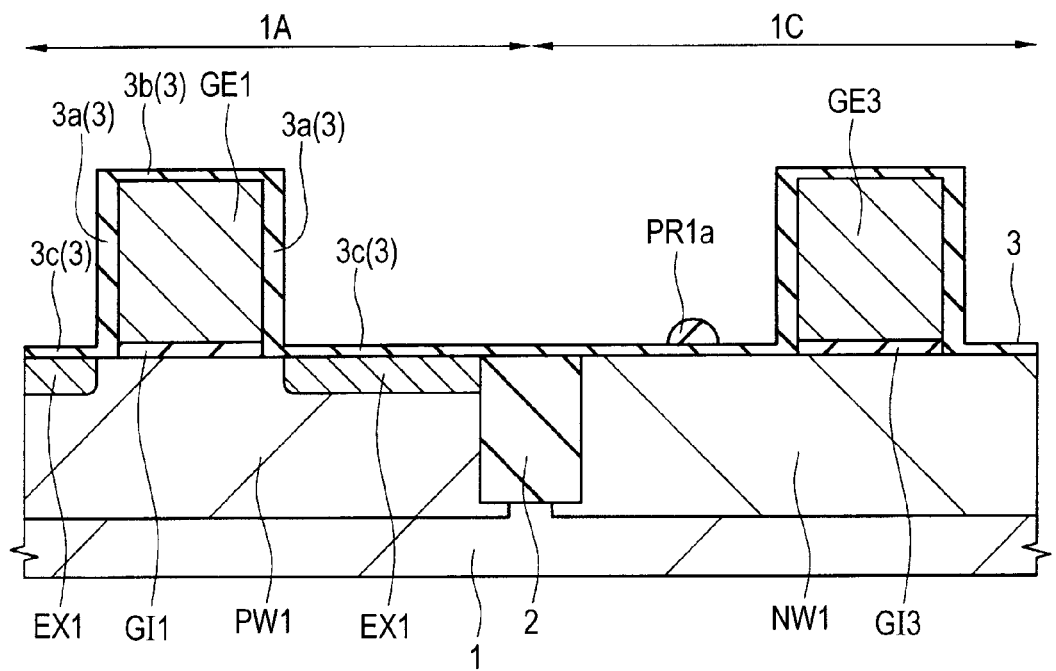
FIG. 50 is a cross-sectional view of a main part of another manufacturing step of the semiconductor device, following the step shown in FIG. 49.
Figure 51:
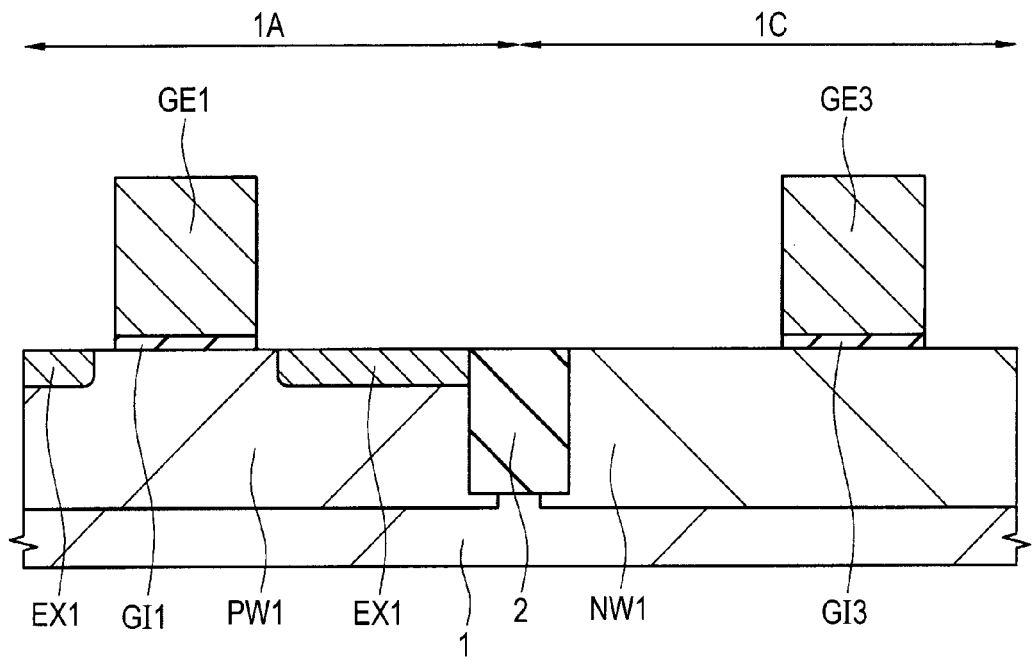
FIG. 51 is a cross-sectional view of a main part of another manufacturing step of the semiconductor device, following the step shown in FIG. 50.
Figure 52:
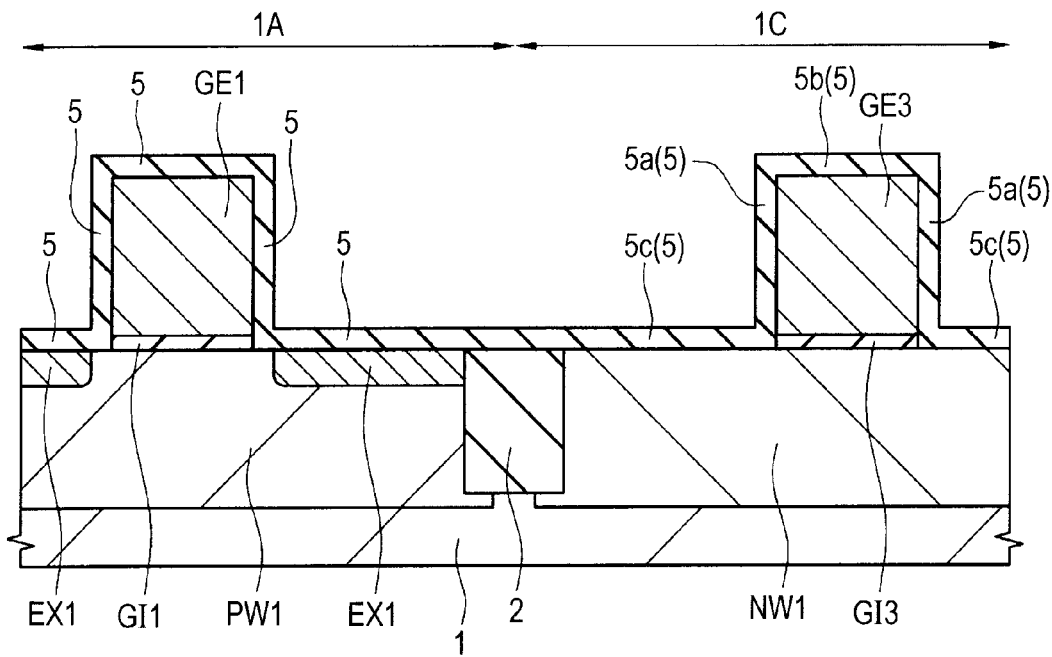
FIG. 52 is a cross-sectional view of a main part of another manufacturing step of the semiconductor device, following the step shown in FIG. 51.
Figure 53:
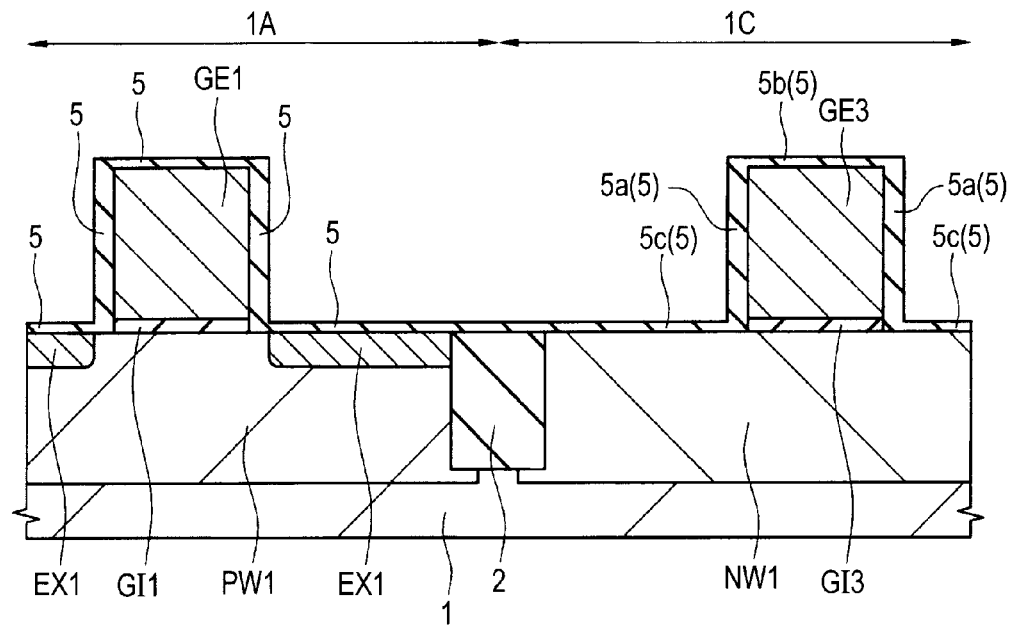
FIG. 53 is a cross-sectional view of a main part of another manufacturing step of the semiconductor device, following the step shown in FIG. 52.
Figure 54:
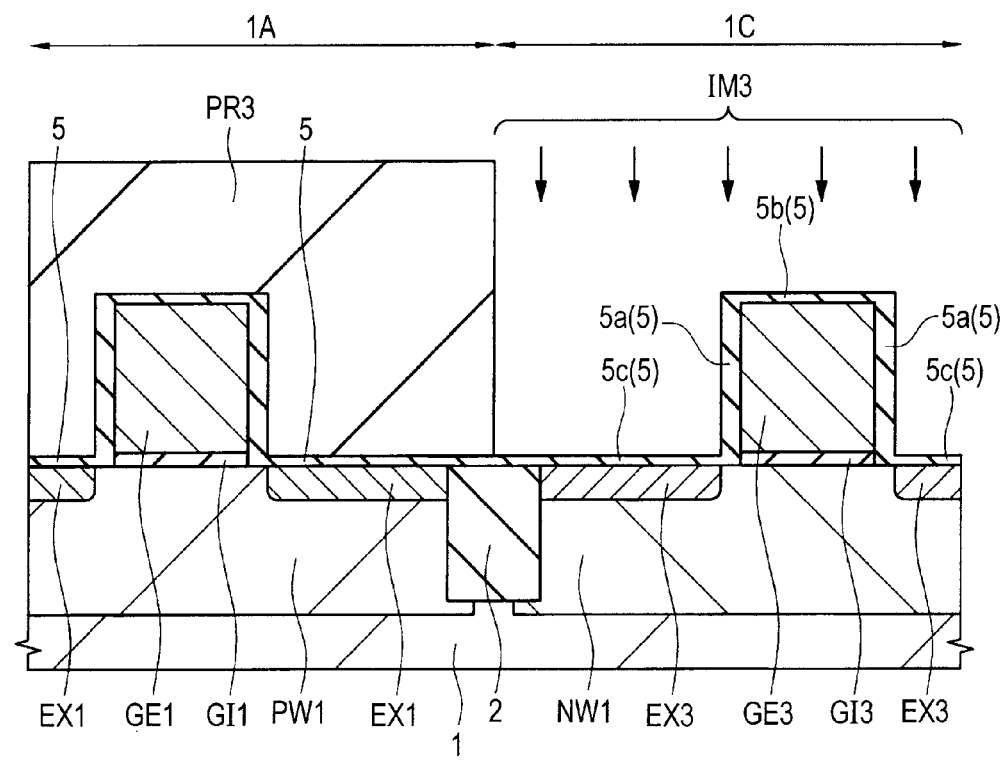
FIG. 54 is a cross-sectional view of a main part of another manufacturing step of the semiconductor device, following the step shown in FIG. 53.

FIG. 47 corresponds to the same step as that of FIG. 40. FIG. 49 corresponds to the same step as that of FIG. 41. FIG. 50 corresponds to the same step as that of FIG. 42. FIG. 51 corresponds to the same step as that of FIG. 43. FIG. 52 corresponds to the same step as that of FIG. 44. FIG. 54 corresponds to the same step as that of FIG. 45. Thus, the steps shown in FIGS. 47 to 54 differ from those shown in FIGS. 40 to 45 in that the step in FIG. 48 and the step in FIG. 53 are added.

That is, in the same way as that of the first embodiment, the material film 3 is formed to provide the same structure shown in FIG. 47 as that shown in FIG. 40. Thereafter, in this embodiment, the material film 3 is subjected to anisotropic etching as shown in FIG. 48 (that is, the material film 3 is subjected to the entire etching back process by dry etching). The second embodiment differs from the above first embodiment in that an anisotropic etching step of the material film 3 is added before forming the photoresist pattern PR1 over the material film 3 after the formation of the material film 3.

Then, as shown in FIG. 49, the photoresist film PR1 is formed, and then the ion implantation IM1 is performed in the same way as that of the first embodiment. The formation of the photoresist pattern PR1 and the ion implantation IM1 are basically the same as those of the first embodiment, and thus a description thereof will be omitted below.

Then, in the same way as that of the first embodiment, the photoresist pattern PR1 is removed as shown in FIG. 50, the material film 3 is removed as shown in FIG. 51, and the material film 5 is formed as shown in FIG. 52. Then, in this embodiment, as shown in FIG. 53, the material film 5 is subjected to anisotropic etching (that is, the entire etching back process is performed on the material film 5 by the dry etching). The second embodiment differs from the first embodiment in that the anisotropic etching step of the material film 5 is added after forming the material film 5 and before forming the photoresist pattern PR3 over the material film 5. Then, after the photoresist pattern PR3 is formed as shown in FIG. 54, the ion implantation IM3 is performed in the same way as that of the first embodiment.

When this embodiment is applied to the steps shown in FIGS. 1 to 29, the anisotropic etching step of the material film 4 is added to between the step S5b (formation step of the material film 4) and the step S6b (formation step of the photoresist pattern PR2), and the anisotropic etching step of the material film 6 is added to between the step S5d (formation step of the material film 6) and the step S6d (formation step of the photoresist pattern PR4).

Other steps in this embodiment are basically the same as those in the first embodiment, and thus a description thereof will be omitted below.

This embodiment can obtain the following specific effects in addition to the effects of the first embodiment.

In this embodiment, the anisotropic etching (that is, the entire etching back process using the dry etching) is performed on the material films (material films 3, 4, 5, and 6) for the offset spacer after forming the material films. However, the etching is anisotropic, so that the thickness of the material film for the offset spacer at the sidewalls of the gate structure (gate electrode) (thickness in the direction substantially parallel to the main surface of the semiconductor substrate 1) does not change before and after the anisotropic etching. The thickness of the material film (material films 3, 4, 5, and 6) (thickness substantially perpendicular to the main surface of the semiconductor substrate 1) over the main surface of the semiconductor substrate 1 not covered with the gate structure, and the thickness of the material film (material films 3, 4, 5, and 6) over the top surface of the gate structure are decreased by the anisotropic etching.

Taking into consideration the nMIS region 1A, the thickness of the material film 3a at the sidewall of the gate structure (gate electrode GE1) (which is the thickness in the direction substantially parallel to the main surface of the semiconductor substrate 1, indicated by the reference numeral $T_3a$ shown in FIGS. 47 and 48) is not changed before and after the anisotropic etching on the material film 3. Thus, the thickness (corresponding to the thickness $T_3a$) of the material film 3a serving as the offset spacer in the ion implantation IM1 does not change even when the material film 3 is subjected to the anisotropic etching, and is determined by the thickness of the material film 3 formed in step S5a. In the deposition step of the material film 3, the material film 3 may be formed in an appropriate thickness as the offset spacer in the ion implantation IM1. In contrast, the anisotropic etching decreases the thickness of the material film 3c over the main surface of the semiconductor substrate 1 (which is the thickness in the direction substantially perpendicular to the main surface of the semiconductor substrate 1 as indicated by the thickness $T_{ac}$ in FIGS. 47 and 48). Also, the anisotropic etching decreases the thickness of the material film 3b over the upper surface of the gate structure (gate electrode GE1) (which is the thickness in the direction substantially perpendicular to the main surface of the semiconductor substrate 1). In the ion implantation IM1, in order to implant impurity ions into the semiconductor substrate 1 (p-type well PW1), it is necessary to allow the impurity ions to penetrate the material film 3c. By performing the anisotropic etching on the material film 3, the material film 3c through which the impurity ions are to pass can be thinned, which can provide an effect of easily controlling the profiles (distribution) of the impurities introduced into the semiconductor substrate 1 (p-type well PW1) in the ion implantation IM1 in the depth direction. Further, this arrangement also has another effect of increasing the controllability of the implantation depth in the ion implantation IM1.

The same goes for the material films 4, 5, and 6. The additional anisotropic etching of the material film 4c can decrease the thickness of the material film 4, which provides the effect of easily controlling the profiles (distribution) of the impurities introduced into the semiconductor substrate 1 (p-type well PW2) in the depth direction in the ion implantation IM2, and the effect of increasing the controllability of the implantation depth thereof. The additional anisotropic etching of the material film 5 can decrease the thickness of the material film 5c, which provides the effect of easily controlling the profiles (distribution) of the impurities introduced into the semiconductor substrate 1 (n-type well NW1) in the ion implantation IM3 in the depth direction. The additional etching also has the effect of increasing the controllability of the implantation depth thereof. The additional anisotropic etching of the material film 6 can decrease the thickness of the material film 6c, which provides the effect of easily controlling the profiles (distribution) of the impurities introduced into the semiconductor substrate 1 (n-type well NW2) in the depth direction in the ion implantation IM4, and the effect of increasing the controllability of the implantation depth thereof.

In the anisotropic etching step of the material films (3, 4, 5, and 6) for the offset spacer, there are two cases, specifically, the case in which the thicknesses of the material films 3a, 4a, 5a, and 6a do not become zero, and the case in which the thicknesses of the material films 3a, 4a, 5a, and 6a become zero to expose the semiconductor substrate 1. In the former case (when the thicknesses of the material films 3a, 4a, 5a, an 6a do not become zero), the residues of the photoresist pattern can be easily removed by lifting off upon removing the material films in steps S9a, S9b, S9c, an S9d. In the latter case (when the thicknesses of the material films 3a, 4a, 5a, and 6a become zero to expose the main surface of the semiconductor substrate 1), this arrangement can maximize the effect of easily controlling the profiles (distribution) of the impurities introduced into the semiconductor substrate 1 in the ion implantations IM1, IM2, IM3, and IM4 in the depth direction. This also has the effect of increasing the controllability of the implantation depth thereof. In the latter case (when the thicknesses of the material films 3*a*, 4*a*, 5*a*, 6*a* become zero to expose the main surface of the semiconductor substrate 1), the material films for the offset spacer (material films 3*a*, 4*a*, 5*a*, and 6*a*) remain at the sidewalls of the gate structure. The remaining material films can function as the offset spacer to perform the ion implantations IM1, IM2, IM3, and IM4.

Third Embodiment

FIGS. 55 to 68 show cross-sectional views of main parts of manufacturing steps of a semiconductor device of this embodiment, while illustrating the same sectional regions as those in FIGS. 3 to 29 in the first embodiment.

A main different point of this embodiment from the first embodiment is that the protective film 9 is formed after the formation of the gate electrode and before the formation of the film for the offset spacer (material film 3). Now, this embodiment will be specifically described below with reference to FIGS. 55 to 68.

Figure 55:
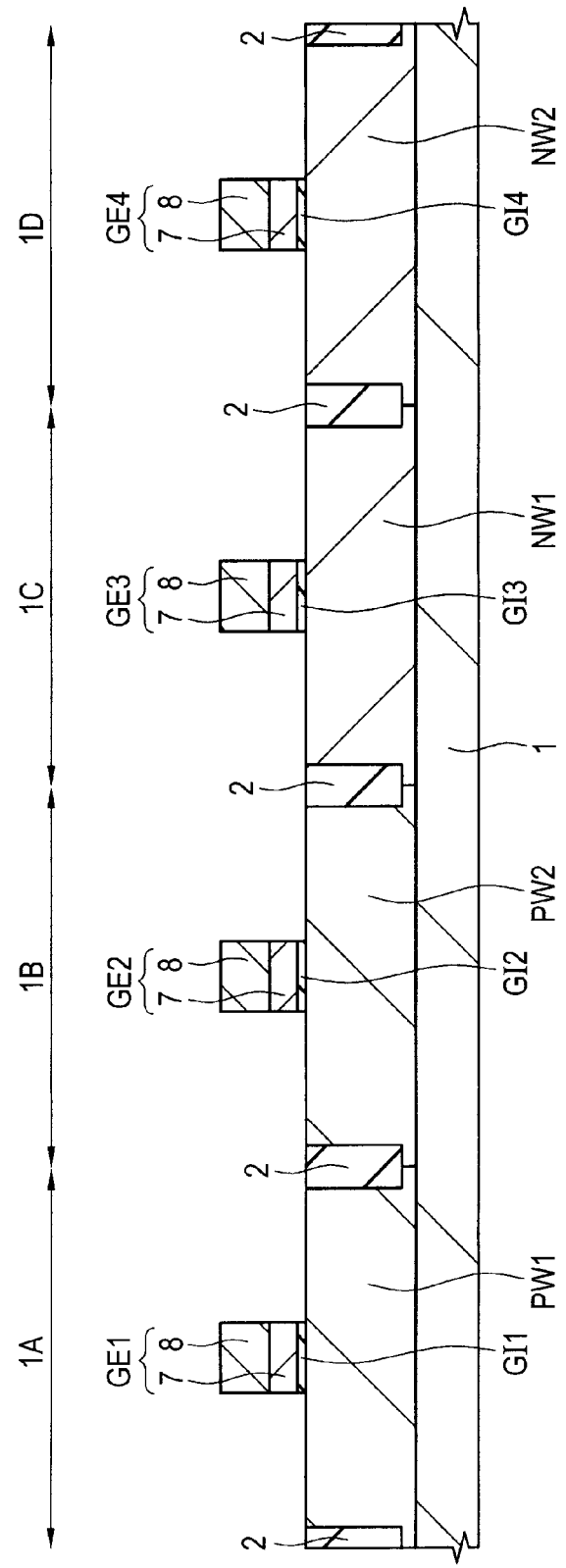
FIG. 55 is a cross-sectional view of a main part of a manufacturing step of a semiconductor device according to another embodiment of the invention.

The processes until step S4 are performed in the same way as that of the first embodiment to provide the structure shown in FIG. 55 corresponding to FIG. 5. The processes until step S4 are the same as those of the first embodiment, and thus a description thereof will be omitted below. Referring to FIG. 55, the gate insulating films GI1, GI2, GI3, and GI4 are formed of high-k films (high dielectric films), and the gate electrodes GE1, GE2, GE3, and GE4 are formed of metal gate electrodes (specifically, a laminated film of the metal film 7 and the polycrystalline silicon film 8 thereover).

Figure 56:
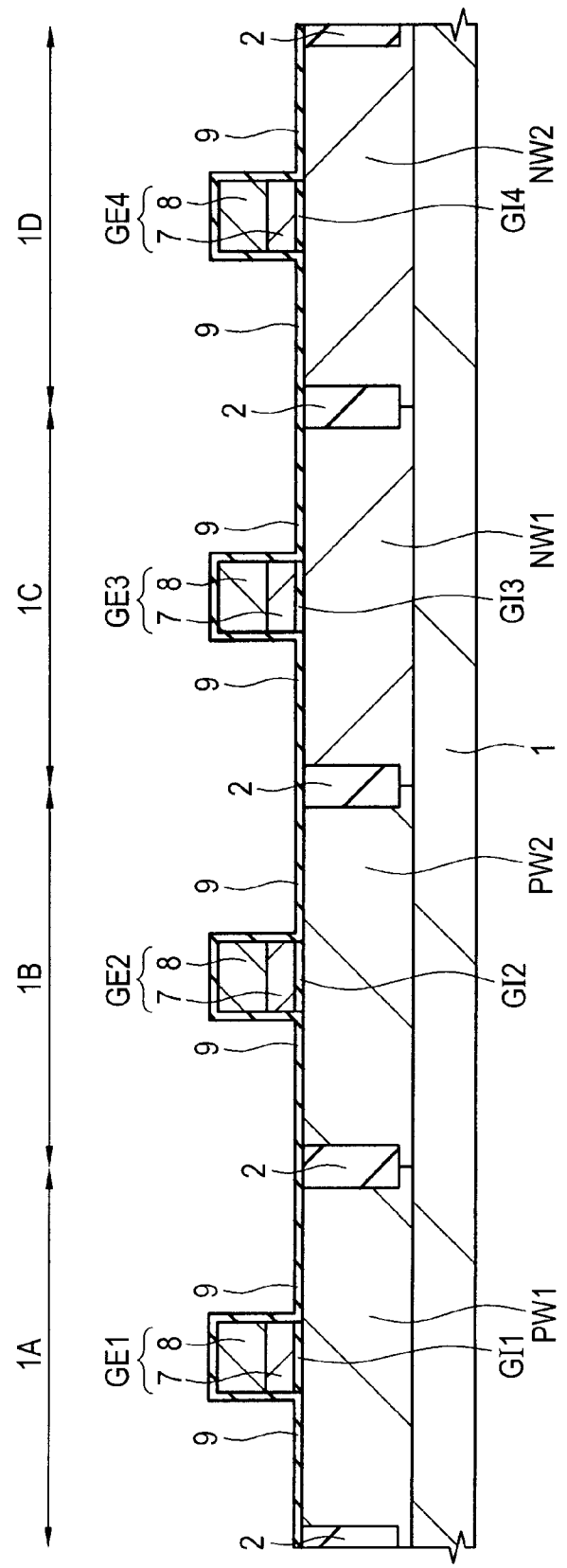
FIG. 56 is a cross-sectional view of a main part of another manufacturing step of the semiconductor device, following the step shown in FIG. 55.

In this embodiment, as shown in FIG. 56, after obtaining the structure shown in FIG. 55, the protective film (material film for protection) 9 is formed (deposited) over the main surface (entire main surface) of the semiconductor substrate 1 so as to cover the gate structures (gate electrodes GE1, GE2, GE3, and GE4) in the nMIS regions 1A and 1B and the pMIS regions 1C and 1D. In the nMIS regions 1A and 1B and the pMIS regions 1C and 1D, the protective film 9 is formed over the upper surfaces and sidewalls of the gate structures (gate electrodes GE1, GE2, GE3, and GE4), and over remaining parts of the semiconductor substrate 1 (p-type wells PW1 and PW2 and n-type wells NW1 and NW2) not covered with the gate structures (gate electrodes GE1, GE2, GE3, and GE4). The protective film 9 is desirably formed of material that is difficult to etch in the removing steps of the respective material films 3, 4, 5, and 6 to be performed later (corresponding to steps S9*a*, S9*b*, S9*c*, and S9*d*).

This embodiment differs from the first embodiment in the addition of the formation step of the protective film 9 between steps S4 and S5*a*. The following steps are basically the same as those of the first embodiment (that is, in the process flowchart of this embodiment, the step of forming the protective film 9 is added to between step S4 and step S5*a* in the process flowcharts of FIGS. 1 and 2).

Figure 57:
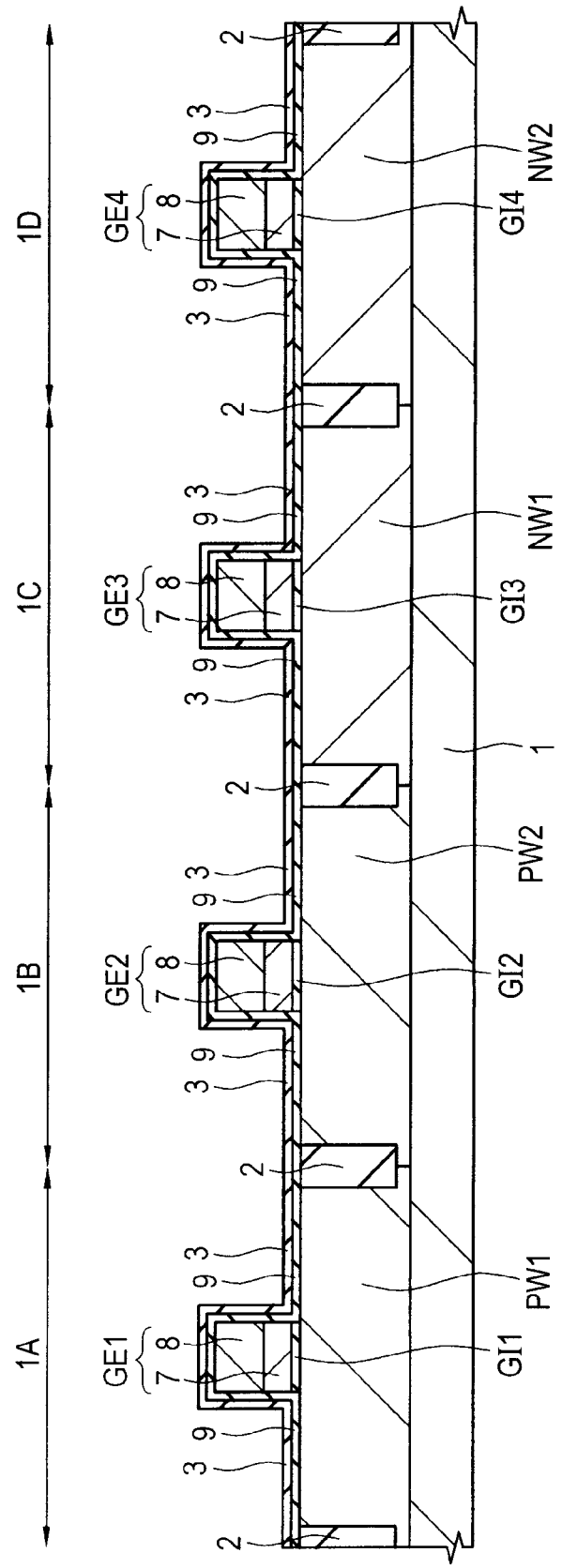
FIG. 57 is a cross-sectional view of a main part of another manufacturing step of the semiconductor device, following the step shown in FIG. 56.

That is, as shown in FIG. 57, the material film 3 is formed (deposited) over the main surface (entire main surface) of the semiconductor substrate 1, that is, over the protective film 9 in step S5*a*. The formation step of the material film 3 in this embodiment is basically the same as that in the first embodiment. However, in this embodiment, the material film is formed with the protective film 9 formed. This embodiment differs from the first embodiment in that the material film 3 is formed over the protective film 9. By forming the material film 3 over the protective film 9, the laminated film of the protective film 9 and the material film 3 over the protective film 9 is formed over the main surface of the semiconductor substrate 1 so as to cover the gate structures (gate electrodes GE1, GE2, GE3, and GE4).

The combination of the protective film 9 and the material film 3 serves as the offset spacer in the ion implantation IM1 as described later. Specifically, the protective film 9 and the material film 3 are formed such that the total of the thickness (formed thickness) of the protective film 9 and the thickness (formed thickness) of the material film 3 becomes an appropriate thickness as the offset spacer of the ion implantation IM1 to be performed later (which corresponds to the thickness $T_3$ in the first embodiment, and is, for example, about 2 to 5 nm).

Figure 58:
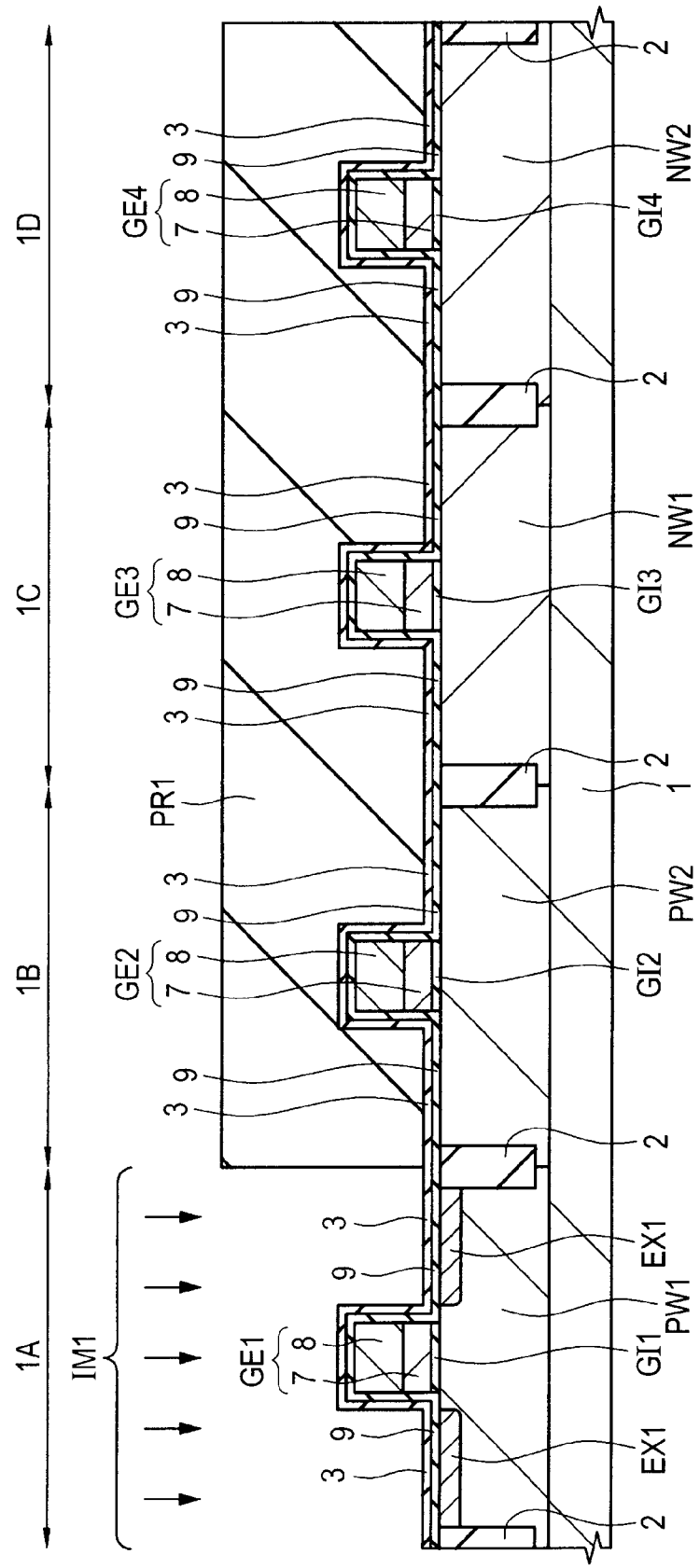
FIG. 58 is a cross-sectional view of a main part of another manufacturing step of the semiconductor device, following the step shown in FIG. 57.

Then, as shown in FIG. 58, the same photoresist pattern PR1 as that of the first embodiment is formed over the main surface of the semiconductor substrate 1, that is, over the material film 3 in step S6*a*. The photoresist patterns PR1, PR2, PR3, and PR4 in this embodiment are the same as those of the first embodiment, and thus a description thereof will be omitted below.

Then, in step S7*a*, the ion implantation IM1 is performed on the semiconductor substrate 1. The ion implantation IM1 (in step S7*a*) of this embodiment is basically the same as the ion implantation IM1 of the first embodiment. This embodiment differs from the first embodiment in the following point. Specifically, in the first embodiment, the gate structure (gate electrode GE1) in the nMIS region 1A and the material film 3 at the sidewalls thereover act as the ion implantation blocking mask, whereas in this embodiment, the gate structure (gate electrode GE1) in the nMIS region 1A, and the protective film 9 and material film 3 at the sidewalls thereover act as the ion implantation blocking mask. Thus, in this embodiment, no impurities are introduced (ion implanted) into a region directly under the gate electrode GE1 and into regions directly under the protective film 9 and the material film 3 at sidewalls of the gate electrode GE1 in the p-type well PW1 in the ion implantation IM1.

In the ion implantation IM1, n-type impurities are introduced (ion-implanted) into both species of the gate electrode GE1 over the semiconductor substrate 1 (p-type well PW1) in the nMIS region 1A to thereby form the extension regions EX1. The extension region EX1 is basically the same as that of the first embodiment, and thus a description thereof will be omitted below. Before or after the ion implantation IM1 (with the material film 3 and the photoresist pattern PR1 formed), another ion implantation (for example, halo-ion implantation) can be performed on the semiconductor substrate 1.

Figure 59:
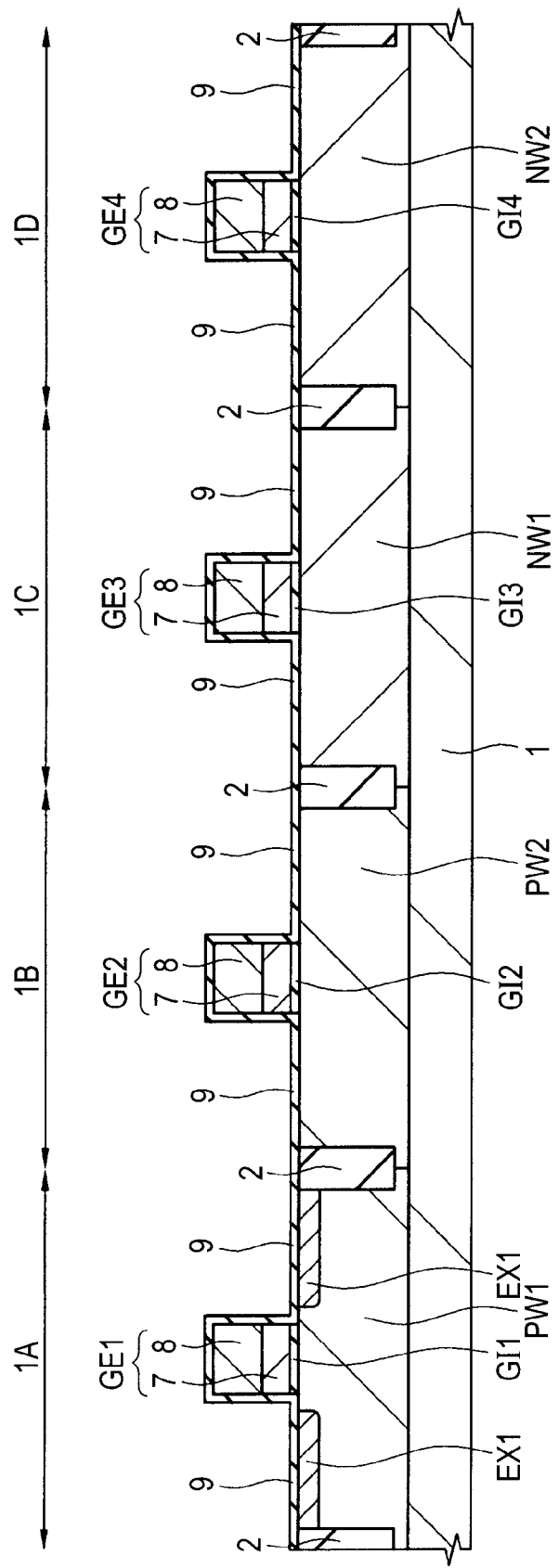
FIG. 59 is a cross-sectional view of a main part of another manufacturing step of the semiconductor device, following the step shown in FIG. 58.

Then, as shown in FIG. 59, the photoresist pattern PR1 is removed in step S8*a*, and further the material film 3 is removed in step S9*a*. The removal step of the photoresist pattern PR1 (in step S8*a*) and the removal step of the material film 3 (in step S9*a*) are basically the same as those of the first embodiment.

In this embodiment, the removal process of the material film 3 (in step S9*a*) is performed to expose the protective film 9. It is necessary not to expose the gate structures (gate electrodes GE1, GE2, GE3, and GE4) in the nMIS regions 1A and 1B and the pMIS regions 1C and 1D. At this time, the material film 3 does not preferably remain over the parts of the protective film 9 covering the gate structures (gate electrodes GE1, GE2, GE3, and GE4) in the nMIS regions 1A and 1B and the pMIS regions 1C and 1D (such that all parts of the protecting film 9 covering the gate structures are exposed). Thus, the removal process of the material film 3 (in step S9*a*)

needs to be performed under the etching condition in which the protective film 9 is difficult to etch as compared to the material film 3. That is, the material film 3 is removed by selectively etching, while the protective film 9 remains without being etching. Specifically, the material film 3 is subjected to wet etching under the etching condition in which the etching rate of the material film 3 is fifty or more times higher than that of the protective film 9 (that is, under the etching condition in which the etching selectivity of the material film 3 with respect to the protective film 9 is equal to or more than 50), whereby the removal process (in step S9a) of the material film 3 is performed. Thus, the material film 3 and the protective film 9 are formed of different materials so as to ensure the sufficient etching selectivity.

Figure 60:
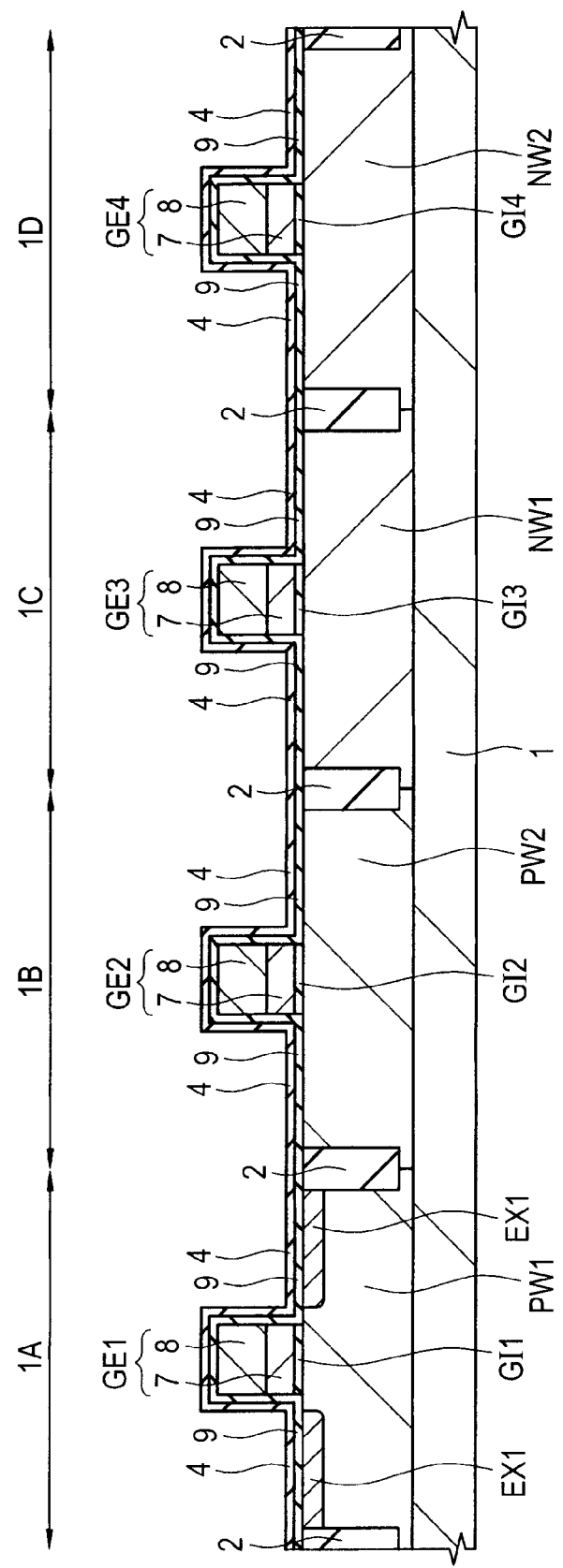
FIG. 60 is a cross-sectional view of a main part of another manufacturing step of the semiconductor device, following the step shown in FIG. 59.
Figure 61:
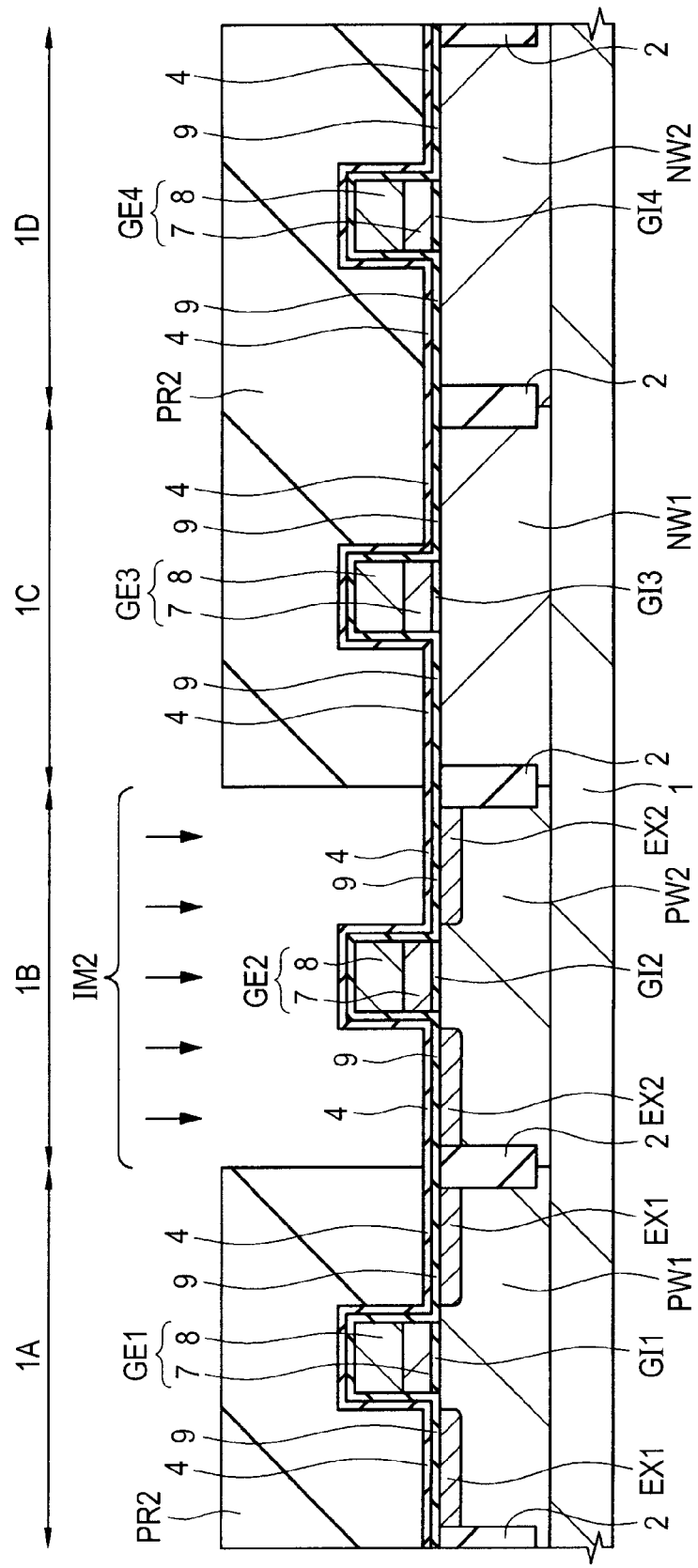
FIG. 61 is a cross-sectional view of a main part of another manufacturing step of the semiconductor device, following the step shown in FIG. 60.

Then, as shown in FIG. 60, the material film 4 is formed (deposited) over the main surface of the semiconductor substrate 1 (entire main surface) in step S5b, that is, over the protective film 9. The formation step of the material film 4 is basically the same as that in the first embodiment. However, this embodiment differs from the above first embodiment in that since the material film 4 is formed with the protective film 9 formed, the material film 4 is formed over the protective film 9. By forming the material film 4 over the protective film 9, the lamination of the protective film 9 and the material film 4 over the protective film 9 is formed over the main surface of the semiconductor substrate 1 so as to cover the gate structures (gate electrodes GE1, GE2, GE3, and GE4).

As mentioned later, the combination of the protective film 9 and the material film 4 to be described later serves as the offset spacer in the ion implantation IM2. Thus, the material film 4 is formed such that the total thickness of the thickness (formed thickness) of the protective film 9 and the thickness (formed thickness) of the material film 4 becomes an appropriate thickness as the offset spacer of the ion implantation IM2 to be performed later (that is, corresponding to the above thickness $T_4$ in the first embodiment, for example, about 2 to 5 nm).

Then, as shown in FIG. 1, in step S6b, the same photoresist pattern PR2 as that of the first embodiment is formed over the main surface of the semiconductor substrate 1, that is, the material film 4 in step S6b.

Then, the ion implantation IM2 is performed on the semiconductor substrate 1 in step S7b. The ion implantation IM2 (step S7b) performed in this embodiment is basically the same as the ion implantation IM2 performed in the first embodiment. This embodiment differs from the first embodiment in the following point. Specifically, in the first embodiment, the gate structure (gate electrode GE2) in the nMIS region 1B and the material film 4 at the sidewall thereof serve as the ion implantation blocking mask. In contrast, in this embodiment, the gate structure (gate electrode GE2) in the nMIS region 1B, and the protective film 9 and the material film 4 which are located at the sidewall thereof serve as the ion implantation blocking mask. Thus, in the ion implantation IM2 of this embodiment, no impurities are introduced (ion-implanted) into the region directly under the gate electrode GE2 and into the regions directly under the protective film 9 and the material film 4 of the gate electrode GE2 in the p-type well PW2.

In the ion implantation IM2, n-type impurities are introduced (ion-implanted) into both side regions of the gate electrode GE2 of the semiconductor substrate 1 (p-type well PW2) in the nMIS region 1B to thereby form the extension regions EX2. The extension region EX2 is basically the same as that of the first embodiment, and thus a description thereof will be omitted below. Before or after the ion implantation IM2 (with the material film 4 and the photoresist pattern PR2 formed), another ion implantation (for example, halo-ion implantation) can be performed on the semiconductor substrate 1.

Figure 62:
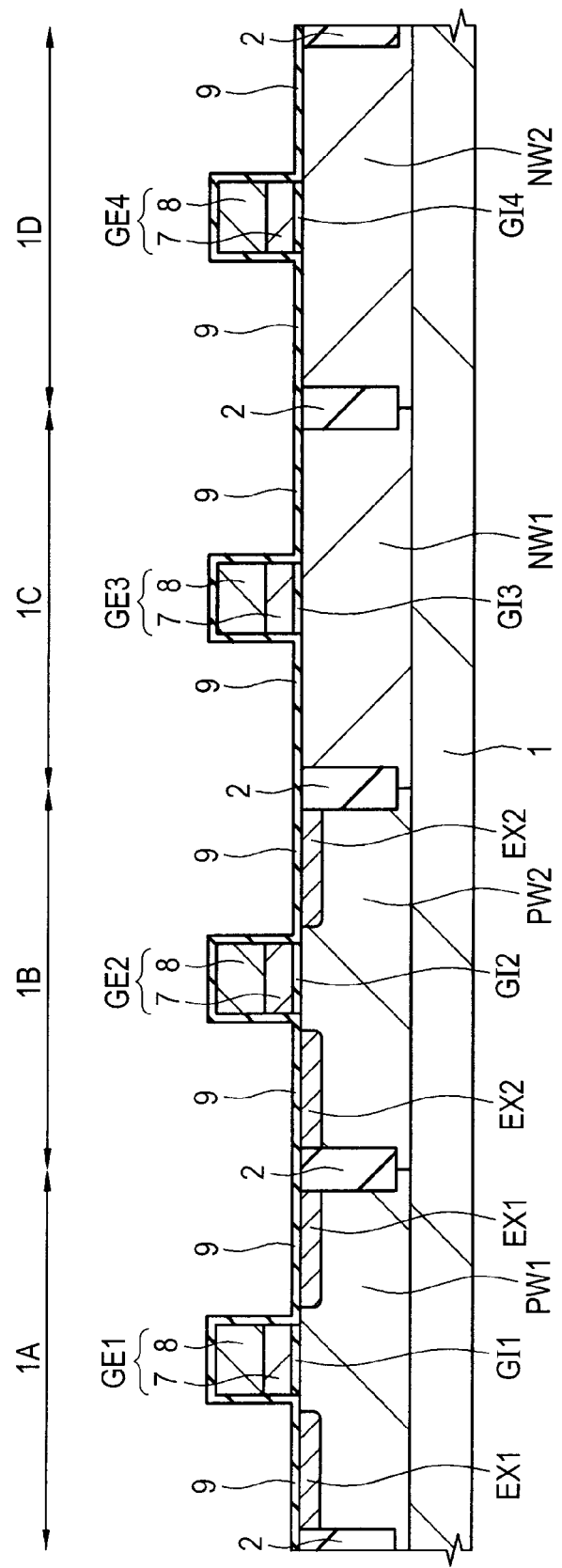
FIG. 62 is a cross-sectional view of a main part of another manufacturing step of the semiconductor device, following the step shown in FIG. 61.

Then, as shown in FIG. 62, the photoresist pattern PR2 is removed in step S8b, and further the material film 4 is also removed in step S9b. The removal step of the photoresist pattern PR2 (in step S8b) and the removal step of the material film 4 (in step S9b) are basically the same as those of the first embodiment.

When the removal step of the material film 4 is performed (in step S9b) in this embodiment, the protective film 9 is exposed. However, it is necessary not to expose the gate structures (gate electrodes GE1, GE2, GE3, and GE4) in the nMIS regions 1A and 1B and the pMIS regions 1C and 1D. At this time, preferably, the material film 4 does not remain over the protective film 9 covering the gate structures (gate electrodes GE1, GE2, GE3, and GE4) in the nMIS regions 1A and 1B and the pMIS regions 1C and 1D (that is, the entire protective film 9 covering the gate structures is exposed). Thus, the removal step of the material film 4 (in step S9b) needs to be performed under the etching condition that makes it difficult to etch the protective film 9 as compared to the material film 4. That is, the material film 4 is removed by being selectively etched, while the protective film 9 is hardly etched and left. Specifically, the material film 4 is subjected to the wet etching under the etching condition in which the etching rate of the material film 4 is fifty or more times higher than that of the protective film 9 (that is, under the etching condition in which the etching selectivity of the material film 4 to the protective film 9 is 50 or more), so that the removal process of the material film 4 is performed (in step S9b). For this reason, the material film 4 and the material film 9 are formed of different materials so as to ensure the sufficient etching selectivity.

Figure 63:
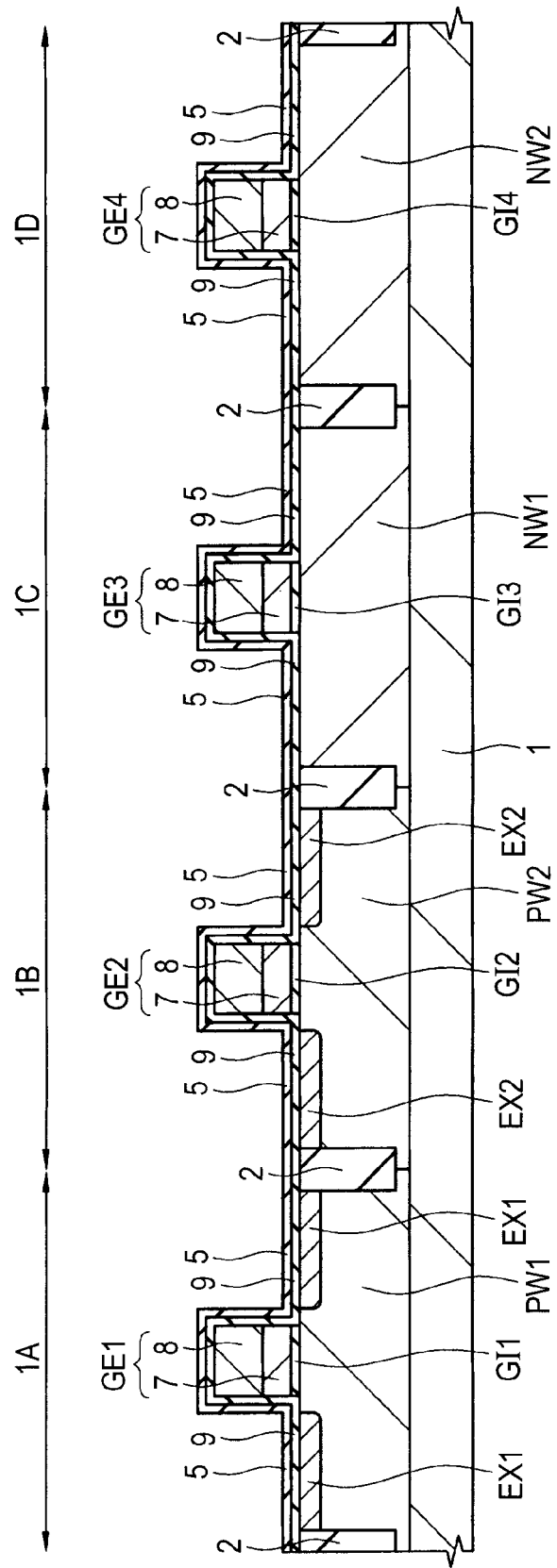
FIG. 63 is a cross-sectional view of a main part of another manufacturing step of the semiconductor device, following the step shown in FIG. 62.

Then, as shown in FIG. 63, the material film 5 is formed (deposited) over the main surface (entire main surface) of the semiconductor substrate 1, that is, over the protective film 9 in step S5c. The formation step of the material film 5 is basically the same as that of the first embodiment. In this embodiment, the material film 5 is formed with the protective film 9 formed. This embodiment differs from the first embodiment in that the material film 5 is formed over the protective film 9. By forming the material film 5 over the protective film 9, the laminated film of the protective film 9 and the material film 5 over the protective film 9 is formed over the main surface of the semiconductor substrate 1 so as to cover the gate structures (gate electrodes GE1, GE2, GE3, and GE4).

The combination of the protective film 9 and the material film 5 serves as the offset spacer in the ion implantation IM3 as described later. Specifically, the protective film 5 is formed such that the total of the thickness (formed thickness) of the protective film 9 and the thickness (formed thickness) of the material film 3 becomes an appropriate thickness as the offset spacer of the ion implantation IM3 to be performed later (which corresponds to the thickness T5 in the first embodiment, and is, for example, about 2 to 5 nm).

Figure 64:
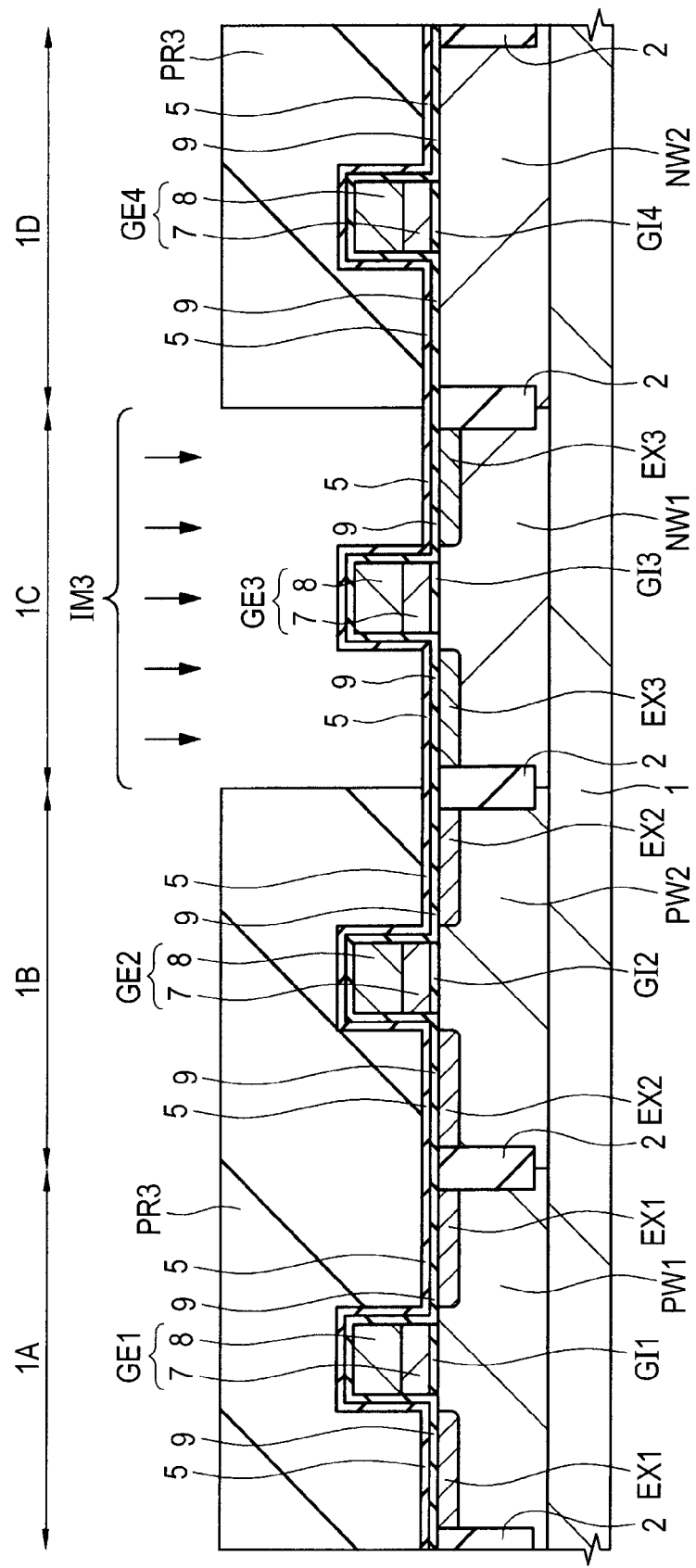
FIG. 64 is a cross-sectional view of a main part of another manufacturing step of the semiconductor device, following the step shown in FIG. 63.

Then, as shown in FIG. 64, the same photoresist pattern PR3 as that of the first embodiment is formed over the main surface of the semiconductor substrate 1, that is, the material film 5 in step S6c.

Next, in step S7c, the ion implantation IM3 is performed on the semiconductor substrate 1. The ion implantation IM3 (in step S7c) of this embodiment is basically the same as the ion implantation IM3 of the first embodiment. In the first embodiment, the gate structure (gate electrode GE3) in the pMIS region 1C and the material film 5 at sidewalls thereof function as the ion implantation blocking mask. This embodiment differs from the first embodiment in that the gate structure (gate electrode GE3) in the pMIS region 1C and the protective film 9 and the material film 5 at the sidewalls thereof function as the ion implantation blocking mask. Thus, in this embodiment, in the ion implantation IM3, no impurities are introduced (ion-implanted) into a region directly under the gate electrode G3, and regions directly under the protective film 9 and the material film 5 at the sidewalls of the gate electrode G3 in the n-type well NW1.

In the ion implantation IM3, p-type impurities are introduced (ion-implanted) into both side regions of the gate electrode GE3 of the semiconductor substrate 1 (n-type well NW1) in the pMIS region 1C to thereby form the extension regions EX3. The extension region EX3 is basically the same as that of the first embodiment, and thus a description thereof will be omitted below. Before or after the ion implantation IM3 (with the material film 5 and the photoresist pattern PR3 formed), another ion implantation (for example, halo-ion implantation) can be performed on the semiconductor substrate 1.

Figure 65:
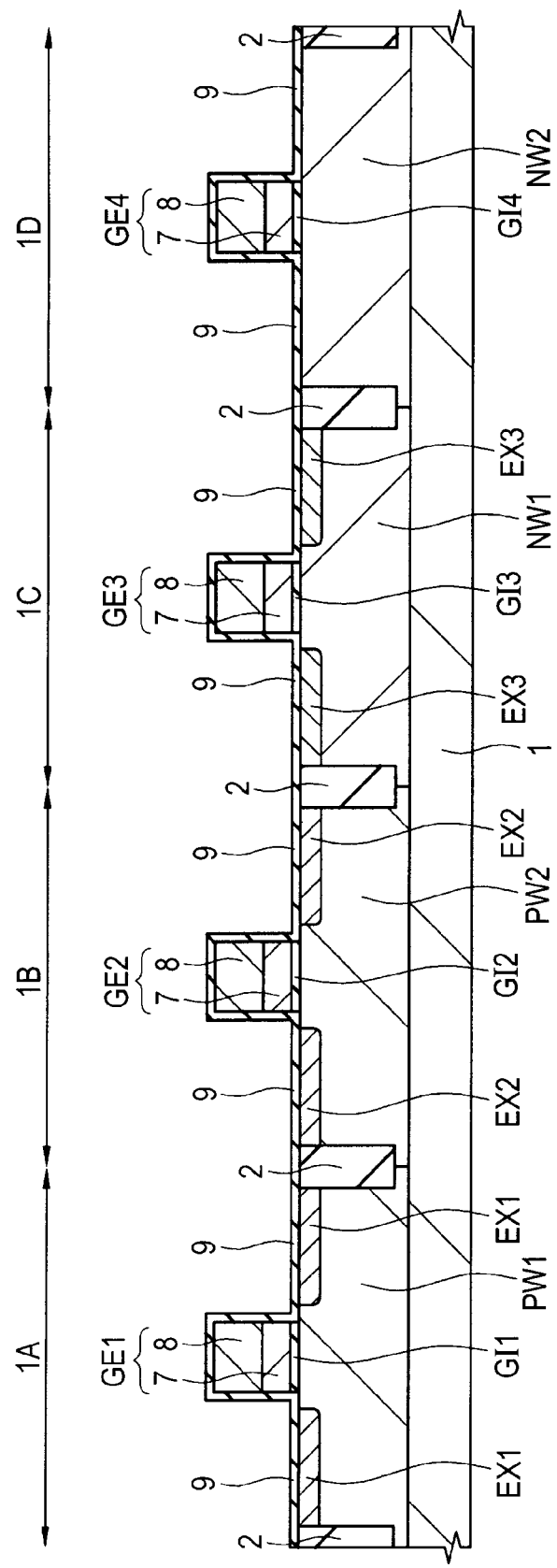
FIG. 65 is a cross-sectional view of a main part of another manufacturing step of the semiconductor device, following the step shown in FIG. 64.

Then, as shown in FIG. 65, the photoresist pattern PR3 is removed in step S8c, and further the material film 5 is removed in step S9c. The removal step of the photoresist pattern PR3 (in step S8c) and the removal step of the material film 5 (in step S9c) are basically the same as those of the first embodiment.

In this embodiment, the removal process of the material film 5 (in step S9c) is performed to expose the protective film 9. It is necessary not to expose the gate structures (gate electrodes GE1, GE2, GE3, and GE4) in the nMIS regions 1A and 1B and the pMIS regions 1C and 1D. At this time, the material film 5 does not preferably remain over the parts of the protective film 9 covering the gate structures (gate electrodes GE1, GE2, GE3, and GE4) in the nMIS regions 1A and 1B and the pMIS regions 1C and 1D (such that all parts of the protecting film 9 covering the gate structures are exposed). Thus, the removal process of the material film 5 (in step S9c) needs to be performed under the etching condition in which the protective film 9 is difficult to etch as compared to the material film 5. That is, the material film 5 is removed by selectively etching, while the protective film 9 remains without being etching. Specifically, the material film 5 is subjected to wet etching under the etching condition in which the etching rate of the material film 5 is fifty or more times higher than that of the protective film 9 (that is, under the etching condition in which the etching selectivity of the material film 5 with respect to the protective film 9 is equal to or more than 50). Thus, the removal process of the material film 5 is performed (in step S9c). The material film 5 and the protective film 9 are formed of different materials so as to ensure the sufficient etching selectivity.

Figure 66:
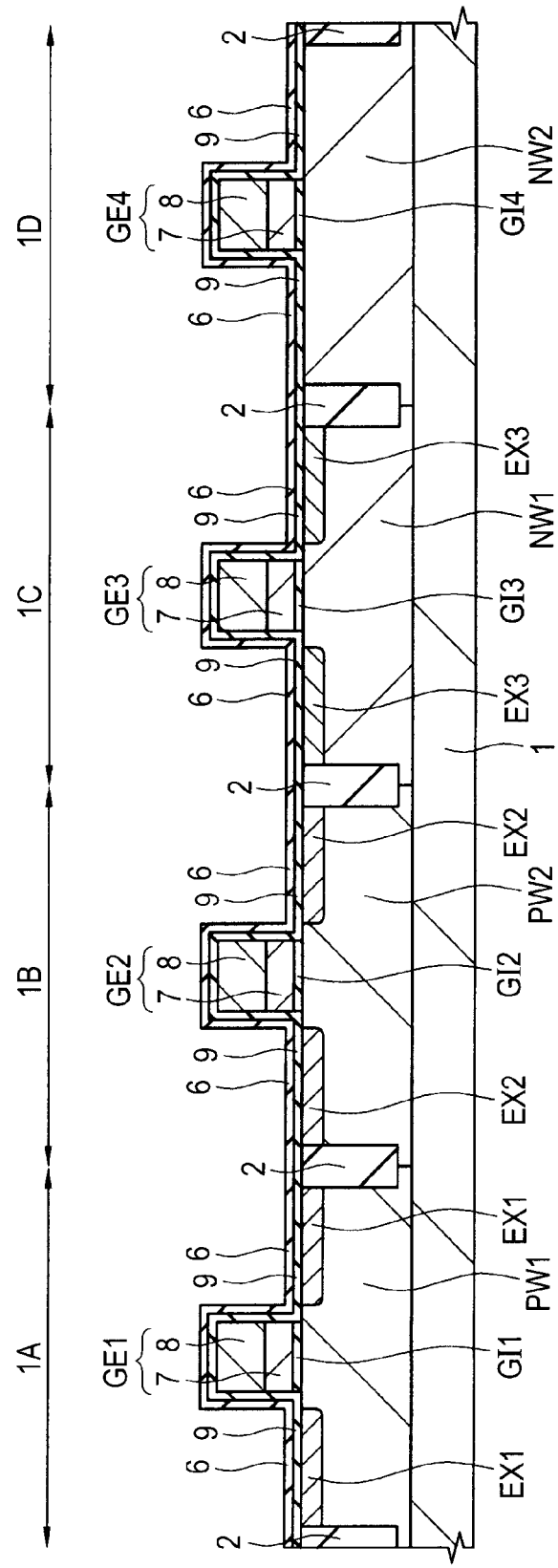
FIG. 66 is a cross-sectional view of a main part of another manufacturing step of the semiconductor device, following the step shown in FIG. 65.

Then, as shown in FIG. 66, the material film 6 is formed (deposited) over the main surface (entire main surface) of the semiconductor substrate 1, that is, over the protective film 9 in step S5d. The formation step of the material film 6 is basically the same as that in the first embodiment. However, this embodiment differs from the above first embodiment that since the material film 6 is formed with the protective film 9 formed, the material film 6 is formed over the protective film 9. By forming the material film 6 over the protective film 9, the lamination of the protective film 9 and the material film 6 over the protective film 9 is formed over the main surface of the semiconductor substrate 1 so as to cover the gate structures (gate electrodes GE1, GE2, GE3, and GE4).

As mentioned later, the combination of the protective film 9 and the material film 6 serves as the offset spacer in the ion implantation IM4. Thus, the material film 6 is formed such that the total thickness of the thickness (formed thickness) of the protective film 9 and the thickness (formed thickness) of the material film 6 becomes an appropriate thickness as the offset spacer of the ion implantation IM4 to be performed later (that is, corresponding to the above thickness $T_6$ in the first embodiment, for example, about 2 to 5 nm).

Figure 67:
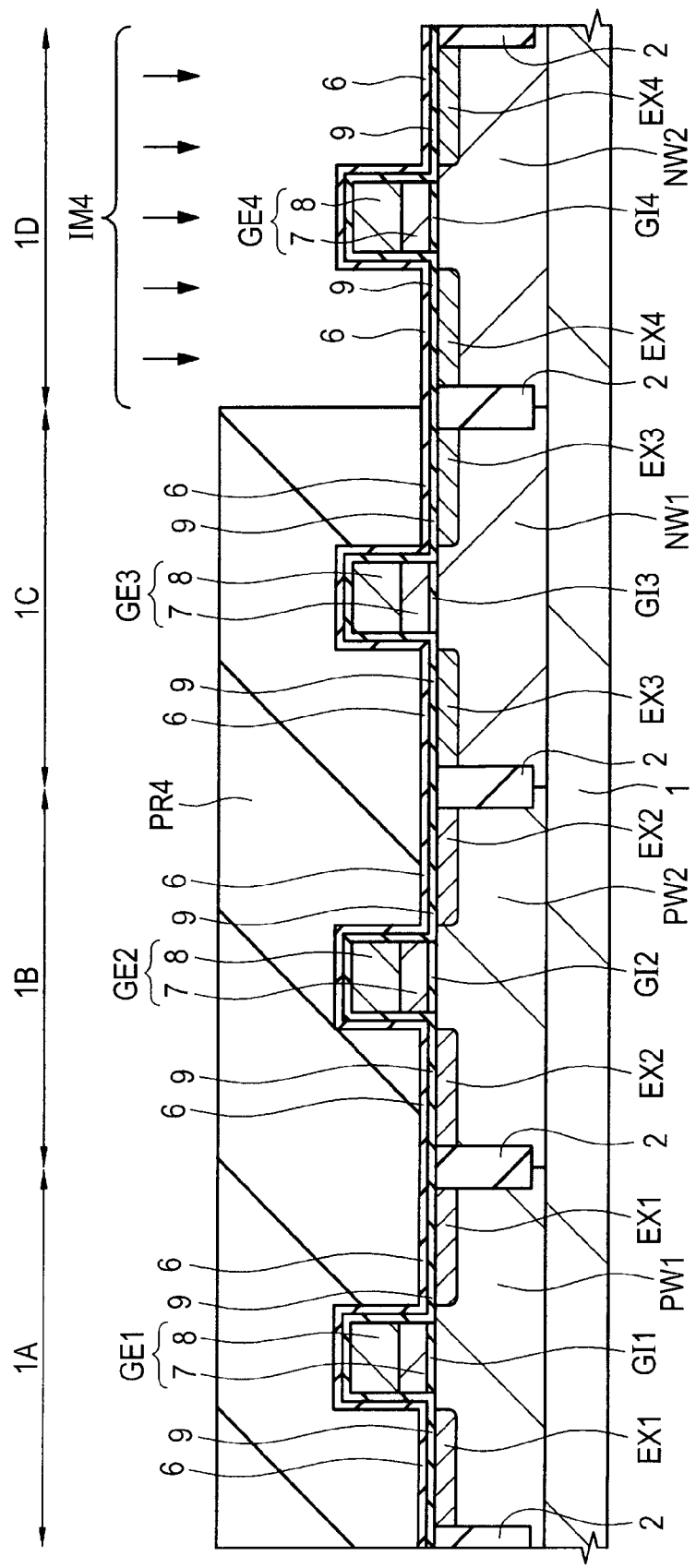
FIG. 67 is a cross-sectional view of a main part of another manufacturing step of the semiconductor device, following the step shown in FIG. 66.

Then, as shown in FIG. 67, the same photoresist pattern PR4 as that of the first embodiment is formed over the main surface of the semiconductor substrate, that is, the material film 6 in step S6d.

Next, in step S7d, the ion implantation IM4 is performed over the semiconductor substrate 1. The ion implantation IM4 of this embodiment (in step S7d) is basically the same as the ion implantation IM4 of the first embodiment. In the first embodiment, the gate structure (gate electrode GE4) in the pMIS region 1D and the material film 6 at the sidewalls of the gate structure act as the ion implantation blocking mask. In contrast, in this embodiment, the gate structure (gate electrode GE4) in the pMIS region 1D and the protective film 9 and material film 6 at the sidewall thereof serve as the ion implantation blocking mask. Thus, in this embodiment, in the ion implantation IM4, no impurities are introduced (ion-implanted) into a region directly under the gate electrode GE4 and into regions under the protective film 9 and the material film 6 of the gate electrode GE4 in the n-type well NW2.

In the ion implantation IM4, p-type impurities are introduced (ion-implanted) into both side regions of the gate electrode GE4 of the semiconductor substrate 1 (n-type well NW2) in the pMIS region 1D to thereby form the extension regions EX4. The extension region EX4 is basically the same as that of the first embodiment, and thus a description thereof will be omitted below. Before or after the ion implantation IM4 (with the material film 5 and the photoresist pattern PR4 formed), another ion implantation (for example, halo-ion implantation) can be performed on the semiconductor substrate 1.

Figure 68:
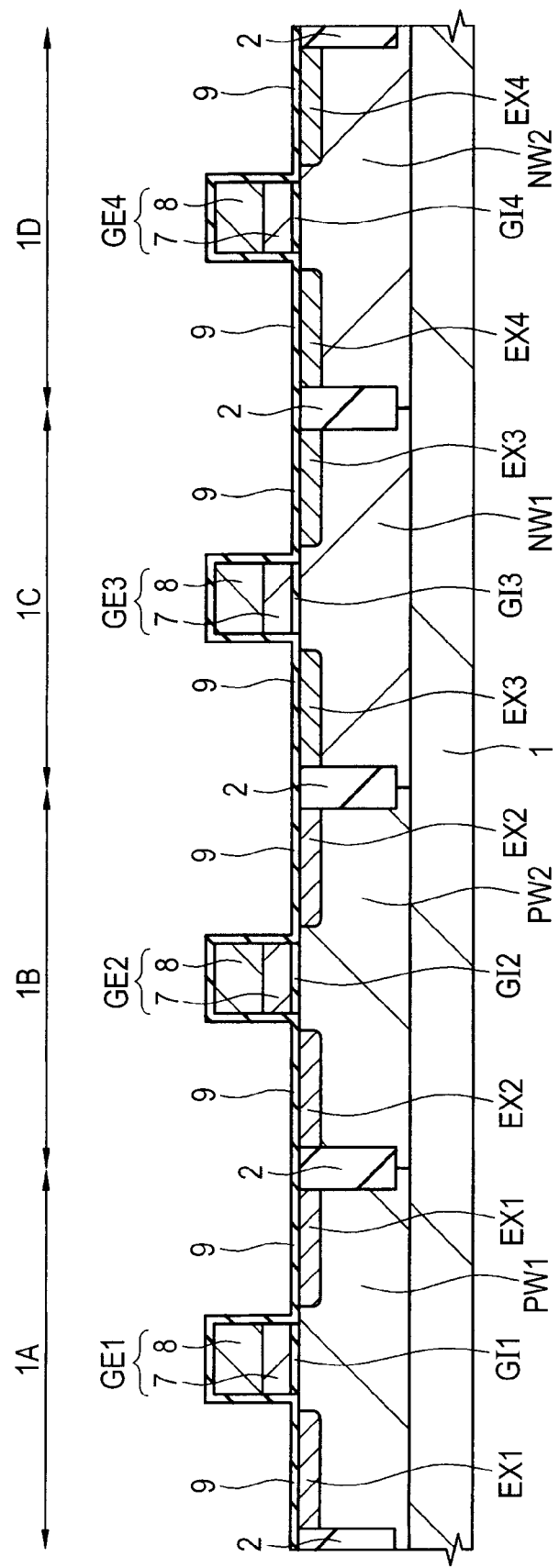
FIG. 68 is a cross-sectional view of a main part of another manufacturing step of the semiconductor device, following the step shown in FIG. 67.
Figure 69:
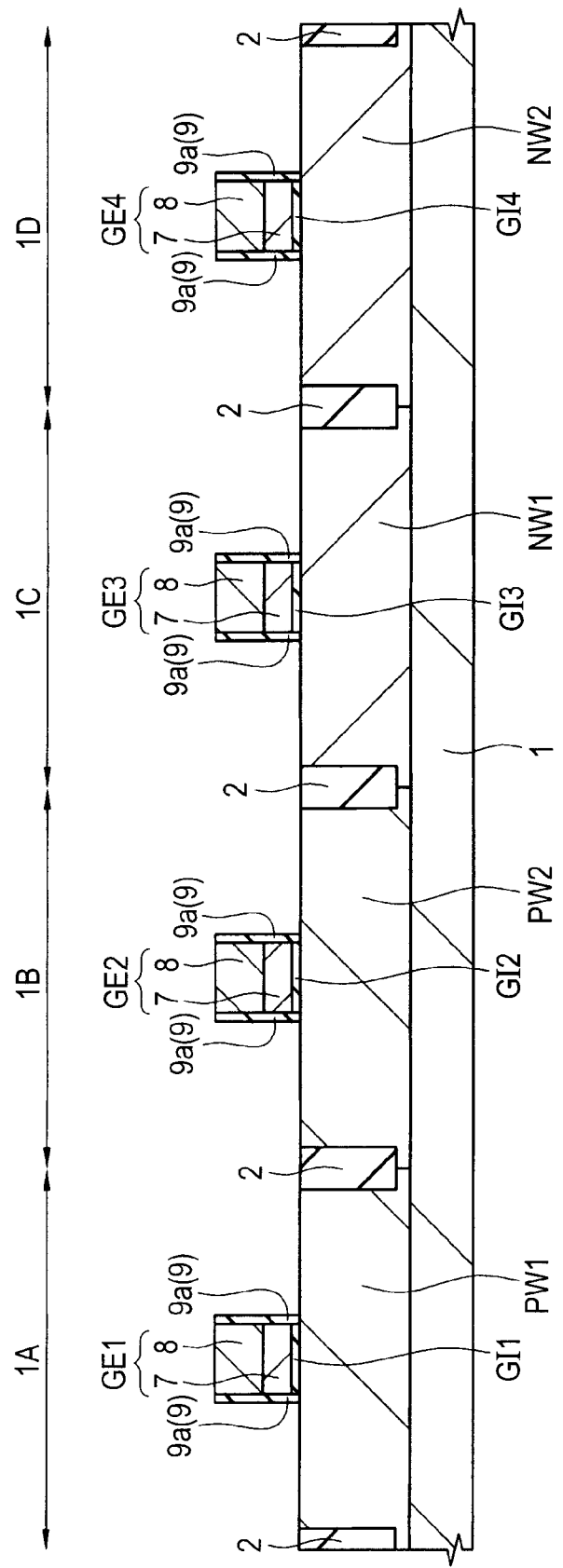
FIG. 69 is a cross-sectional view of a main part of another manufacturing step of a semiconductor device according to another embodiment of the invention.

Then, as shown in FIG. 68, the photoresist pattern PR4 is removed in step S8d, and further the material film 6 is removed in step S9d. The removal step of the photoresist pattern PR4 (in step S8d) and the removal step of the material film 6 (in step S9d) are basically the same as those of the first embodiment.

When the removal step of the material film 6 is performed (in step S9d) in this embodiment, the protective film 9 is exposed. However, it is necessary not to expose the gate structures (gate electrodes GE1, GE2, GE3, and GE4) in the nMIS regions 1A and 1B and the pMIS regions 1C and 1D. At this time, preferably, the material film 6 does not remain over the protective film 9 covering the gate structures (gate electrodes GE1, GE2, GE3, and GE4) in the nMIS regions 1A and 1B and the pMIS regions 1C and 1D (that is, the entire protective film 9 covering the gate structures is exposed). Thus, the removal step of the material film 6 (in step S9d) needs to be performed under the etching condition that makes it difficult to etch the protective film 9 as compared to the material film 6. That is, the material film 6 is removed by being selectively etched, while the protective film 9 is hardly etched and left. Specifically, the material film 6 is subjected to the wet etching under the etching condition in which the etching rate of the material film 6 is fifty or more times higher than that of the protective film 9 (that is, under the etching condition in which the etching selectivity of the material film 6 to the protective film 9 is 50 or more), so that the removal process of the material film 6 is performed (in step S9d). For this reason, the material film 6 and the material film 9 are formed of different materials so as to ensure the sufficient etching selectivity.

Then, the step S10 (formation step of the sidewall spacer SW), the step S11 (formation step of source and drain regions SD1, SD2, SD3, and SD4), the step S12 (activation annealing step), and the following steps are performed in the same way as that in the first embodiment, and thus an illustration and description thereof will be omitted below. In another embodiment, after the material film 6 is removed in step S9d, the protective film 9 is further removed by wet etching or the like, so that the process in step S10 (formation step of sidewall spacer SW) can be performed.

Like the first embodiment, even in this embodiment, every time the resist pattern (corresponding to each of photoresist patterns PR1, PR2, PR3, and PR4) used as the ion implantation blocking mask is re-created before step S10 (formation step of the sidewall spacer SW) after step S4 (formation step of gate electrode), the film for the offset spacer (corresponding to the material films 3, 4, 5, and 6) is re-created. Thus, upon removing the material films 3, 4, 5, and 6, the resist residues or implantation species remaining on the material films 3, 4, 5, and 6 can be easily removed. Additionally, the respective re-created material films 3, 4, 5, and 6 having a predetermined thickness is used to perform ion implantation, so that the thickness of the offset spacer can be accurately controlled to a predetermined one. This arrangement can stabilize the characteristics of the MISFET to improve the performance of the semiconductor device.

In this embodiment, since the protective film 9 is formed so as to cover the gate structures (gate electrodes GE1, GE2, GE3, and GE4), the protective film 9 is exposed when the film for the offset spacer is removed in step S9 (including steps S9a, S9b, S9c, and S9d). The gate electrodes GE1, GE2, GE3, and GE4 remain covered with the protective film 9, and thus, can be prevented from being exposed to the outside. Thus, in the removal process (wet etching step) of the film for the offset spacer in step S9 (including steps S9a, S9b, S9c, and S9d), the damage on or etching of the gate electrodes GE1, GE2, GE3, and GE4 due to exposure to the chemical (etchant) or the like can be surely prevented. Thus, the shape of the gate electrode can be stabilized, and thus the characteristics of the MISFET can also be stabilized, which can improve the performance of the semiconductor device.

That is, in this embodiment, the film for the offset spacer is comprised of a laminated film of the protective film 9 and the material film (corresponding to each of the material films 3, 4, 5, and 6). Every time the resist pattern (corresponding to the photoresist patterns PR1, PR2, PR3, and PR4) is re-created, the material film is also re-created, but the protective film is not re-created, which prevents the gate electrodes GE1, GE2, GE3, and GE4 from being exposed to the outside. In the removal step of the material films 3, 4, 5, and 6, the etching condition is set such that the etching selectivity of the material films 3, 4, 5, and 6 with respect to the protective film 9 becomes sufficiently large (specifically, 50 or more). Under such an etching condition, each of the material films 3, 4, 5, and 6 can be selectively etched and removed while suppressing or preventing the etching of the protective film 9. Thus, the combination of the material for the protective film 9 and the material for the material films 3, 4, 5, and 6 can be set so as to ensure the adequate etching selectivity, and the appropriate chemical (etchant) is selected and used so as to ensure the high etching selectivity, whereby the removal processes of the material films 3, 4, 5, and 6 (in steps S9a, S9b, S9c, and S9d) may be performed.

Thus, in the removal processes of the material films 3, 4, 5, and 6 (in steps S9a, S9b, S9c, and S9d), the decrease in thickness of the protective film 9 due to the etching can be suppressed or prevented, while preventing the exposure of the gate electrode to the outside, so that the thicknesses of the protective films 9 in different stages of the ion implantations IM1, IM2, IM3, and IM4 can be substantially the same. Thus, the formed thicknesses of the respective material films 3, 4, 5, and 6 are controlled in steps S5a, S5b, S5c, and S5d, which can accurately control the thickness of the offset spacer in each of the ion implantations IM1, IM2, IM3, and IM4 (which is the total thickness of the protective film 9 and any one of the material films 3, 4, 5, and 6) to a corresponding predetermined thickness. This embodiment can solve the problem that the thickness of the offset spacer is gradually decreased every ion implantation, which would be caused in the first and second comparative examples.

The materials films 3, 4, 5, and 6 tend to be removed (that is, tend to be removed in steps S9a, S9b, S9c, and S9d). In contrast, the protective film 9 is preferably difficult to remove (that is, in steps S9a, S9b, S9c, and S9d, which is difficult to remove). Taking into consideration these requirements, the materials for the material films 3, 4, 5, and 6 and the material for the protective 9 needs to be selected. Thus, the protective film 9 is formed of a material different from the materials of the material films 3, 4, 5, and 6. Specifically, suitable materials for the protective film 6 include the following.

That is, a silicon nitride film is more preferably used as the material films 3, 4, 5, and 6. The silicon nitride film is easily removed by the wet etching. The material films 3, 4, 5, and 6 made of the silicon nitride film can be more accurately removed in the removal processes of the material films 3, 4, 5, and 6 (in step S9a, S9b, S9c, and S9d). In use of the silicon nitride film for the material films 3, 4, 5, and 6, the chemical (etchant) used in steps S9a, S9b, S9c, and S9d is the same as those of the first embodiment.

The protective film 9 suitably used can include a silicon oxide film, a Hf-based oxide film, a Zr-based oxide film, an Al(aluminum) film, a Ni(nickel) film, a W(tungsten) film, a Co(cobalt) film, a Ti(titanium) film, or an alloy film containing as a principal component one or more elements selected from the group consisting of Al, Ni, W, Co, and Ti. Since the protective film 9 is made of such a material, the material films 3, 4, 5, and 6 can be more accurately removed by the etching in the removal processes of the material films 3, 4, 5, and 6 (in steps S9a, S9b, S9c, and S9d).

The combination of each of the material films 3, 4, 5, and 6 and the protective film 9 is formed more preferably by forming each of the material films 3, 4, 5, and 6 using a silicon nitride film, and forming the protective film 9 using a Hf-based oxide film or a Zr-based oxide film. The use of the combination can sufficiently increase the resistance to etching of the protective film 9 against the etchant (preferably a thermal phosphoric acid) used in removing the material films 3, 4, 5, and 6 made of the silicon nitride film (that is, in steps S9a, S9b, S9c, and S9d). Thus, the etching of the protective film 9 can more surely be prevented while surely removing the material films 3, 4, 5, and 6.

The Hf-based oxide film is an insulating film containing Hf (hafnium) and O(oxygen) as a principal component. The Hf-based oxide film can be typified by a hafnium oxide film (HfO film, typified by an $HfO_2$ film). The Zr-based oxide film is an insulating film containing Zr(zirconium) and O(oxygen) as a principal component. The Zr-based oxide film can be typified by a zirconium oxide film (ZrO film, typified by a $ZrO_2$ film).

The Hf-based oxide film contains Hf (hafnium) and O(oxygen) as a principal component. The Hf-based oxide film can also contain another element in addition to Hf (hafnium) and O(oxygen). Thus, the Hf-based oxide film can be a HfON film (oxynitriding hafnium film, or hafnium oxinitride film), a HfSiON film (hafnium silicon oxynitride film), a HfSiO film (hafnium silicate film), or a HfZrO film (hafnium zirconium oxide film). The Zr-based oxide film contains Zr(zirconium) and O(oxygen) as a principal component. The Zr-based oxide film can also contain another element in addition to Zr(zirconium) and O(oxygen).

The HfO film is an insulating material film composed of hafnium (Hf) and oxygen (O). The HfON film is an insulating material film composed of hafnium (Hf), oxygen (O), and nitrogen (N). The HfSiON film is an insulating material film compose of hafnium (Hf), silicon (silicon, Si), oxygen (O), and nitrogen (N). The HfSiO film is an insulating material film composed of hafnium (Hf), silicon (silicon, Si), and oxygen (O). The HfZrO film is an insulating material film composed of hafnium (Hf), zirconium (Zr), and oxygen (O). The ZrO film is an insulating material film composed of zirconium (Zr) and oxygen (O).

Suitable materials for the material films 3, 4, 5, and 6 and the protective film 9 are described above, and other combinations thereof can include, for example, the following. For example, the material films 3, 4, 5, and 6 each are formed using a silicon oxide film (CVD oxide film). The protective film 9 is formed using a silicon nitride film, an Al(aluminum) film, a Ni(nickel) film, a W(tungsten) film, a Co(cobalt) film, a Ti(titanium) film, or an alloy film containing one or more elements selected from the group consisting of Al, Ni, W, Co, and Ti as a principal component. Alternatively, the material films 3, 4, 5, and 6 each are formed using an Al(aluminum) film, a Ni(nickel) film, a W(tungsten) film, a Co(cobalt) film, or a Ti(titanium) film, or an alloy film containing one or more elements selected from the group consisting of Al, Ni, W, Co, and Ti. And, the protective film 9 is formed using a silicon nitride, a silicon oxide film (CVD oxide film), a Hf-based oxide film, or a Zr-based oxide film. In this case, the chemicals (etchants) usable in steps S9a, S9b, S9c, and S9d are described above about the material used for the material film 3 in the first embodiment.

When an insulating film is used as the protective film 9, the process in step S10 (formation step of the sidewall spacer SW) can be performed without removing the protective film 9, or the process in step S10 can be performed after removing the protective film 9. When a conductive film (especially, a metal film as mentioned above) is used as the protective film 9, the process in step S10 is preferably performed after removing the protective film 9 (because the conductive film is not left over the semiconductor substrate 1). When the above metal film is used as the protective film 9, the same chemical as that used in step S9a of the first embodiment including the material film 3 made of the above metal material can be used for removal of the protective film.

The protective film 9 may have such a thickness as to protect the gate electrodes GE1, GE2, GE3, and GE4 in the removal step of the material films 3, 4, 5, and 6 in steps S9a, S9b, S9c, and S9d. More specifically, the protective film 9 is made thin enough to protect the gate electrodes, and the ratio of the thickness of the protective film 9 to that of the offset spacer is lowered, whereby the thickness of the entire film serving as the offset spacer can be controlled only by the thickness of each of the material films 3, 4, 5, and 6. From this viewpoint, the formed thickness of the protective film 9 (thickness formed as shown in FIG. 56) is more preferably smaller (thinner) than that of the material films 3, 4, 5, and 6 formed in steps S5a, S5b, S5c, and S5d. As one example, the thickness of the entire offset spacer (the total thickness of any one of the material films 3, 4, 5, and 6 and the protective film 9) is set to about 2 to 5 nm, and can be assigned to the thickness of any one of the material films 3, 4, 5, and 6 and the thickness of the formed protective film 9 in a ratio of about 2:1.

In this embodiment, the application of a metal gate electrode to the gate electrodes (gate electrodes GE1, GE2, GE3, and GE4) has a very great effect. This is because the metal film forming the metal gate electrode tends to have a low resistance to the etchant used in the removal processes of the material films 3, 4, 5, and 6 in steps S9a, S9b, S9c, and S9d as compared to the polysilicon film. In this embodiment, the formation of the protective film 9 prevents the exposure of the gate electrodes in the removal steps of the material films 3, 4, 5, and 6 in steps S9a, S9b, S9c, and S9d. In this embodiment, when the gate electrode is formed of the metal gate electrode, the metal gate electrodes can be prevented from being exposed to the chemicals (etchants) used in the removal processes of the material films 3, 4, 5, and 6 in steps S9a, S9b, S9c, and S9d, which can surely prevent the damage or etching of the metal gate electrode due to the etchant. In use of the metal gate electrode, a high-k film (high dielectric film) is often used as the gate insulating films GI1, GI2, G13, and GI4. The high-k film also has a low resistance to the chemical (etchant) used in the removal processes of the material films 3, 4, 5, and 6 in steps S9a, S9b, S9c, and S9d. However, this embodiment can solve the problems because of the protection by the protective film 9.

Fourth Embodiment

This embodiment corresponds to a modified example of the third embodiment. FIGS. 69 to 81 are cross-sectional views of main parts of manufacturing steps of a semiconductor device of this embodiment, and show the same sectional regions as those shown in FIGS. 3 to 29 and in FIGS. 55 to 68.

In the above third embodiment, the protective film 9 for the gate electrodes GE1, GE2, GE3, and GE4 is formed over the main surface (entire main surface) of the semiconductor substrate 1, covering the sidewalls and the upper surfaces of the gate structures (gate electrodes GE1, GE2, GE3, and GE4). In contrast, in this embodiment, the protective film 9a for the gate structures (gate electrode GE1, GE2, GE3, and GE4) is selectively formed over the sidewalls of the gate structures (gate electrodes GE1, GE2, GE3, and GE4). Other processes except for the above process are substantially the same as those of the third embodiment. Now, the process will be specifically described below with reference to FIGS. 69 to 81.

The protective film 9a corresponds to the protective film 9 of the third embodiment. The protective films 9a are selectively formed over the sidewalls of the gate structures (gate electrodes GE1 GE2, GE3, and GE4), while no protective film is formed over other remaining regions (upper surface of each gate structure, and main surface of the semiconductor substrate 1 in a region not covered with the gate structure). The protective film 9a is substantially the same as the protective film 9 of the third embodiment except for the regions with the protective films 9a formed, and thus a detailed description thereof will be omitted below. The sidewall of the gate structure is the same as the side of the gate structure.

The formation method of the protective film 9a is as follows. That is, like the third embodiment, after the structure shown in FIG. 56 is obtained with the protective film 9 formed, some parts of the protective films 9 are left at the sidewall of the gate structures (gate electrodes GE1, GE2, GE3, and GE4) to provide a protective film 9a. And other remaining parts of the protective films 9 (over the upper surface of the gate structure and over the main surface of the semiconductor substrate 1 not covered with the gate structures) are removed. Thus, the protective films 9 are selectively left over the sidewalls of the gate structures (gate electrodes GE1, GE2, GE3, and GE4) to provide the protective films 9a over the sidewalls of the gate structures (gate electrodes GE1, GE2, GE3, and GE4). This can be performed, for example, by applying anisotropic etching to the protective film 9. When the Hf-based oxide film or the Zr-based oxide film is used as the protective film 9, the entire etching back process is performed on the entire surface by dry etching after depositing the protective film 9. Some damages are made on the protective film 9 over the upper surface of the gate structure and over the upper surface of the substrate not covered with the gate structure. This results in an increase of etching rate by use of a chemical, such as hydrofluoric acid. When the protective film 9 is formed of the Hf-based oxide film or Zr-based oxide film, the combination of dry etching and wet etching can easily form the protective film 9a comprised of the Hf-based oxide film or Zr-based oxide film at only the sides of the gate structures (gate electrodes GE1, GE2, GE3, and GE4).

The following processes are basically the same as those of the third embodiment.

Figure 70:
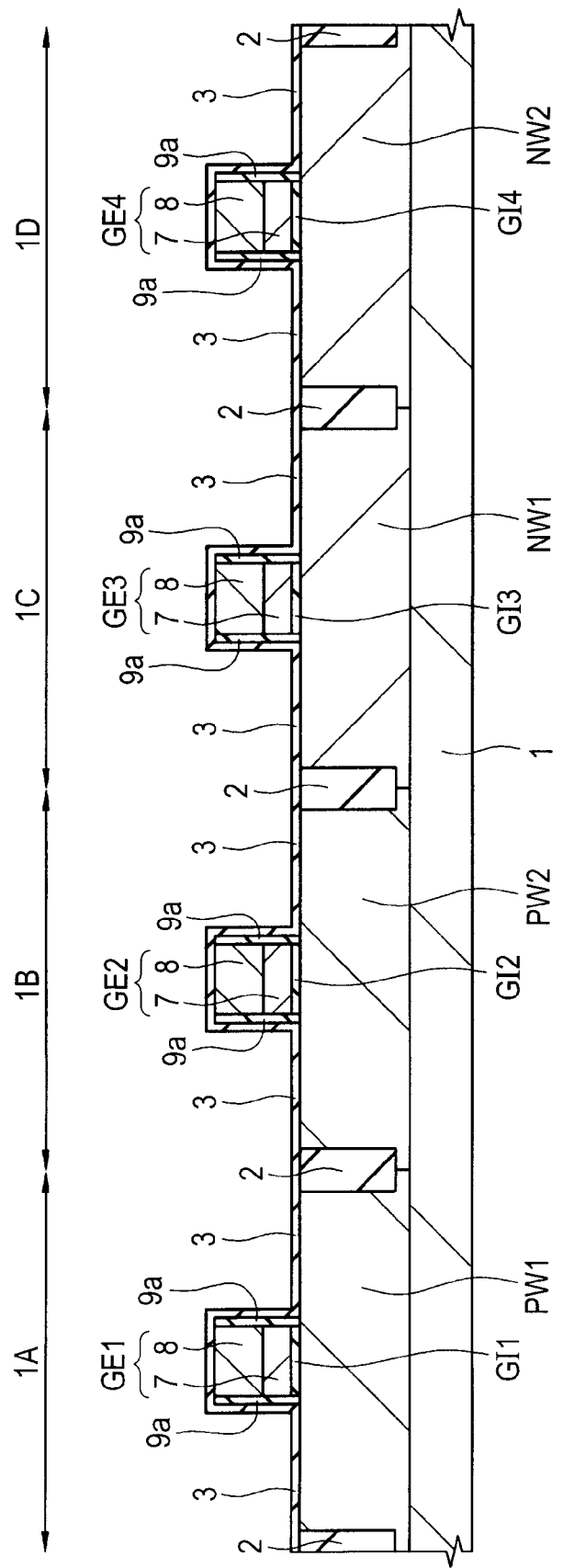
FIG. 70 is a cross-sectional view of a main part of another manufacturing step of the semiconductor device, following the step shown in FIG. 69.

That is, as shown in FIG. 70, in step S5a, the material film 3 is formed (deposited) over the main surface (entire main surface) of the semiconductor substrate 1 so as to cover the gate structures (gate electrodes GE1, GE2, GE3, and GE4) having the protective film 9a formed at its sidewalls. The formation process of the material film 3 is basically the same as that of the first embodiment. In this embodiment, when the material film 3 is formed, the protective film 9a intervenes in between the material film 3 and the respective sidewalls of the gate structures (gate electrodes GE1, GE2, GE3, and GE4).

The combination of the protective film 9a and the material film 3 serves as an offset spacer in the ion implantation IM1. The material film 3 is formed such that the total of the thickness of the protective film 9a (whose thickness is in the direction parallel to the main surface of the semiconductor substrate 1) and the thickness (formed thickness) of the material film 3 corresponds to the appropriate thickness as the offset spacer in the ion implantation IM1 to be performed later (whose thickness corresponds to the above thickness $T_3$ in the first embodiment, for example, in a range of about 2 to 5 mm).

Figure 71:
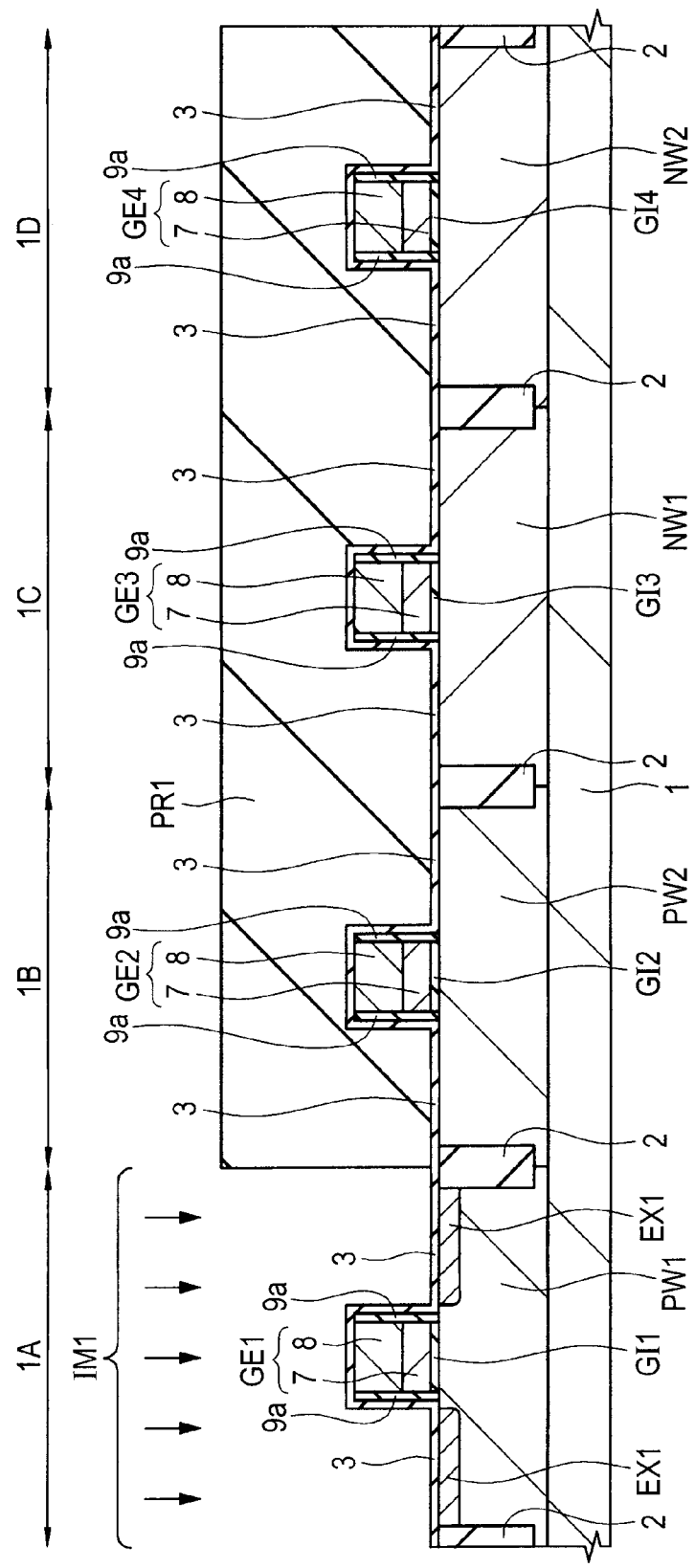
FIG. 71 is a cross-sectional view of a main part of another manufacturing step of the semiconductor device, following the step shown in FIG. 70.

Then, as shown in FIG. 71, the same photoresist pattern PR1 as that of the third embodiment is formed over the main surface of the semiconductor substrate 1, that is, the material film 3 in step S6a, and then the ion implantation IM1 is performed on the semiconductor substrate 1 in step S7a. The ion implantation IM1 performed in this embodiment (in step S7a) is basically the same as the ion implantation IM1 performed in the third embodiment. The gate structure (gate electrode GE1), and the protective film 9a at the sidewalls thereof, and the material film 3 in the nMIS region 1A functions as the ion implantation blocking mask. Thus, in the ion implantation IM1, no impurities are introduced (ion-implanted) into a region directly under the gate electrode GE1 and regions directly under the protective film 9a and the material film 3 at sidewalls of the gate electrode GE1 in the p-type well PW1. In the ion implantation IM1, the same extension region EX1 as that of the third embodiment is formed. Before or after the ion implantation IM1, another ion implantation (for example, halo-ion implantation) can also be performed on the semiconductor substrate 1.

Figure 72:
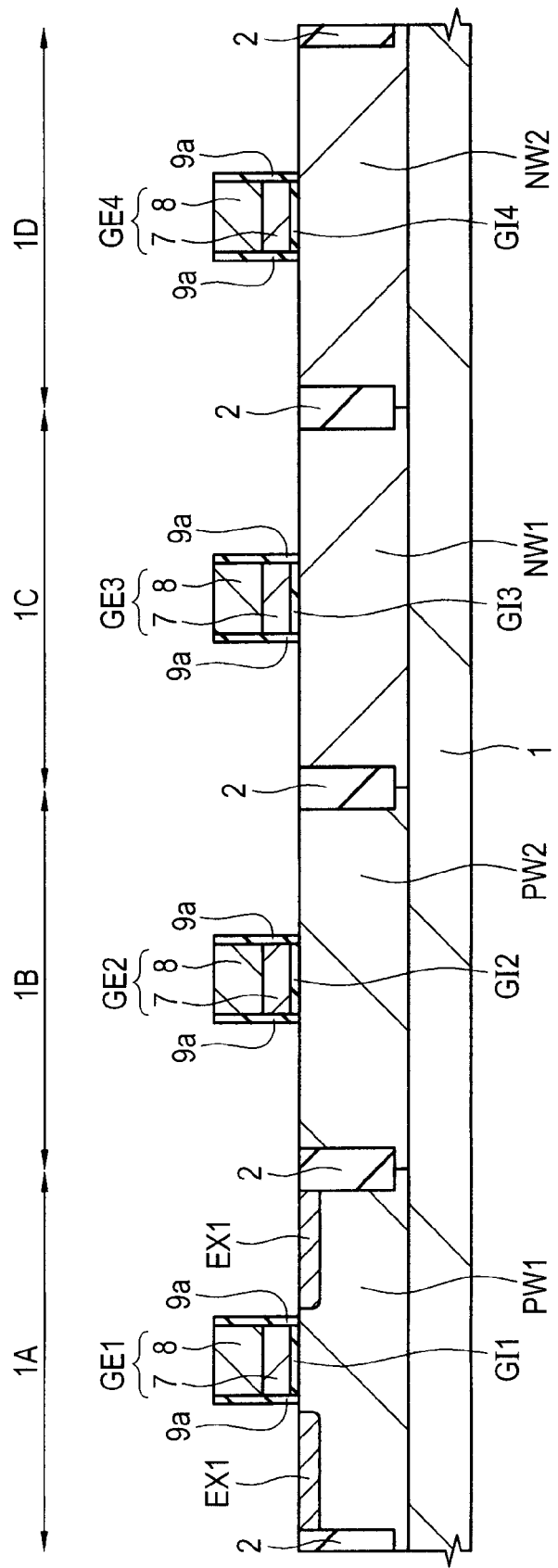
FIG. 72 is a cross-sectional view of a main part of another manufacturing step of the semiconductor device, following the step shown in FIG. 71.

Then, as shown in FIG. 72, the photoresist pattern PR1 is removed in step S8a, and further the material film 3 is also removed in step S9a. These steps are basically the same as those of the third embodiment.

In this embodiment, the removal process of the material film 3 (in step S9a) exposes the protective film 9a. It is necessary not to expose the sidewalls (sides) of the gate structures (gate electrodes GE1, GE2, GE3, and GE4) in the nMIS regions 1A and 1B and the pMIS regions 1C and 1D. At this time, the material film 3 located over the protective film 9a is not preferably left.

Figure 73:
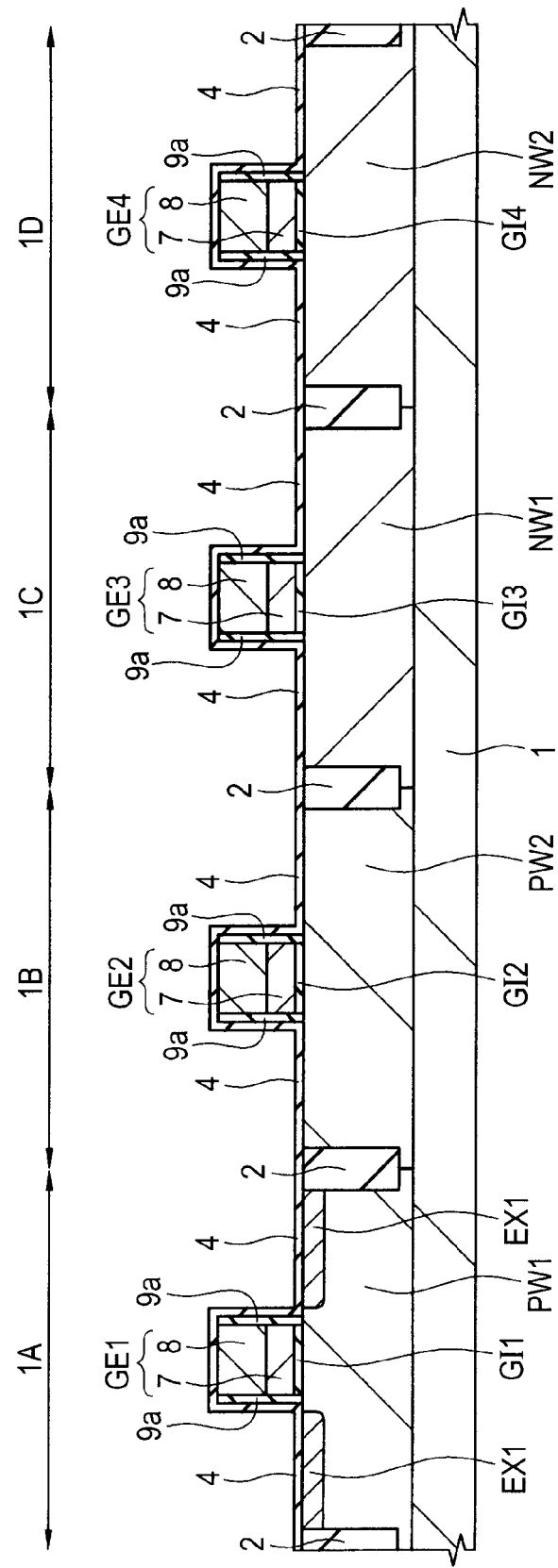
FIG. 73 is a cross-sectional view of a main part of another manufacturing step of the semiconductor device, following the step shown in FIG. 72.

Then, as shown in FIG. 73, in step S5b, the material film 4 is formed (deposited) over the main surface (entire main surface) of the semiconductor substrate 1 so as to cover the gate structures (gate electrodes GE1, GE2, GE3, and GE4) with the protective film 9a formed at its sidewalls. The formation step of the material film 4 in this embodiment is basically the same as that of the first embodiment. When the material film 4 is formed in this embodiment, the protective film 9a intervenes in between the material film 4 and each of the gate structures (gate electrodes GE1, GE2, GE3, and GE4).

The combination of the protective film 9a and the material film 4 serves as the offset spacer in the ion implantation IM2, whereby the material film 4 is formed such that the total thickness (formed thickness) of the protective film 9a and the material film 3 corresponds to the appropriate thickness as the offset spacer of the ion implantation IM2 to be performed later (corresponding to the above thickness $T_4$ in the first embodiment, for example, about 2 to 5 nm).

Figure 74:
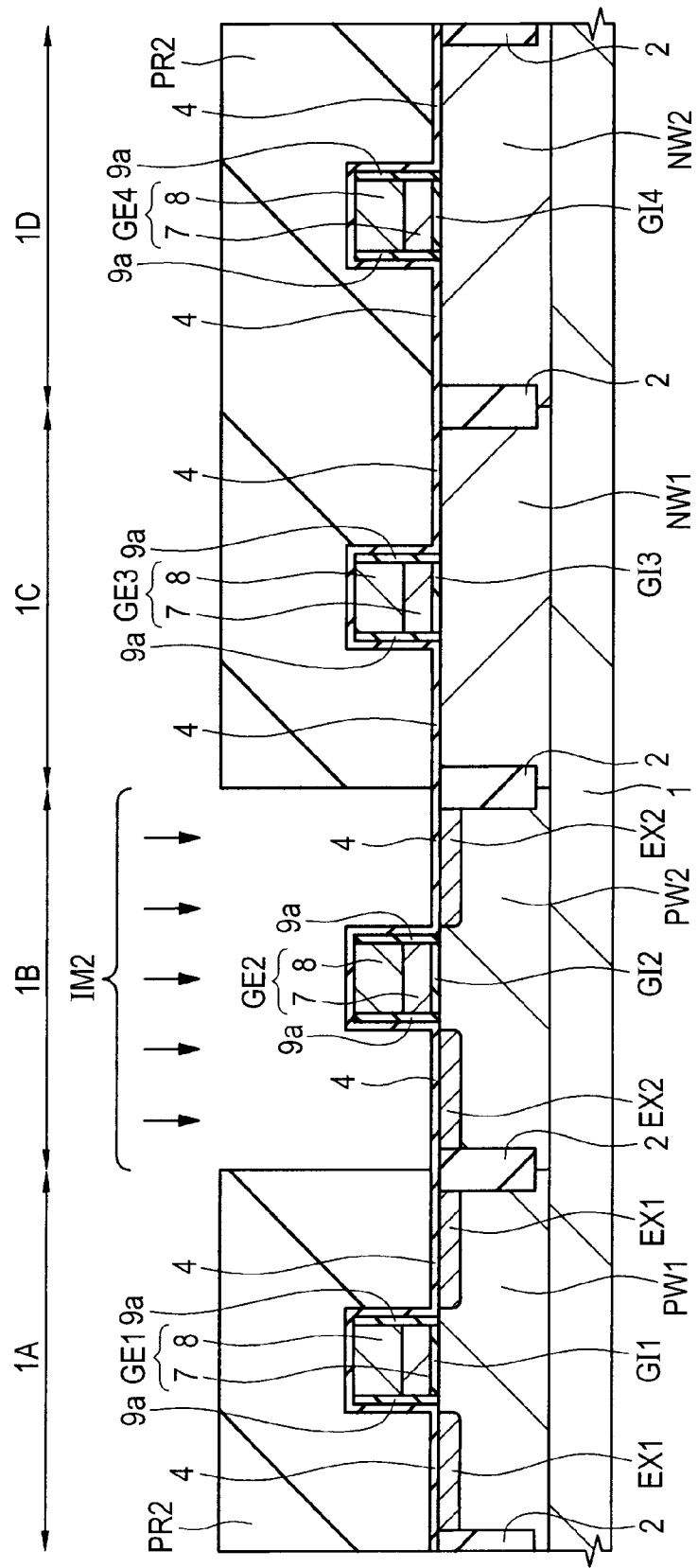
FIG. 74 is a cross-sectional view of a main part of another manufacturing step of the semiconductor device, following the step shown in FIG. 73.

Then, as shown in FIG. 74, in step S6b, the same photoresist pattern PR2 as that of the third embodiment is formed over the main surface of the semiconductor substrate 1, that is, the material film 4, and then the ion implantation IM2 is performed on the semiconductor substrate 1 in step S7b. The ion implantation IM2 performed in this embodiment (in step S7b) is basically the same as the ion implantation IM2 performed in the third embodiment. The gate structure (gate electrode GE2), and the protective film 9a and the material film 4 over the sidewalls thereof in the nMIS region 1B serve as the ion implantation blocking mask. Thus, in the ion implantation IM2, no impurities are introduced (ion-implanted) into a region directly under the gate electrode GE2 in the p-type well PW2 and into regions directly under the protective film 9a and the material film 4 at both sidewalls of the gate electrode GE2. In the ion implantation IM2, the same extension region EX2 as that in the third embodiment is formed. Before or after the ion implantation IM2, another ion implantation (for example, halo-ion implantation) can be performed on the semiconductor substrate 1.

Figure 75:
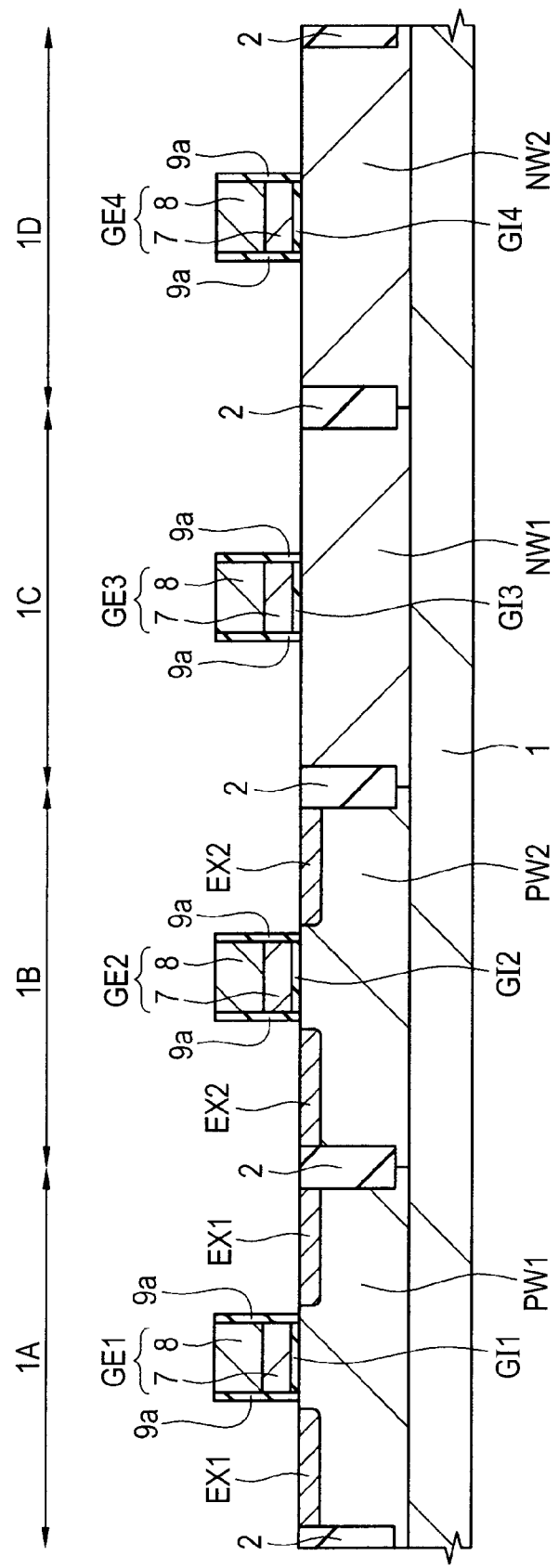
FIG. 75 is a cross-sectional view of a main part of another manufacturing step of the semiconductor device, following the step shown in FIG. 74.

Then, as shown in FIG. 75, the photoresist pattern PR2 is removed in step S8b, and further the material film 4 is removed in step S9b. These processes are basically the same as those in the third embodiment.

In this embodiment, the removal process of the material film 4 (in step S9b) exposes the protective film 9a. It is necessary not to expose the sidewalls (sides) of the gate structures (gate electrodes GE1, GE2, GE3, and GE4) in the nMIS regions 1A and 1B and the pMIS regions 1C and 1D. At this time, the material film 4 is not preferably left over the protective film 9a.

Figure 76:
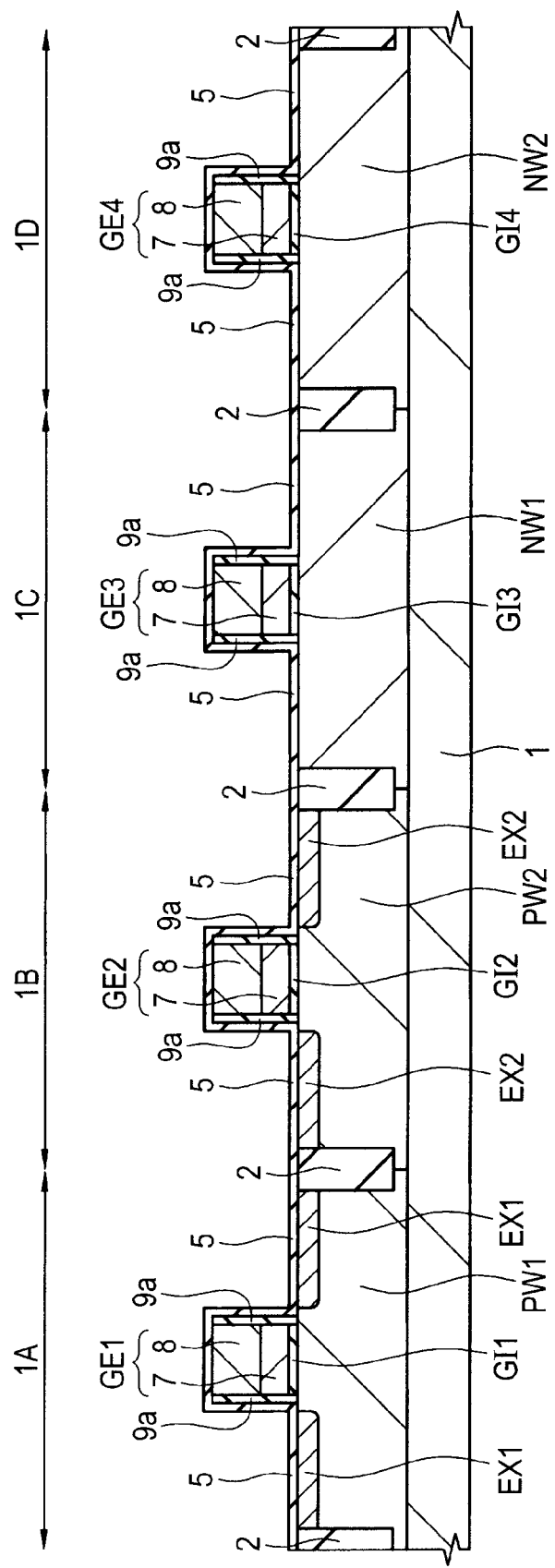
FIG. 76 is a cross-sectional view of a main part of another manufacturing step of the semiconductor device, following the step shown in FIG. 75.

Then, as shown in FIG. 76, in step S5c, the material film 5 is formed (deposited) over the main surface (entire main surface) of the semiconductor substrate 1 so as to cover the gate structures (gate electrodes GE1, GE2, GE3, and GE4) with the protective film 9a formed at its sidewalls. The formation step of the material film 5 in this embodiment is basically the same as that in the first embodiment. When the material film 5 is formed in this embodiment, the protective film 9a intervenes in between the material film 5 and each sidewall of the gate structures (gate electrodes GE1, GE2, GE3, and GE4).

The combination of the protective film 9a and the material film 5 serves as the offset spacer in the ion implantation IM3, whereby the material film 5 is formed such that the total of the thickness (formed thickness) of the protective film 9a and the thickness (formed thickness) of the material film 5 corresponds to the appropriate thickness as the offset spacer of the ion implantation IM3 to be performed later (corresponding to the above thickness $T_5$ in the first embodiment, for example, about 2 to 5 nm).

Figure 77:
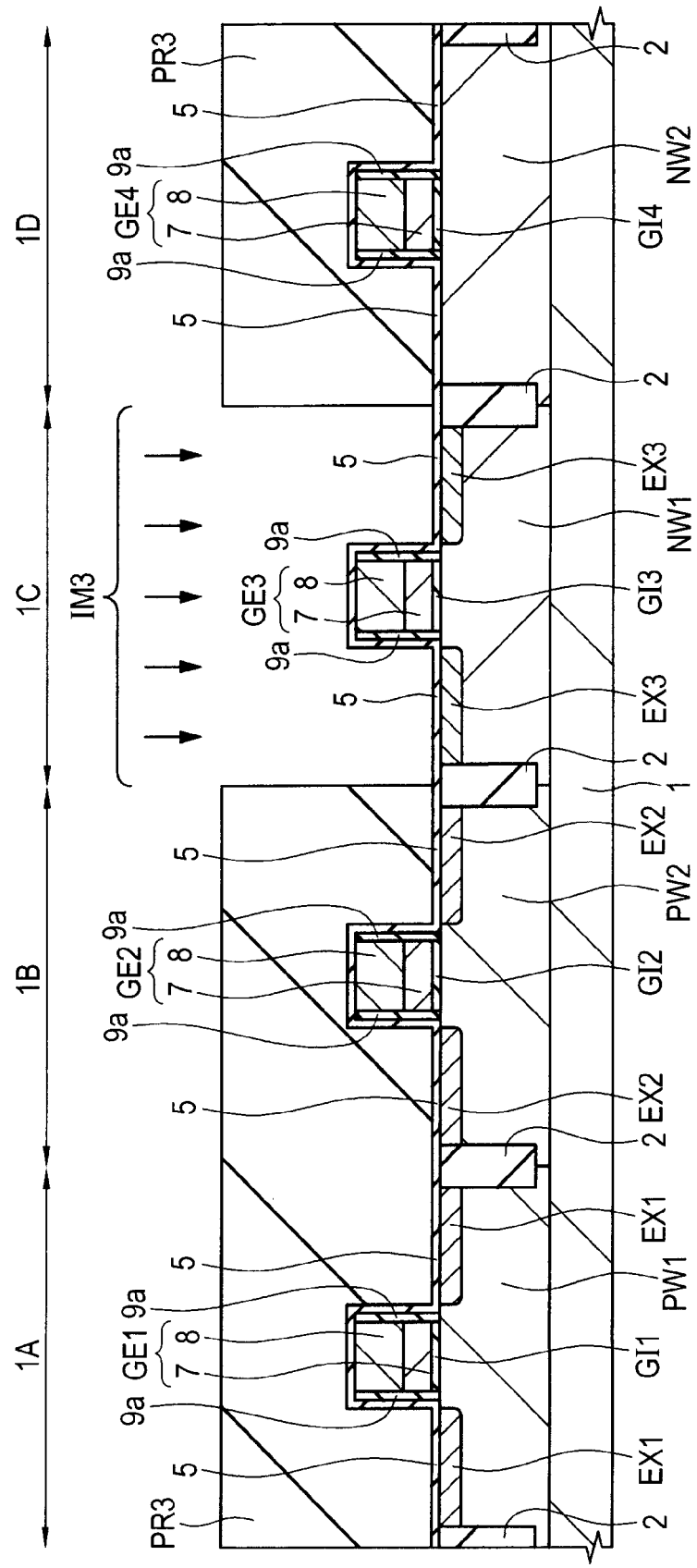
FIG. 77 is a cross-sectional view of a main part of another manufacturing step of the semiconductor device, following the step shown in FIG. 76.

Then, as shown in FIG. 77, in step S6c, the same photoresist pattern PR3 as that of the third embodiment is formed over the main surface of the semiconductor substrate 1, that is, the material film 5, and then the ion implantation IM3 is performed on the semiconductor substrate 1 in step S7c. The ion implantation IM3 performed in this embodiment (in step S7c) is basically the same as the ion implantation IM3 performed in the third embodiment. The gate structure (gate electrode GE3), and the protective film 9a and the material film 4 over the sidewalls thereof in the pMIS region 1C act as the ion implantation blocking mask. Thus, in the ion implantation IM3, no impurities are introduced (ion-implanted) into a region directly under the gate electrode GE3 and into regions directly under the protective film 9a and the material film 5 at both sidewalls of the gate electrode GE3 in the n-type well NW1. In the ion implantation IM3, the same extension region EX3 as that of the third embodiment is formed. Before or after the ion implantation IM3, another ion implantation (for example, halo-ion implantation) can be performed on the semiconductor substrate 1.

Figure 78:
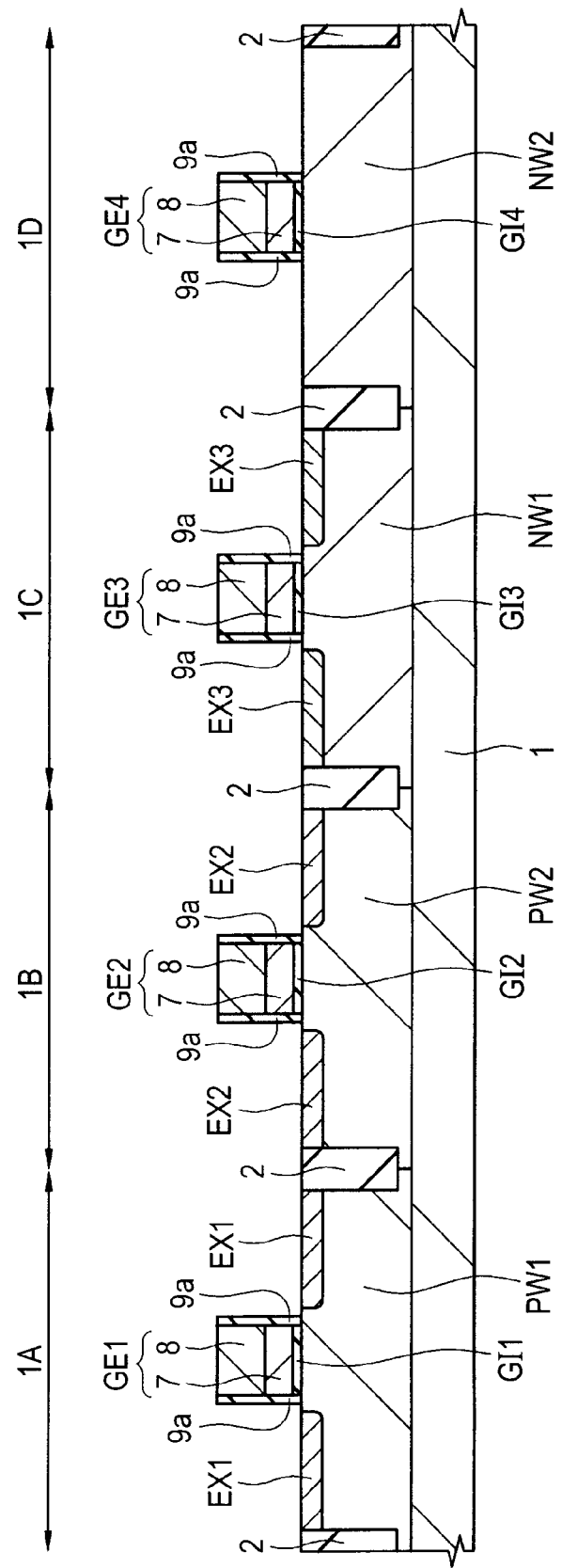
FIG. 78 is a cross-sectional view of a main part of another manufacturing step of the semiconductor device, following the step shown in FIG. 77.

Then, as shown in FIG. 78, the photoresist pattern PR3 is removed in step S8c, and further the material film 5 is removed in step S9c. These processes are basically the same as that in the third embodiment.

In this embodiment, the removal process of the material film 5 (in step S9c) exposes the protective film 9a. It is necessary not to expose the sidewalls (sides) of the gate structures (gate electrodes GE1, GE2, GE3, and GE4) in the nMIS regions 1A and 1B and the pMIS regions 1C and 1D. At this time, the material film 5 is not preferably left over the protective film 9a.

Figure 79:
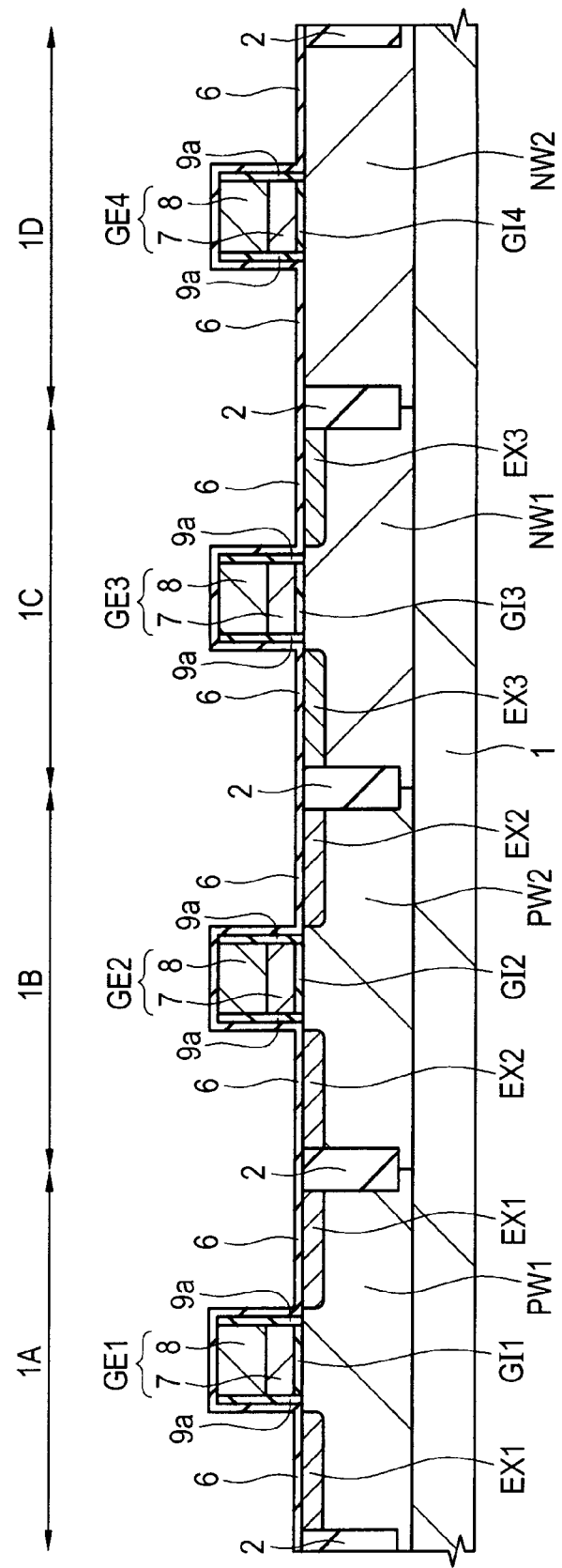
FIG. 79 is a cross-sectional view of a main part of another manufacturing step of the semiconductor device, following the step shown in FIG. 78.

Then, as shown in FIG. 79, in step S5d, the material film 6 is formed (deposited) over the main surface (entire main surface) of the semiconductor substrate 1 so as to cover the gate structures (gate electrodes GE1, GE2, GE3, and GE4) with the protective film 9a formed at its sidewalls. The formation step of the material film 6 in this embodiment is basically the same as that of the first embodiment. When the material film 6 is formed in this embodiment, the protective film 9a intervenes in between the material film 6 and each of the gate structures (gate electrodes GE1, GE2, GE3, and GE4).

The combination of the protective film 9a and the material film 6 serves as the offset spacer in the ion implantation IM4, whereby the material film 6 is formed such that the total of the thickness (formed thickness) of the protective film 9a and the thickness (formed thickness) of the material film 6 corresponds to the appropriate thickness as the offset spacer of the ion implantation IM4 to be performed later (corresponding to the above thickness $T_6$ in the first embodiment, for example, about 2 to 5 nm).

Figure 80:
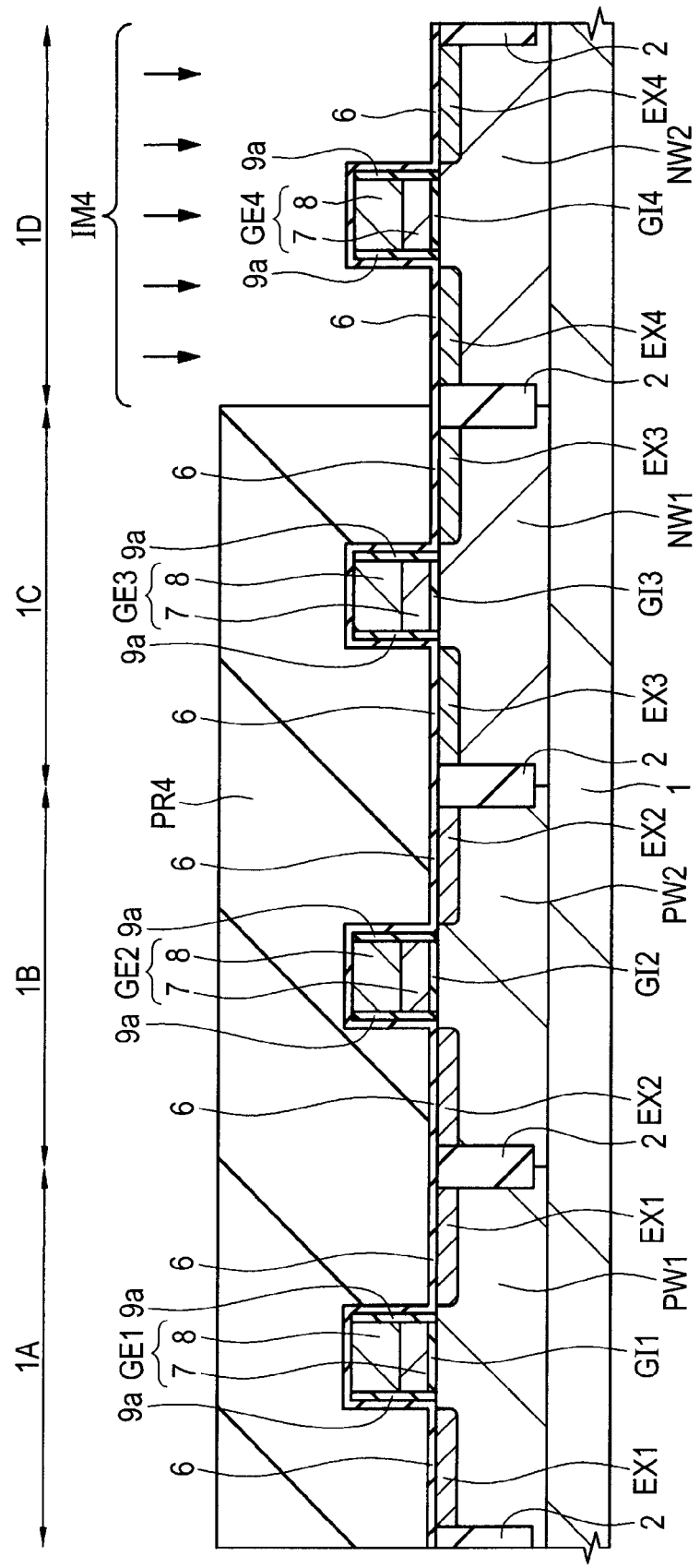
FIG. 80 is a cross-sectional view of a main part of another manufacturing step of the semiconductor device, following the step shown in FIG. 79.

Then, as shown in FIG. 80, in step S6d, the same photoresist pattern PR4 as that of the third embodiment is formed over the main surface of the semiconductor substrate 1, that is, the material film 6, and then the ion implantation IM4 is performed on the semiconductor substrate 1 in step S7d. The ion implantation IM4 of this embodiment (in step S7d) is basically the same as the ion implantation IM4 of the third embodiment. The gate structure (gate electrode GE4), and the protective film 9a, and the material film 6 over the sidewalls thereof in the pMIS region 1C act as the ion implantation blocking mask. Thus, in the ion implantation IM4, no impurities are introduced (ion-implanted) into a region directly under the gate electrode GE4 in the n-type well NW2 and into regions directly under the protective film 9a and the material film 6 at both sidewalls of the gate electrode GE4. In the ion implantation IM4, the same extension region EX4 as that of the third embodiment is formed. Before or after the ion implantation IM4, another ion implantation (for example, halo-ion implantation) can be performed on the semiconductor substrate 1.

Figure 81:
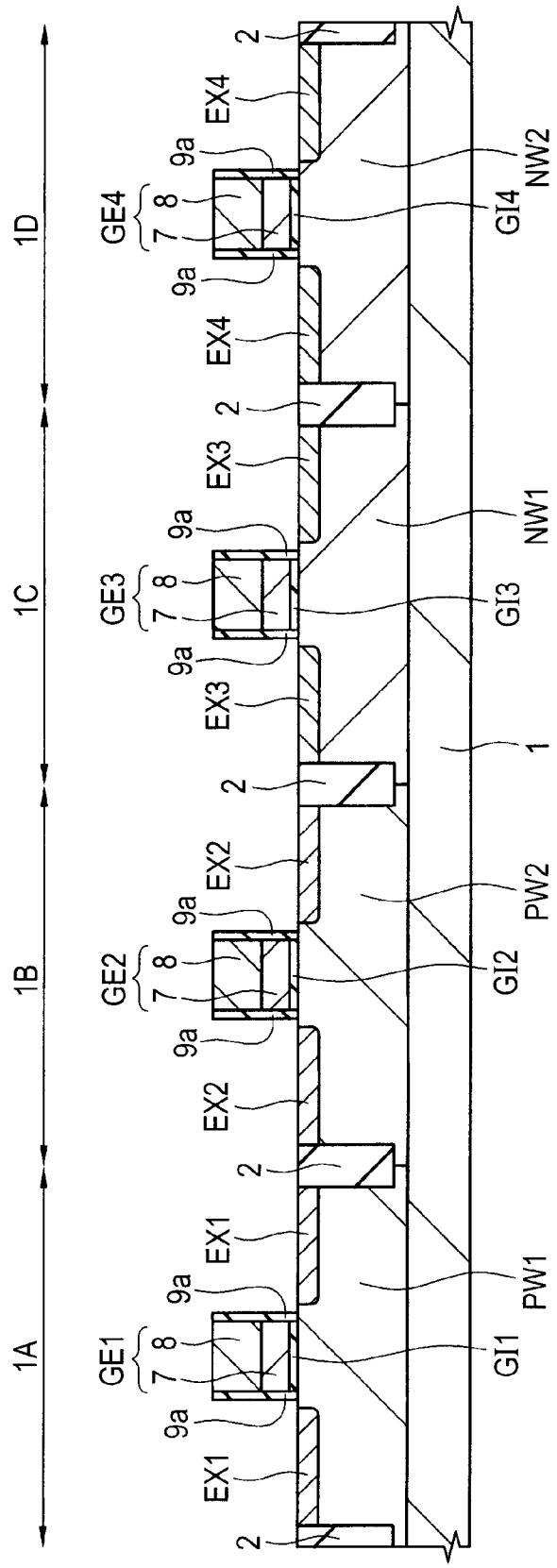
FIG. 81 is a cross-sectional view of a main part of another manufacturing step of the semiconductor device, following the step shown in FIG. 80.

Then, as shown in FIG. 81, the photoresist pattern PR4 is removed in step S8d, and further the material film 6 is removed in step S9d. These processes are basically the same as that in the third embodiment.

In this embodiment, the removal process of the material film 6 (in step S9d) exposes the protective film 9a. It is necessary not to expose the sidewalls (sides) of the gate structures (gate electrodes GE1, GE2, GE3, and GE4) in the nMIS regions 1A and 1B and the pMIS regions 1C and 1D. At this time, the material film 6 is not preferably left over the protective film 9a.

Thereafter, the same processes as those of the third embodiment are performed, and its illustration and description will be omitted below.

This embodiment can also obtain the similar effects as those of the third embodiment. In the third embodiment, the protective film 9 is formed over the main surface of the semiconductor substrate 1 containing the sidewalls and the upper surfaces of the gate structures. Thus, this embodiment differs from the third embodiment in that the protective film 9a is selectively formed over the sidewalls of the gate structures. The effect due to the difference between this embodiment and the third embodiment will be described below.

In the ion implantation IM1, IM2, IM3, and IM4, this embodiment can decrease the thickness of the film through which the impurities to be implanted into the semiconductor substrate 1 must pass (in any one of the p-type wells PW1 and PW2 and the n-type wells NW1 and NW2), as compared to the third embodiment. This is because the protective film 9 does not exist at the parts other than the sidewalls of the gate structures in the p-type wells PW1 and PW2 and the n-type wells NW1 and NW2. Thus, this embodiment provides the effect of easily controlling the profiles (distribution) of impurities introduced into the semiconductor substrate 1 (p-type wells PW1 and PW2 and the n-type wells NW1 and NW2) in the ion implantations Im1, IM2, IM3, and IM4 as compared to the third embodiment, and the effect of increasing the controllability of implantation depth of the impurities. In contrast, the third embodiment can decrease the number of manufacturing steps, and can also reduce the manufacturing time and costs of the semiconductor device as compared to this embodiment.

Like the third embodiment, this embodiment has the more effects by applying the metal gate electrode to the gate electrodes (here, the gate electrodes GE1, GE2, GE3, and GE4), and the High-k film (high dielectric film) to the gate insulating films GI1, GI2, GI3, and GI4. This is because the formation of the protective film 9a prevents the exposure of the gate electrode and the gate insulating film in the removal processes of the material films 3, 4, 5, and 6 in steps S9a, S9b, S9c, and S9d. In this embodiment, the sidewalls (sides) of the gate structures (gate electrodes) are protected by the protective film 9a, but the upper surfaces of the gate structures (gate electrodes) are not provided with the protective film 9a, which possibly exposes the upper surfaces of the gate structures in the removal processes of the material films 3, 4, 5, and 6 in steps S9a, S9b, S9c and S9d. Such an effect of this embodiment is great especially when the gate electrode (each of the gate electrodes GE1, GE2, GE3, and GE4) is a metal gate electrode comprised of a laminated structure of a metal film (corresponding to the above metal film 7), and a silicon film over the metal film (specifically, polysilicon film, corresponding to the polycrystalline silicon film 8). This is because when the metal gate electrode is formed of the laminated film of the metal film 7 and the polycrystalline silicon film 8, the formation of the protective film 9a at the sidewalls of the metal gate electrode can prevent the exposure of the metal film 7 in the removal processes of the material films 3, 4, 5, and 6 in steps S9a, S9b, S9c and S9d.

The invention made by the inventors have been specifically described above based on the embodiments, but is not limited thereto. It is apparent that various modifications and changes can be made to the disclosed embodiments without departing from the scope of the invention.

The invention is effectively applied to a manufacturing technology of a semiconductor device.

What is claimed is:

1. A manufacturing method of a semiconductor device, said semiconductor device comprising a first MISFET in a first region of a semiconductor substrate and a second MISFET in a second region of the semiconductor substrate, said manufacturing method comprising the steps of:
   (a) preparing the semiconductor substrate;
   (b) after the step (a), respectively forming a first gate structure for the first MISFET over the semiconductor substrate in the first region, and a second gate structure for the second MISFET over the semiconductor substrate in the second region;
   (c) after the step (b), forming a first material film over the semiconductor substrate so as to cover the first gate structure and the second gate structure;
   (d) after the step (c), forming a first mask layer covering the second region and exposing the first region, over the first material film;
   (e) after the step (d), performing first ion implantation on the semiconductor substrate in the first region using the first mask layer as an ion implantation blocking mask;
   (f) after the step (e), removing the first mask layer;
   (g) after the step (f), removing the first material film;
   (h) after the step (g), forming a second material film over the semiconductor substrate so as to cover the first gate structure and the second gate structure;
   (i) after the step (h), forming a second mask layer covering the first region and exposing the second region, over the second material film;
   (j) after the step (i), performing second ion implantation on the semiconductor substrate in the second region using the second mask layer as the ion implantation blocking mask; and
   (k) after the step (j), removing the second mask layer,
   wherein each of the first gate structure and the second gate structure includes a gate insulating film and a gate electrode formed over the gate insulating film, and
   wherein in the step (g), the first gate structure and the second gate structure are exposed.

2. The manufacturing method of a semiconductor device according to claim 1,
   wherein in the step (e), the first material film located over the first gate structure and sidewalls of the first gate structure acts as the ion implantation blocking mask into the semiconductor substrate in the first region,
   wherein in the step (j), the second material film located over the second gate structure and sidewalls of the second gate structure acts as the ion implantation blocking mask into the semiconductor substrate in the second region, and
   wherein in the step (g), the entire first gate structure and the entire second gate structure are exposed.

3. The manufacturing method of a semiconductor device according to claim 2,
   wherein each of the first mask layer and the second mask layer is comprised of a resist layer.

4. The manufacturing method of a semiconductor device according to claim 3, further comprising the steps of:
   (l) after the step (k), forming sidewall spacers at sidewalls of the first gate structure and the second gate structure; and
   (m) after the step (l), forming a first semiconductor region for a source or drain of the first MISFET by ion implantation into the semiconductor substrate in the first region, and forming a second semiconductor region for a source or drain of the second MISFET by ion implantation into the semiconductor substrate in the second region.

5. The manufacturing method of a semiconductor device according to claim 4,
   wherein in the step (g), regions of the semiconductor substrate where the first semiconductor region and the second semiconductor region are to be formed in the step (m) are exposed.

6. The manufacturing method of a semiconductor device according to claim 5,
   wherein in the step (e), a third semiconductor region is formed in the semiconductor substrate within the first region by the first ion implantation, said third semiconductor region having the same conduction type as that of the first semiconductor region and having a lower concentration of impurities than that of the first semiconductor region, and
   wherein in the step (j), a fourth semiconductor region is formed in the semiconductor substrate within the second region by the second ion implantation, said fourth semiconductor region having the same conduction type as that of the second semiconductor region and having a lower concentration of impurities than that of the second semiconductor region.

7. The manufacturing method of a semiconductor device according to claim 6, wherein in the step (g), the first material film is removed by wet etching.

8. The manufacturing method of a semiconductor device according to claim 7,
   wherein in the step (f), the first mask layer is removed by ashing or a wet process, and
   wherein in the step (k), the second mask layer is removed by ashing or another wet process.

9. The manufacturing method of a semiconductor device according to claim 8,
   wherein the first material film is comprised of a silicon nitride film, and
   wherein in the step (g), the first material film is subjected to wet etching using a thermal phosphoric acid.

10. The manufacturing method of a semiconductor device according to claim 9, wherein a thickness of the first material film formed in the step (d) is the same as that of the second material film formed in the step (i).

11. The manufacturing method of a semiconductor device according to claim 1, comprising the step of:
(c1) after the step (c) and before the step (d), applying isotropic etching to the first material film to thin the first material film over the semiconductor substrate.

12. A manufacturing method of a semiconductor device, said semiconductor device comprising a first MISFET in a first region of a semiconductor substrate and a second MISFET in a second region of the semiconductor substrate, said manufacturing method comprising the steps of:
(a) preparing the semiconductor substrate;
(b) after the step (a), respectively forming a first gate structure for the first MISFET over the semiconductor substrate in the first region, and a second gate structure for the second MISFET over the semiconductor substrate in the second region;
(c) after the step (b), forming a protective film over the semiconductor substrate so as to cover the first gate structure and the second gate structure;
(d) after the step (c), forming a first material film comprised of a material different from that of the protective film over the protective film so as to cover the first gate structure and the second gate structure;
(e) after the step (d), forming a first mask layer covering the second region and exposing the first region, over the first material film;
(f) after the step (e), performing first ion implantation on the semiconductor substrate in the first region using the first mask layer as an ion implantation blocking mask;
(g) after the step (f), removing the first mask layer;
(h) after the step (g), removing the first material film to leave the protective film;
(i) after the step (h), forming a second material film comprised of a material different from that of the protective film over the protective film so as to cover the first gate structure and the second gate structure;
(j) after the step (i), forming a second mask layer covering the first region and exposing the second region, over the first material film;
(k) after the step (j), performing second ion implantation on the semiconductor substrate in the second region using the second mask layer as another ion implantation mask; and
(l) after the step (k), removing the second mask layer,
wherein each of the first gate structure and the second gate structure includes a gate insulating film and a gate electrode formed over the gate insulating film, and
wherein in the step (h), the protective film is exposed, while sides of the first gate structure and the second gate structure are not exposed.

13. The manufacturing method of a semiconductor device according to claim 12,
wherein in the step (h), the first material film is subjected to wet etching under an etching condition in which an etching selectivity of the first material film to the protective film is 50 or more.

14. The manufacturing method of a semiconductor device according to claim 13,
wherein in the step (f), the first gate structure, and the protective film and the first material film over sidewalls of the first gate structure act as the ion implantation blocking mask into the semiconductor substrate in the first region,
wherein in the step (k), the second gate structure, and the protective film and the second material film over sidewalls of the second gate structure act as the ion implantation blocking mask into the semiconductor substrate in the second region,
wherein the first material film is comprised of a silicon nitride film, and
wherein the protective film is a silicon oxide film, a Hf-based oxide film, a Zr-based oxide film, a single metal film made of metal selected from the group consisting of Al, Ni, W, Co, and Ti, or an alloy film thereof.

15. The manufacturing method of a semiconductor device according to claim 14,
wherein the gate electrode included in each of the first gate structure and the second gate structure is a metal gate electrode.

16. The manufacturing method of a semiconductor device according to claim 15, further comprising the steps of:
(m) after the step (l), forming sidewall spacers over sidewalls of the first gate structure and the second gate structure; and
(n) after the step (m), forming a first semiconductor region for a source or drain of the first MISFET in the semiconductor substrate within the first region by ion implantation, while forming a second semiconductor region for a source or drain of the second MISFET in the semiconductor substrate within the second region by another ion implantation.

17. The manufacturing method of a semiconductor device according to claim 16,
wherein each of a thickness of the first material film formed in the step (d) and a thickness of the second material film formed in the step (i) is more than that of the protective film formed in the step (c).

18. The manufacturing method of a semiconductor device according to claim 17, further comprising the step of:
(c1) after the step (c) and before the step (d), leaving parts of the protective films over the sidewalls of the first gate structure and the second gate structure by removing remaining parts of the protective films in other regions,
wherein in the step (d), the first material film is formed over the semiconductor substrate so as to cover the first gate structure and the second gate structure with the protective films formed at sidewalls thereof, and
wherein in the step (i), the second material film is formed over the semiconductor substrate so as to cover the first gate structure and the second gate structure with the protective films formed at sidewalls thereof.

19. The manufacturing method of a semiconductor device according to claim 18,
wherein in the step (h), the first material film is subjected to wet etching such that the first material film is not left over the protective films at the sidewalls of the first gate structure and the second gate structure.

* * * * *